(12) United States Patent
Ikeda et al.

(10) Patent No.: US 11,587,981 B2
(45) Date of Patent: Feb. 21, 2023

(54) DISPLAY DEVICE INCLUDING A SEMI-TRANSMISSIVE LAYER

(71) Applicant: SEMICONDUCTOR ENERGY LABORATORY CO., LTD., Atsugi (JP)

(72) Inventors: Hisao Ikeda, Kanagawa (JP); Kensuke Yoshizumi, Kanagawa (JP); Tomoya Aoyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 98 days.

(21) Appl. No.: 17/052,231

(22) PCT Filed: Apr. 29, 2019

(86) PCT No.: PCT/IB2019/053474
§ 371 (c)(1),
(2) Date: Nov. 2, 2020

(87) PCT Pub. No.: WO2019/215538
PCT Pub. Date: Nov. 14, 2019

(65) Prior Publication Data
US 2021/0143227 A1     May 13, 2021

(30) Foreign Application Priority Data
May 11, 2018   (JP) ............................. JP2018-091842

(51) Int. Cl.
*H01L 27/32*     (2006.01)
*H01L 27/14*     (2006.01)
(Continued)

(52) U.S. Cl.
CPC ...... *H01L 27/3206* (2013.01); *H01L 51/5253* (2013.01); *H01L 51/5265* (2013.01);
(Continued)

(58) Field of Classification Search
CPC ............... H01L 27/3206; H01L 27/322; H01L 27/3279; H01L 27/3265; H01L 27/323;
(Continued)

(56) References Cited

U.S. PATENT DOCUMENTS 7,030,553 B2   4/2006  Winters et al.
8,883,531 B2   11/2014 Kim et al.
(Continued)

FOREIGN PATENT DOCUMENTS

CN   001839478 A   9/2006
CN   103681741 A   3/2014
(Continued)

OTHER PUBLICATIONS

International Search Report (Application No. PCT/IB2019/053474) dated Jul. 23, 2019.
(Continued)

*Primary Examiner* — Ida M Soward
(74) *Attorney, Agent, or Firm* — Fish & Richardson P.C.

(57) ABSTRACT

A display device which exhibits light with high color purity is provided. A display device with low power consumption is provided. An embodiment is a display device which includes a first pixel electrode, a second pixel electrode, a light-emitting layer, a common electrode, a first protective layer, and a semi-transmissive layer. The light-emitting layer includes a first region positioned over the first pixel electrode and a second region positioned over the second pixel electrode. The common electrode is positioned over the light-emitting layer. The first protective layer is positioned over the common electrode. The semi-transmissive layer is positioned over the first protective layer. Reflectivity with respect to visible light of the semi-transmissive layer is higher than reflectivity with respect to visible light of the common electrode. The semi-transmissive layer does not
(Continued)

overlap with the first region and overlaps with the second region. For example, the semi-transmissive layer may include an opening in a position overlapping with the first region.

20 Claims, 23 Drawing Sheets

(51) Int. Cl.
| | |
|---|---|
| H01L 51/50 | (2006.01) |
| H01L 51/52 | (2006.01) |
| G02F 1/13 | (2006.01) |
| G09G 3/32 | (2016.01) |
| G09G 3/3291 | (2016.01) |
| G09G 3/3283 | (2016.01) |
| G02F 1/1335 | (2006.01) |
| H01L 27/146 | (2006.01) |

(52) U.S. Cl.
CPC ..... *G02F 1/133528* (2013.01); *G09G 3/3283* (2013.01); *G09G 3/3291* (2013.01); *G09G 2300/0408* (2013.01); *G09G 2300/0804* (2013.01); *H01L 27/14678* (2013.01); *H01L 27/322* (2013.01); *H01L 27/3244* (2013.01); *H01L 27/3248* (2013.01); *H01L 27/3258* (2013.01); *H01L 27/3276* (2013.01); *H01L 27/3279* (2013.01); *H01L 51/524* (2013.01); *H01L 51/5246* (2013.01); *H01L 51/5293* (2013.01); *H01L 2251/301* (2013.01)

(58) Field of Classification Search
CPC ............. H01L 27/3213; H01L 27/3262; H01L 27/3258; H01L 27/14678; H01L 27/3276; H01L 27/3244; H01L 27/3248; H01L 51/5253; H01L 51/5265; H01L 51/5218; H01L 51/5281; H01L 51/50; H01L 51/5246; H01L 51/5293; H01L 51/524; H01L 2251/301; G02F 1/133528; G02F 2001/133357; G09G 3/3283; G09G 3/3291; G09G 2300/0408; G09G 2300/0804
See application file for complete search history.

(56) References Cited

U.S. PATENT DOCUMENTS

| | | | |
|---|---|---|---|
| 9,159,948 B2 | 10/2015 | Sugisawa et al. | |
| 10,217,416 B2 | 2/2019 | Lee et al. | |
| 10,430,000 B2 | 10/2019 | Wu et al. | |
| 10,529,745 B2 | 1/2020 | Lee et al. | |
| 10,693,097 B2 | 6/2020 | Yasumoto et al. | |
| 10,872,908 B2 | 12/2020 | Lee et al. | |
| 10,891,010 B2 | 1/2021 | Wu et al. | |
| 11,195,470 B2 | 12/2021 | Lee et al. | |
| 2003/0012870 A1* | 1/2003 | Sakurada | G02F 1/133514 359/896 |
| 2005/0040756 A1* | 2/2005 | Winters | H01L 27/3213 313/504 |
| 2005/0225232 A1* | 10/2005 | Boroson | H01L 27/3206 313/504 |
| 2007/0164664 A1* | 7/2007 | Ludwicki | G09G 3/3208 313/504 |
| 2007/0205423 A1* | 9/2007 | Yamazaki | H01L 27/3213 428/917 |
| 2007/0236640 A1* | 10/2007 | Kimura | G02F 1/1337 257/E27.111 |
| 2008/0048560 A1* | 2/2008 | Sung | H01L 27/3209 313/504 |
| 2008/0218070 A1* | 9/2008 | Kobayashi | H01L 51/5265 313/506 |
| 2009/0200544 A1* | 8/2009 | Lee | H01L 51/5215 438/35 |
| 2009/0251051 A1 | 10/2009 | Hwang et al. | |
| 2010/0044690 A1* | 2/2010 | Okutani | H01L 27/3211 257/89 |
| 2010/0289727 A1* | 11/2010 | Miller | H01L 27/3213 345/76 |
| 2011/0074272 A1 | 3/2011 | Sakamoto et al. | |
| 2012/0032583 A1* | 2/2012 | Kim | H01L 27/322 313/504 |
| 2014/0001447 A1* | 1/2014 | Kim | H01L 51/52 438/35 |
| 2014/0183471 A1* | 7/2014 | Heo | H01L 27/3209 257/40 |
| 2014/0252336 A1* | 9/2014 | Kobayashi | H01L 27/3267 257/40 |
| 2014/0306200 A1* | 10/2014 | Jinta | H01L 27/3246 257/40 |
| 2015/0162386 A1* | 6/2015 | Furuie | H01L 27/3218 257/40 |
| 2015/0214280 A1* | 7/2015 | Furuie | H01L 27/3213 257/89 |
| 2015/0362776 A1* | 12/2015 | Jikumaru | H01L 27/124 349/12 |
| 2016/0248039 A1* | 8/2016 | Choung | H01L 51/5234 |
| 2017/0176791 A1 | 6/2017 | Kubota et al. | |
| 2017/0271421 A1* | 9/2017 | Jinbo | H01L 27/3258 |
| 2018/0040638 A1 | 2/2018 | Wu et al. | |
| 2018/0180951 A1* | 6/2018 | Toyotaka | G02F 1/134336 |
| 2021/0117023 A1 | 4/2021 | Wu et al. | |
| 2021/0249446 A1 | 8/2021 | Wu et al. | |
| 2021/0265393 A1 | 8/2021 | Wu et al. | |
| 2022/0068214 A1 | 3/2022 | Lee et al. | |

FOREIGN PATENT DOCUMENTS

| | | |
|---|---|---|
| CN | 104064578 A | 9/2014 |
| CN | 105914220 A | 8/2016 |
| CN | 107579075 A | 1/2018 |
| CN | 107634084 A | 1/2018 |
| JP | 2007-503093 | 2/2007 |
| JP | 2011-071041 A | 4/2011 |
| JP | 2011-071042 A | 4/2011 |
| JP | 2014-197522 A | 10/2014 |
| JP | 2016-143585 A | 8/2016 |
| KR | 2009-0106099 A | 10/2009 |
| KR | 2016-0103594 A | 9/2016 |
| TW | 201631756 | 9/2016 |
| TW | 201813147 | 4/2018 |
| WO | WO-2005/020344 | 3/2005 |

OTHER PUBLICATIONS

Written Opinion (Application No. PCT/IB2019/053474) dated Jul. 23, 2019.
Chinese Office Action (Application No. 201980029899.0) dated May 6, 2022.

* cited by examiner

DISPLAY DEVICE INCLUDING A SEMI-TRANSMISSIVE LAYER

CROSS REFERENCE TO RELATED APPLICATIONS

This application is a U.S. National Phase Application under 35 U.S.C. § 371 of International Application PCT/M2019/053474, filed on Apr. 29, 2019, which is incorporated by reference and claims the benefit of a foreign priority application filed in Japan on May 11, 2018, as Application No. 2018-091842.

TECHNICAL FIELD

One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, application of display devices to a variety of uses has been expected. Examples of uses for a large display device include a television device for home use (also referred to as a TV or a television receiver), digital signage, and a PID (Public Information Display). A larger display region of a display device can provide more information at a time. In addition, a larger display region attracts more attention, so that the effectiveness of the advertisement is expected to be increased, for example.

Light-emitting devices including light-emitting elements have been developed as display devices. Light-emitting elements (also referred to as EL elements) utilizing electroluminescence (hereinafter referred to as EL) have features such as ease of reduction in thickness and weight, high-speed response to an input signal, and driving with a direct-current low voltage source, and have been used in display devices.

In addition, application of organic EL elements to flexible devices has been studied. For example, Patent Document 1 discloses a flexible light-emitting device including an organic EL element.

REFERENCE

Patent Document

[Patent Document 1]
[Patent Document 1] Japanese Published Patent Application No. 2014-197522

SUMMARY OF THE INVENTION

Problems to be Solved by the Invention

In the case where a display device capable of full-color display is manufactured by a side-by-side method (also referred to as a separate coloring method) in which different light-emitting layers are evaporated to subpixels for different colors, opening portions of a metal mask need to be arranged at desired positions with high accuracy (alignment accuracy). In particular, a high-resolution display device has a high pixel density and requires extremely high alignment accuracy, which causes problems of a decrease in yield in manufacturing display devices and an increase in manufacturing cost. In addition, the side-by-side method has a problem of difficulty in being employed for a large-sized substrate because a film is formed in a wider range than a desired region owing to bending of a metal mask, for example.

In contrast, in the case where a display device capable of full-color display is manufactured by a color filter method in which a light-emitting element that emits white light is combined with a color filter, the step of evaporating different light-emitting layers to subpixels for different colors is unnecessary; thus, a high-resolution display device or a large-sized display device can be manufactured with high productivity. On the other hand, not only light of a desired color but also light of a different color is included in light exhibited by each subpixel because a common light-emitting layer is formed for the subpixels for different colors. Therefore, the color filter method has disadvantages such as a tendency of low light color purity and poor light use efficiency, compared with the side-by-side method.

An object of one embodiment of the present invention is to provide a display device which exhibits light with high color purity. An object of one embodiment of the present invention is to provide a display device having high display quality. An object of one embodiment of the present invention is to provide a display device with high emission efficiency. An object of one embodiment of the present invention is to provide a display device with low power consumption. An object of one embodiment of the present invention is to provide a display device which can be manufactured with high yield. An object of one embodiment of the present invention is to provide a high-resolution display device. An object of one embodiment of the present invention is to provide a long-life display device. An object of one embodiment of the present invention is to provide a large-sized display device.

Note that the description of these objects does not preclude the existence of other objects. One embodiment of the present invention does not need to achieve all of these objects. Other objects can be derived from the description of the specification, the drawings, and the claims.

Means for Solving the Problems

A display device of one embodiment of the present invention includes a first pixel electrode, a second pixel electrode, a light-emitting layer, a common electrode, a first protective layer, and a semi-transmissive layer. The light-emitting layer includes a first region positioned over the first pixel electrode and a second region positioned over the second pixel electrode. The common electrode is positioned over the light-emitting layer. The first protective layer is positioned over the common electrode. The semi-transmissive layer is positioned over the first protective layer. Reflectivity with respect to visible light of the semi-transmissive layer is higher than reflectivity with respect to visible light of the common electrode. The semi-transmissive layer does not overlap with the first region, and the semi-transmissive layer overlaps with the second region. For example, the semi-transmissive layer may include an opening in a position overlapping with the first region.

The display device of one embodiment of the present invention may further include a second protective layer. The second protective layer is in contact with the first protective layer in a region overlapping with the first region and is in contact with the semi-transmissive layer in a region overlapping with the second region.

The display device of one embodiment of the present invention may further include a conductive layer that transmits visible light and a second protective layer. The conductive layer that transmits visible light is positioned over the common electrode. The second protective layer is positioned over the conductive layer that transmits visible light. The conductive layer that transmits visible light includes a region in contact with the common electrode, a region in contact with the semi-transmissive layer, a region positioned between the first protective layer and the second protective layer, and a region positioned between the first protective layer and the semi-transmissive layer.

The display device of one embodiment of the present invention may further include a first optical adjustment layer and a second optical adjustment layer. The first optical adjustment layer is positioned between the first pixel electrode and the light-emitting layer. The second optical adjustment layer is positioned between the second pixel electrode and the light-emitting layer. The first pixel electrode and the second pixel electrode each have reflectivity with respect to visible light.

The display device of one embodiment of the present invention includes a first reflective layer, a second reflective layer, a first optical adjustment layer, and a second optical adjustment layer. The first optical adjustment layer is positioned over the first reflective layer. The second optical adjustment layer is positioned over the second reflective layer. The first pixel electrode is positioned over the first optical adjustment layer. The second pixel electrode is positioned over the second optical adjustment layer. The first pixel electrode and the second pixel electrode each have a transmitting property with respect to visible light.

The display device of one embodiment of the present invention may further includes a coloring layer. The coloring layer is positioned over the first protective layer and overlaps with the second region.

The display device of one embodiment of the present invention may further include a third pixel electrode. The light-emitting layer further includes a third region positioned over the third pixel electrode. The semi-transmissive layer includes a fourth region overlapping with the second region and a fifth region overlapping with the third region. A thickness of the fourth region is different from a thickness of the fifth region.

The display device of one embodiment of the present invention may further include a transistor, an insulating layer, a first conductive layer, and a second conductive layer. The first conductive layer and the second conductive layer each include the same material as an electrode included in the transistor. The transistor is electrically connected to the first pixel electrode through a first opening of the insulating layer. The common electrode is electrically connected to the first conductive layer through a second opening of the insulating layer. The semi-transmissive layer is electrically connected to the second conductive layer through a third opening of the insulating layer. The third opening is positioned on the outside of the second opening in the display device.

One embodiment of the present invention is a module including the display device having any of the above-described structures, where a connector such as a flexible printed circuit (hereinafter also referred to as FPC) or a TCP (Tape Carrier Package) is attached or an integrated circuit (IC) is implemented by a COG (Chip On Glass) method, a COF (Chip On Film) method, or the like.

One embodiment of the present invention is an electronic device including the above-described module and at least one of an antenna, a battery, a housing, a camera, a speaker, a microphone, and an operation button.

Effect of the Invention

With one embodiment of the present invention, a display device which exhibits light with high color purity can be provided. With one embodiment of the present invention, a display device having high display quality can be provided. With one embodiment of the present invention, a display device with high emission efficiency can be provided. With one embodiment of the present invention, a display device with low power consumption can be provided. With one embodiment of the present invention, a display device which can be manufactured with high yield can be provided. With one embodiment of the present invention, a high-resolution display device can be provided. With one embodiment of the present invention, a long-life display device can be provided. With one embodiment of the present invention, a large-sized display device can be provided.

Note that the description of these effects does not preclude the existence of other effects. One embodiment of the present invention does not need to have all of these effects. Other effects can be derived from the description of the specification, the drawings, and the claims.

MODE FOR CARRYING OUT THE INVENTION

Figure 1A:
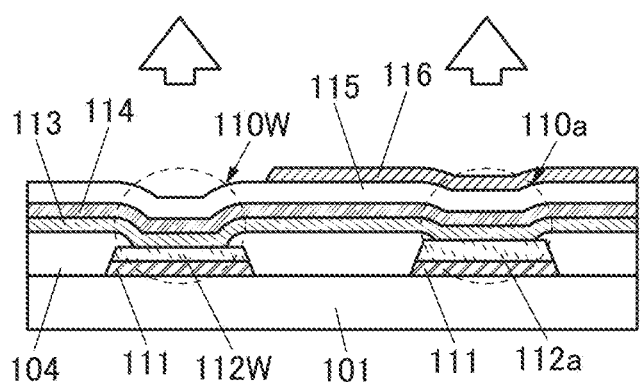
FIG. 1(A) to FIG. 1(E) are cross-sectional views illustrating examples of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display device of one embodiment of the present invention is described with reference to FIG. 1 to FIG. 13.

A display device of one embodiment of the present invention is a display device of a color filter method in which a light-emitting element that emits white light is combined with a color filter. Thus, the display device can be increased in size and resolution easily. Furthermore, the display device can be manufactured with high yield.

The display device of one embodiment of the present invention includes both a light-emitting element to which a microcavity structure is applied and a light-emitting element to which a microcavity structure is not applied. The light-emitting element to which a microcavity structure is applied can emit light with high color purity. A light-emitting element to which a microcavity structure is not applied can emit light with high efficiency. For example, subpixels that exhibit light of red, green, blue, and the like preferably include a light-emitting element to which a microcavity structure is applied. Furthermore, a subpixel that exhibits white light preferably includes a light-emitting element to which a microcavity structure is not applied. With this structure, the light extraction efficiency for both light with high color purity and white light can be increased. Therefore, a display device with high display quality and low power consumption can be achieved.

The display device of one embodiment of the present invention has a top-emission structure. In the top-emission display device, a transistor, a capacitor, a wiring, and the like can be provided so as to overlap with a light-emitting region of a light-emitting element; therefore, the top-emission display device can have a higher aperture ratio of pixels and a longer life than a bottom-emission display device, which is preferable.

[Outlines of Display Device]

FIG. 1(A) illustrates a display device including a light-emitting element 110W and a light-emitting element 110a.

The light-emitting element 110W includes a pixel electrode 111 over a substrate 101, an optical adjustment layer 112W over the pixel electrode 111, an EL layer 113 over the optical adjustment layer 112W, and a common electrode 114 over the EL layer 113.

The light-emitting element 110a includes the pixel electrode 111 over the substrate 101, an optical adjustment layer 112a over the pixel electrode 111, the EL layer 113 over the optical adjustment layer 112a, and the common electrode 114 over the EL layer 113.

One of the pixel electrode 111 and the common electrode 114 functions as an anode and the other functions as a cathode. When a voltage higher than the threshold voltage of the light-emitting element is applied between the pixel electrode 111 and the common electrode 114, holes are injected to the EL layer 113 from the anode side and electrons are injected to the EL layer 113 from the cathode side. The injected electrons and holes are recombined in the EL layer 113 and a light-emitting substance contained in the EL layer 113 emits light.

The optical adjustment layer 112W and the optical adjustment layer 112a have a conducting property. An end portion of the pixel electrode 111, an end portion of the optical adjustment layer 112W, and an end portion of the optical adjustment layer 112a are each covered with an insulating layer 104. The insulating layer 104 has an opening in a portion overlapping with the pixel electrode 111. The EL layer 113 includes at least a light-emitting layer. The EL layer 113 and the common electrode 114 are each provided across a plurality of light-emitting elements.

The light-emitting element 110a and the light-emitting element 110W are covered with a protective layer 115.

The light-emitting element 110a overlaps with a semi-transmissive layer 116 (also referred to as a semi-transmissive and semi-reflective layer) with the protective layer 115 positioned therebetween. The semi-transmissive layer 116 does not overlap with a light-emitting region of the light-emitting element 110W (corresponding to a region of the EL layer 113, which overlaps with the pixel electrode 111 and the optical adjustment layer 112W) but overlaps with a light-emitting region of the light-emitting element 110a (corresponding to a region of the EL layer 113, which overlaps with the pixel electrode 111 and the optical adjustment layer 112a).

Note that the semi-transmissive layer 116 can be regarded as a component of the light-emitting element 110a. In other words, the light-emitting element 110a can be regarded as including the pixel electrode 111 and the semi-transmissive layer 116. Furthermore, the light-emitting element 110a can be regarded as having a microcavity structure. Moreover, the light-emitting element 110W can be regarded as not having a microcavity structure.

A microcavity structure is applied to the light-emitting element 110a. Light emitted by the light-emitting layer resonates between the pixel electrode 111 and the semi-transmissive layer 116, so that light extracted through the semi-transmissive layer 116 can be intensified. Adjusting the optical length between the pixel electrode 111 and the semi-transmissive layer 116 enables a higher efficiency of extracting light of an intended wavelength. Light emitted by the light-emitting element 110a has an increased light intensity of a specific wavelength and is light of violet, blue, blue green, green, yellow green, yellow, yellow orange, orange, or red, for example. Since the intensity of light of an intended wavelength is increased, light with high color purity can be obtained from the light-emitting element 110a.

In contrast, a microcavity structure is not applied to the light-emitting element 110W. Light emitted by the light-emitting layer is extracted to the outside without being increased in the light intensity of a specific wavelength by the semi-transmissive layer 116. Therefore, white light can be efficiently extracted from the light-emitting element 110W to the outside. By using the light-emitting element 110W in a subpixel that exhibits white light, the display device can be reduced in power consumption.

The display device including the light-emitting element 110a to which a microcavity structure is applied and the light-emitting element 110W to which a microcavity structure is not applied has high light extraction efficiency for both light with high color purity and white light. Thus, a display device with high display quality and low power consumption can be achieved.

The optical length between the pixel electrode 111 and the semi-transmissive layer 116 is preferably adjusted to $m\lambda/2$ (m is a natural number) or the vicinity thereof, where $\lambda$ is the wavelength of light whose intensity is desired to be increased.

The reflectivity with respect to visible light of the pixel electrode 111 is higher than that of the common electrode 114. The pixel electrode 111 can also be referred to as a reflective electrode. The common electrode 114 can also be referred to as a transparent electrode. The reflectivity with respect to visible light of the semi-transmissive layer 116 is preferably higher than that of the common electrode 114 and lower than that of the pixel electrode 111.

For example, the visible light reflectance of the pixel electrode 111 is higher than or equal to 40% and lower than or equal to 100%, preferably higher than or equal to 70% and lower than or equal to 100%. For example, the visible light reflectance of the semi-transmissive layer 116 is higher than or equal to 20% and lower than or equal to 80%, preferably higher than or equal to 40% and lower than or equal to 70%. For example, the visible light transmittance of the common electrode 114 is 40% or more. Specifically, it is preferable that the average reflectance or transmittance with respect to light with a wavelength greater than or equal to 400 nm and less than or equal to 700 nm be within the above-described range. Furthermore, it is preferable that the reflectance or transmittance with respect to light with a predetermined wavelength greater than or equal to 400 nm and less than or equal to 700 nm be within the above-described range.

The optical length can be adjusted by changing the thickness of the optical adjustment layer 112a.

As the optical adjustment layer 112a, a conductive film which transmits visible light (transparent conductive film) can be used.

The optical adjustment layer 112a is preferably formed using an exposure technique using a multi-tone mask (a half-tone mask, a gray-tone mask, or the like). Accordingly, the manufacturing cost of the light-emitting element can be reduced and the manufacturing process of the light-emitting element can be simplified.

In terms of equal carrier-injection and carrier-transport properties from the pixel electrode 111 to the EL layer 113 in the plurality of light-emitting elements, the light-emitting element 110W may include an optical adjustment layer (the optical adjustment layer 112W) between the pixel electrode 111 and the EL layer 113. The light-emitting element 110W may include no optical adjustment layer 112W.

Figure 1B:
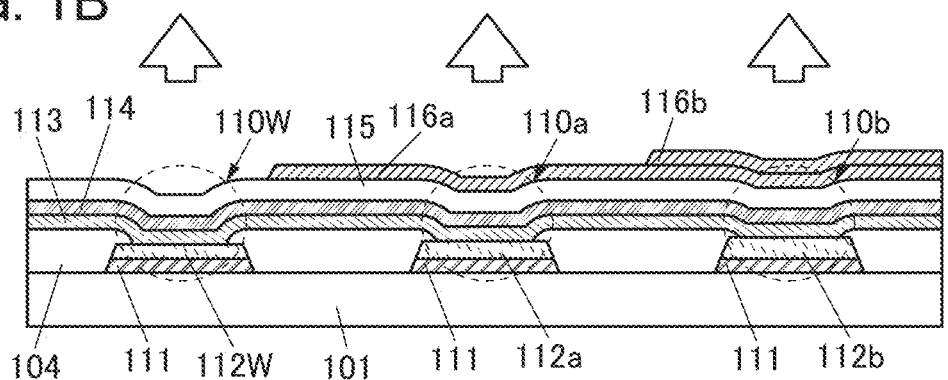

The display device illustrated in FIG. 1(B) includes a light-emitting element 110b in addition to the light-emitting element 110W and the light-emitting element 110a.

The light-emitting element 110b includes the pixel electrode 111 over the substrate 101, an optical adjustment layer 112b over the pixel electrode 111, the EL layer 113 over the optical adjustment layer 112b, and the common electrode 114 over the EL layer 113.

Each of the light-emitting elements is covered with the protective layer 115.

The light-emitting element 110a and the light-emitting element 110b overlap with a semi-transmissive layer 116a with the protective layer 115 positioned therebetween. The light-emitting element 110b further overlaps with a semi-transmissive layer 116b with the protective layer 115 and the semi-transmissive layer 116a positioned therebetween.

Note that the semi-transmissive layer 116a and the semi-transmissive layer 116b can each be regarded as a component of the light-emitting element 110b. In other words, the light-emitting element 110b can be regarded as including the pixel electrode 111, the semi-transmissive layer 116a, and the semi-transmissive layer 116b. Furthermore, the light-emitting element 110b can be regarded as having a microcavity structure.

The semi-transmissive layer 116a does not overlap with the light-emitting region of the light-emitting element 110W but overlaps with the light-emitting region of the light-emitting element 110a and a light-emitting region of the light-emitting element 110b. The semi-transmissive layer 116b does not overlap with the light-emitting region of the light-emitting element 110W nor the light-emitting region of the light-emitting element 110a but overlaps with the light-emitting region of the light-emitting element 110b.

A microcavity structure is applied to each of the light-emitting element 110a and the light-emitting element 110b. The optical adjustment layer 112a and the optical adjustment layer 112b are layers having different thicknesses from each other, which makes the optical length between the pixel electrode 111 and the semi-transmissive layer 116 in the light-emitting element 110a differ from that in the light-emitting element 110b. Light emitted by the light-emitting element 110a and light emitted by the light-emitting element 110b each have an increased light intensity of a specific wavelength and are light of different colors. Since the intensity of light of an intended wavelength is increased, light with high color purity can be obtained from each of the light-emitting elements 110a and 110b.

The thickness of the semi-transmissive layer overlapping with the light-emitting region is different between the light-emitting element 110a and the light-emitting element 110b. Specifically, since the semi-transmissive layer 116b as well as the semi-transmissive layer 116a overlaps with the light-emitting region of the light-emitting element 110b, the amount of light reflected by the semi-transmissive layer increases and the intensity of light of a specific wavelength is further increased. Thus, light with an especially high color purity can be obtained from the light-emitting element 110b.

In this manner, making either or both of the thickness and material of the semi-transmissive layer different among subpixels of different colors, the reflectivity with respect to visible light of the semi-transmissive layer can be varied. This enables a variation in the degree of increase in light intensity among subpixels of different colors.

Figure 1C:
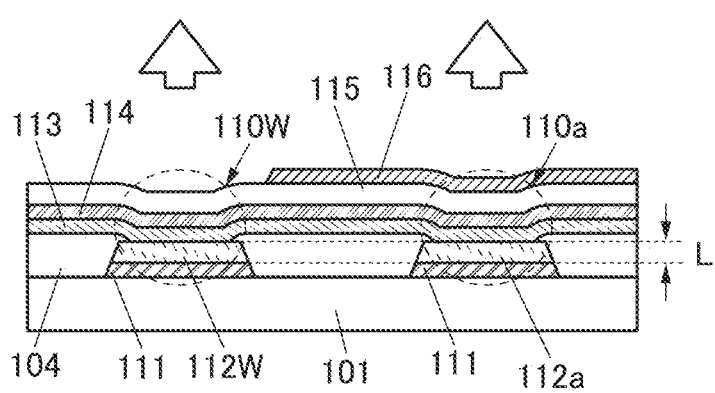

The light-emitting element 110W and the light-emitting element 110a illustrated in FIG. 1(C) are different from those in FIG. 1(A) in that the thickness of the optical adjustment layer 112W and the thickness of the optical adjustment layer 112a are equal to each other (have a thickness L). The thickness of the optical adjustment layer 112W and the thickness of the optical adjustment layer 112a may be the same as or different from each other.

Figure 1D:
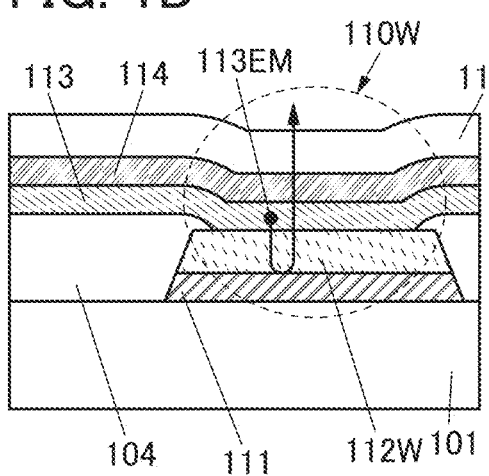

The light-emitting element 110W does not overlap with the semi-transmissive layer 116 and thus does not have a microcavity structure; however, part of light 113EM emitted by the EL layer 113 is reflected by the pixel electrode 111 as illustrated in FIG. 1(D), and at this time, light of a specific wavelength is increased. Therefore, it is preferable to determine the thickness of the optical adjustment layer 112W in accordance with the wavelength which is desired to be increased. The thickness of the optical adjustment layer 112W may be equal to that of the optical adjustment layer included in a subpixel of another color.

For example, in the case where the light 113EM emitted by the light-emitting element 110W included in the subpixel which exhibits white light is white light with a low color temperature, the thickness of the optical adjustment layer 112W is preferably made to be equal to that of the optical adjustment layer used in a blue subpixel. This can increase the intensity of blue wavelength light of the light 113EM, whereby light extracted through the common electrode 114 can become close to white light with a desired color temperature.

The pixel electrode 111 has reflectivity with respect to visible light. The optical adjustment layer 112a, the optical adjustment layer 112b, the optical adjustment layer 112W, and the common electrode 114 each have a transmitting property with respect to visible light. The semi-transmissive layer 116, the semi-transmissive layer 116a, and the semi-transmissive layer 116b have both reflectivity with respect to visible light and a transmitting property with respect to visible light. For the pixel electrode 111, the optical adjustment layer 112a, the optical adjustment layer 112W, the common electrode 114, the semi-transmissive layer 116, the semi-transmissive layer 116a, and the semi-transmissive layer 116b, materials described below can be used in an appropriate combination to satisfy the above-described functions. For example, a metal, an alloy, an electrically conductive compound, a mixture of these, or the like can be appropriately used. Specifically, an In—Sn oxide (also referred to as ITO), an In—Si—Sn oxide (also referred to as ITSO), an In—Zn oxide, an In—W—Zn oxide, and an In—Ga—Zn oxide (also referred to as IGZO) can be given. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 or Group 2 element in the periodic table, which is not described above, (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

For the semi-transmissive layer 116, a metal with a thickness (e.g., greater than or equal to 1 nm and less than or equal to 30 nm) which allows light transmission therethrough is preferably used. It is preferable to use silver (Ag) or an alloy containing Ag as the metal because the semi-transmissive layer 116 can have a high reflectance and thus the light-emitting element 110a can have high light emission efficiency. Since Ag has a low visible light absorbance, the thickness of Ag is set such that light can pass therethrough, whereby a film having both a transmitting property and reflectivity with respect to visible light can be formed.

Note that in the case where the semi-transmissive layer 116 has a conducting property, the semi-transmissive layer 116 may be in a floating state or a predetermined potential may be supplied to the semi-transmissive layer 116.

It is preferable to use a material containing aluminum (Al) or Ag as the pixel electrode 111 because the pixel electrode 111 can have a high reflectance and thus the light-emitting element can have high light emission efficiency. Note that Al is preferable because material cost is low, patterning can be easily performed, and thus manufacturing cost of a light-emitting element can be reduced. In addition, Ag is preferable because its especially high reflectance can increase the emission efficiency of the light-emitting element.

As the optical adjustment layer 112a, the optical adjustment layer 112b, the optical adjustment layer 112W, and the common electrode 114, a metal oxide can be suitably used. The metal oxide preferably contains one or both of indium (In) and zinc (Zn). With the metal oxide containing one or both of In and Zn, the conductivity and light transmittance can be increased. Furthermore, since the material cost of Zn is low, the manufacturing cost of a light-emitting element is reduced, which is preferable.

Note that in the case where a material containing Al is in contact with an oxide containing In, the material containing Al and the oxide containing In differ in ionization tendency; thus, electrons are donated and accepted between the materials, resulting in electrolytic corrosion between electrodes containing the materials. Therefore, it is preferable that the material containing Al be not in contact with the oxide containing In. Also from this fact, Ag is particularly preferable as the metal contained in the pixel electrode 111.

The EL layer 113 includes a light-emitting layer containing a light-emitting substance. Since the display device of this embodiment uses a light-emitting element that emits white light, a structure with which two lights of complementary colors are obtained, a structure with which three lights of red, green, and blue are obtained, or the like is applied to the EL layer 113. As the light-emitting substance, either or both of a fluorescent material and a phosphorescent material can be used. The EL layer 113 includes functional layers such as a hole-injection layer, a hole-transport layer, an electron-transport layer, an electron-injection layer, and a charge-generation layer as well as the light-emitting layer.

Since the display device of this embodiment has the structure in which the light-emitting element that emits white light is combined with the color filter, subpixels of different colors can have the same structure of the EL layer 113.

When a film with a high barrier property is used as the protective layer 115, entry of impurities such as moisture and oxygen into the light-emitting elements can be inhibited. Thus, deterioration of the light-emitting elements can be suppressed and the reliability of the display device can be increased.

In the display device of this embodiment, the semi-transmissive layer 116 is provided so as not to overlap with the light-emitting region of the light-emitting element 110W. For example, a film to be the semi-transmissive layer 116 is processed, whereby the semi-transmissive layer 116 having a desired shape can be formed. Specifically, first, a film having both a transmitting property and reflectivity with respect to visible light is formed, and then the film is processed, whereby the semi-transmissive layer 116 can be formed in only a desired region. If the protective layer 115 is not provided or only the protective layer 115 having a low barrier property is provided over the EL layer 113 at the time of processing the film, impurities might be mixed into the EL layer 113 and the reliability of the light-emitting elements might be lowered. Also for this reason, the protective layer 115 is required to be the film with a high barrier property. Using the film with a high barrier property as the protective layer 115 can suppress entry of impurities into the light-emitting elements during formation of the semi-transmissive layer 116.

There is no particular limitation on a method of processing the semi-transmissive layer 116; for example, a wet etching method, a dry etching method, or a lift-off method can be used.

Figure 1E:
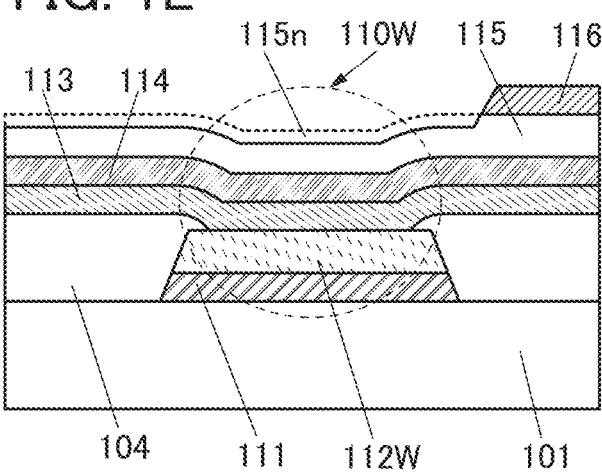

Note that when the film to be the semi-transmissive layer 116 is processed by a dry etching method, the thickness of the protective layer 115 might be partly reduced. Specifically, a portion of the protective layer 115, which overlaps with the light-emitting region of the light-emitting element 110W and where the film to be the semi-transmissive layer 116 is removed, is thinner than the other portion of the protective layer 115, in some cases. A region 115n which overlaps with the light-emitting element 110W and where the protective layer 115 is removed is illustrated in FIG. 1(E). Although the light-emitting element 110W does not have a microcavity structure and thus the smaller thickness of the protective layer 115 does not influence the light emission color, it is preferable that the light-emitting element W is covered with an adequate thickness of the protective layer 115 in order to prevent a reduction in reliability of the light-emitting element. Furthermore, since the thickness of the protective layer 115 influences the optical length between the pixel electrode 111 and the semi-transmissive layer 116, a too large thickness might cause an excessively intensified light of a specific wavelength. For these reasons, the thickness of the protective layer 115 is greater than or equal to 1 nm and less than or equal to 1000 nm, preferably greater than or equal to 50 nm and less than or equal to 500 nm, further preferably greater than or equal to 100 nm and less than or equal to 300 nm.

The protective layer 115 preferably includes at least one layer of organic film (or inorganic insulating film) and further preferably includes more than one layer of inorganic film and more than one layer of organic film. For example, the protective layer 115 may include a first inorganic film over the common electrode 114, an organic film over the first inorganic film, and a second inorganic film over the organic film.

The inorganic film (or inorganic insulating film) preferably has a high moisture barrier property through which water is unlikely to be diffused and transmitted. The inorganic film (or inorganic insulating film) through which one or both of hydrogen and oxygen are unlikely to be diffused and transmitted is further preferable. Thus, the inorganic film (or inorganic insulating film) can serve as a barrier film. Diffusion of impurities from the outside into the light-emitting elements can be effectively suppressed, so that a highly reliable display device can be provided.

As the protective layer 115, an oxide insulating film, a nitride insulating film, an oxynitride insulating film, a nitride oxide insulating film, or the like can be used. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film. Examples of the nitride oxide insulating film include a silicon nitride oxide film.

Note that in this specification and the like, an oxynitride refers to a material whose oxygen content is higher than the nitrogen content as for the composition, and a nitride oxide refers to a material whose nitrogen content is higher than the oxygen content as for the composition.

In particular, a silicon nitride film, a silicon nitride oxide film, and an aluminum oxide film are preferable as the protective layer 115 because of their high moisture barrier properties.

In terms of light extraction efficiency, a difference between a refractive index of the protective layer 115 and a refractive index of the common electrode 114 is preferably less than or equal to 0.5 and particularly preferably less than or equal to 0.3. The refractive index of the common electrode 114 is relatively high; when ITO is used as the common electrode 114, the common electrode 114 has a refractive index of approximately 2.0. Therefore, a material with a relatively high refractive index is preferably used as the protective layer 115.

For example, refractive indexes of a silicon nitride film, a silicon nitride oxide film, and an aluminum oxide film are roughly greater than or equal to 1.7 and less than or equal to 2.3, which are higher than that of a silicon oxide film (refractive index: approximately 1.5). Also for this reason, a silicon nitride film, a silicon nitride oxide film, and an aluminum oxide film are each suitable as the protective layer 115.

An inorganic film containing ITO, a Ga—Zn oxide, an Al—Zn oxide, an In—Ga—Zn oxide, or the like can also be used as the protective layer 115. The inorganic film preferably has high resistance, and preferably has higher resistance than the common electrode 114. The inorganic film may further contain nitrogen.

The visible-light-transmitting conductive film used as the common electrode 114 and the visible-light-transmitting inorganic film used as the protective layer 115 may contain a common metal element, for example. Adhesion between the common electrode 114 and the protective layer 115 can be increased, whereby film separation and entry of impurities from an interface can be inhibited.

A first ITO film can be used as the common electrode 114 and a second ITO film can be used as the protective layer 115, for example. The second ITO film is preferably a film that has a higher resistivity than the first ITO film. Furthermore, a first Ga—Zn oxide film can be used as the common electrode 114 and a second Ga—Zn oxide film can be used as the protective layer 115, for example. The second Ga—Zn oxide film is preferably a film that has a higher resistivity than the first Ga—Zn oxide film.

An inorganic film containing Ga, Zn, and O can be obtained by film deposition in an oxygen atmosphere or a mixed atmosphere of argon and oxygen with the use of a Ga—Zn—O-based metal oxide target (a mixed sintered body of $Ga_2O_3$ and ZnO), for example. An insulating film containing Al, Zn, and O can be obtained by film deposition in a similar atmosphere with the use of an Al—Zn—O-based metal oxide target (a mixed sintered body of $Al_2O_3$ and ZnO), for example. An inorganic film containing Ga or Al, Zn, O, and N can be obtained by film deposition in a mixed atmosphere of argon, oxygen, and nitrogen with the use of a similar target.

Furthermore, the protective layer 115 may include an organic insulating film formed using an acrylic resin, an epoxy resin, a polyimide resin, a polyamide resin, a polyimide-amide resin, a polysiloxane resin, a benzocyclobutene-based resin, a phenol resin, or the like.

The specific resistance of the protective layer 115 is preferably higher than or equal to $10^{10}$ Ωcm at 20° C.

The protective layer 115 can be formed by a chemical vapor deposition (CVD) method (such as a plasma-enhanced chemical vapor deposition (PECVD) method), a sputtering method (such as a DC sputtering method, an RF sputtering method, or an ion beam sputtering method), an atomic layer deposition (ALD) method, or the like.

A sputtering method and an ALD method are capable of film deposition at low temperatures. The EL layer 113 included in the light-emitting elements has low heat resistance. Therefore, the protective layer 115 formed after the fabrication of the light-emitting elements is preferably formed at a comparatively low temperature, typically at 100° C. or lower, and a sputtering method and an ALD method are suitable.

As the protective layer 115, two or more insulating films formed by different deposition methods may be stacked.

It is preferable that a first-layer inorganic film be formed by a sputtering method and a second-layer inorganic film be formed by an ALD method, for example.

A film formed by a sputtering method contains fewer impurities and has higher density than a film formed by an ALD method. The film formed by an ALD method has higher step coverage and is less likely to be influenced by the shape of a deposition surface than the film formed by a sputtering method.

The first-layer inorganic film contains few impurities and has high density. The second-layer inorganic film is formed so as to cover a portion which is not sufficiently covered with the first inorganic film due to the influence of a step of the formation surface. Thus, it is possible to form a protective layer capable of further reducing diffusion of water or the like than a protective layer in which only one of the inorganic films is formed.

Specifically, it is preferable that an aluminum oxide film, a zirconium oxide film, an ITO film, a Ga—Zn oxide film, an Al—Zn oxide film, or an In—Ga—Zn oxide film be formed by a sputtering method first, and then an aluminum oxide film or a zirconium oxide film be formed by an ALD method.

The thickness of the inorganic film formed by a sputtering method is preferably greater than or equal to 50 nm and less than or equal to 1000 nm, further preferably greater than or equal to 100 nm and less than or equal to 300 nm.

The thickness of the inorganic film formed by an ALD method is preferably greater than or equal to 1 nm and less than or equal to 100 nm, further preferably greater than or equal to 5 nm and less than or equal to 50 nm.

The water vapor transmission rate of the protective layer 115 is lower than $1\times10^{-2}$ g/(m$^2$·day), preferably lower than or equal to $5\times10^{-3}$ g/(m$^2$·day), further preferably lower than or equal to $1\times10^{-4}$ g/(m$^2$·day), still further preferably lower than or equal to $1\times10^{-5}$ g (m$^2$·day), yet further preferably lower than or equal to $1\times10^{-6}$ g/(m$^2$·day). The lower the water vapor transmission rate is, the more diffusion of water from the outside into the light-emitting element can be reduced.

Note that the insulating layer 104 may be formed using an inorganic insulating film or an organic insulating film that can be used for the protective layer 115.

The insulating layer 104 formed before the fabrication of the light-emitting elements can be deposited at a high temperature. By setting substrate temperature during film deposition to a high temperature (e.g., higher than or equal to 100° C. and lower than or equal to 350° C.), a dense film with a high barrier property can be formed. Not only a sputtering method and an ALD method but also a CVD method is suitable for forming the insulating layer 104. A CVD method has a high deposition rate; thus, it is preferable.

For the substrate 101, a material such as glass, quartz, an organic resin, a metal, an alloy, or a semiconductor can be used. The substrate 101 may be provided with a variety of semiconductor circuits as described later in Embodiment 2.

[Pixel]

Figure 2A:
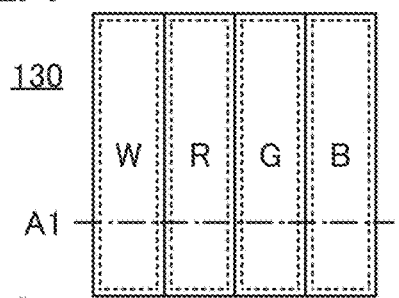
FIG. 2(A) and FIG. 2(B) are top views illustrating examples of a pixel.
Figure 2B:
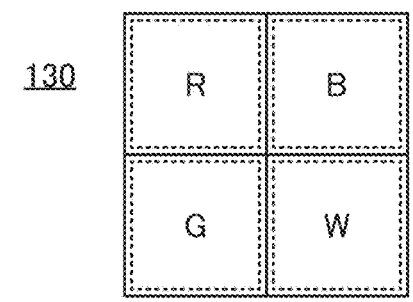

FIG. 2(A) and FIG. 2(B) illustrate examples of a top view of a pixel 130. The pixel 130 illustrated in FIG. 2(A) includes one row and four columns of subpixels. The pixel 130 illustrated in FIG. 2(B) includes two rows and two columns of subpixels.

Description is made with reference to FIG. 2(A) and FIG. 2(B), taking a display device which exhibits one color with subpixels of four colors: R (red), G (green), B (blue), and W (white) as an example. In the display device of one embodiment of the present invention, the color elements are not limited and a color other than RGBW (e.g., yellow, cyan, or magenta) may be used as well.

Figure 2C:
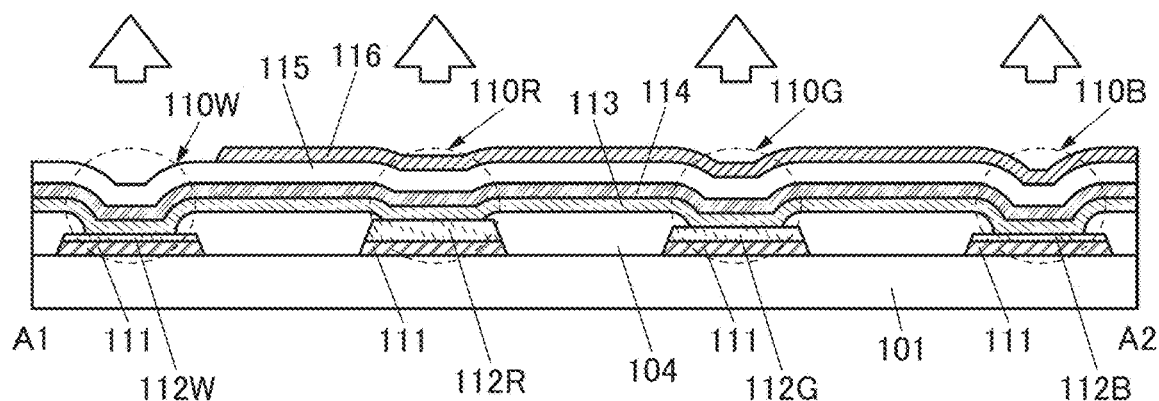
FIG. 2(C) to FIG. 2(E) are cross-sectional views illustrating examples of a display device.

FIG. 2(C) is a cross-sectional view taken along a dashed-dotted line A1-A2 in FIG. 2(A).

The light-emitting element 110W included in the subpixel which exhibits white light includes the pixel electrode 111 over the substrate 101, the optical adjustment layer 112W over the pixel electrode 111, the EL layer 113 over the optical adjustment layer 112W, and the common electrode 114 over the EL layer 113.

A light-emitting element 110R included in the subpixel which exhibits red light includes the pixel electrode 111 over the substrate 101, an optical adjustment layer 112R over the pixel electrode 111, the EL layer 113 over the optical adjustment layer 112R, and the common electrode 114 over the EL layer 113.

A light-emitting element 110G included in the subpixel which exhibits green light includes the pixel electrode 111 over the substrate 101, an optical adjustment layer 112G over the pixel electrode 111, the EL layer 113 over the optical adjustment layer 112G, and the common electrode 114 over the EL layer 113.

A light-emitting element 110B included in the subpixel which exhibits blue light includes the pixel electrode 111 over the substrate 101, an optical adjustment layer 112B over the pixel electrode 111, the EL layer 113 over the optical adjustment layer 112B, and the common electrode 114 over the EL layer 113.

The pixel electrode 111 serves as an anode. The optical adjustment layer 112W, the optical adjustment layer 112R, the optical adjustment layer 112G, and the optical adjustment layer 112B have a conducting property. The end portion of the pixel electrode 111, the end portion of the optical adjustment layer 112W, and end portions of the optical adjustment layer 112R, the optical adjustment layer 112G, and the optical adjustment layer 112B are each covered with the insulating layer 104. The insulating layer 104 has an opening in a portion overlapping with the pixel electrode 111. The EL layer 113 includes at least a light-emitting layer. The common electrode 114 serves as a cathode. The EL layer 113 and the common electrode 114 are each provided across a plurality of light-emitting elements.

The light-emitting element 110W, the light-emitting element 110R, the light-emitting element 110G, and the light-emitting element 110B are covered with the protective layer 115.

The light-emitting element 110R, the light-emitting element 110G, and the light-emitting element 110B each overlap with the semi-transmissive layer 116 with the protective layer 115 positioned therebetween. The semi-transmissive layer 116 does not overlap with the light-emitting region of the light-emitting element 110W but overlaps with light-emitting regions of the light-emitting element 110R, the light-emitting element 110G, and the light-emitting element 110B.

Note that the semi-transmissive layer 116 can be regarded as components of the light-emitting element 110R, the light-emitting element 110G, and the light-emitting element 110B. In other words, the light-emitting element 110R, the light-emitting element 110G, and the light-emitting element 110B can each be regarded as including the pixel electrode 111 and the semi-transmissive layer 116. Furthermore, the light-emitting element 110R, the light-emitting element 110G, and the light-emitting element 110B can each be regarded as having a microcavity structure. Moreover, the light-emitting element 110W can be regarded as not having a microcavity structure.

A microcavity structure is applied to the light-emitting element 110R, the light-emitting element 110G, and the light-emitting element 110B.

The thickness of the optical adjustment layer 112R of the light-emitting element 110R is adjusted so that the optical length between the pixel electrode 111 and the semi-transmissive layer 116 is set to an optical length that increases the emission intensity of red light. Similarly, the thickness of the optical adjustment layer 112G of the light-emitting element 110G is adjusted so that the optical length between the pixel electrode 111 and the semi-transmissive layer 116 is set to an optical length that increases the emission intensity of green light. Furthermore, the thickness of the optical adjustment layer 112B of the light-emitting element 110B is adjusted so that the optical length between the pixel electrode 111 and the semi-transmissive layer 116 is set to an optical length that increases the emission intensity of blue light. Adjusting the optical length between the pixel electrode 111 and the semi-transmissive layer 116 enables a higher efficiency of extracting light of an intended wavelength. Thus, red, green, and blue light with high color purities can be obtained from the respective subpixels which exhibit red, green, and blue light.

In contrast, a microcavity structure is not applied to the light-emitting element 110W. Light emitted by the light-emitting layer is extracted to the outside without being increased in the light intensity of a specific wavelength by the semi-transmissive layer 116. Therefore, white light can be efficiently extracted from the light-emitting element 110W to the outside. Accordingly, the display device can be reduced in power consumption.

Note that FIG. 2(C) illustrates an example in which the thickness of the optical adjustment layer 112W is equal to that of the optical adjustment layer 112B. As described with reference to FIG. 1(D), in the light-emitting element 110W, part of the light 113EM from the EL layer 113 is reflected by the pixel electrode 111. In the light-emitting element 110W illustrated in FIG. 2(C), part of light emitted by the EL layer 113 is reflected by the pixel electrode 111, the intensity of blue wavelength light is increased, and light is extracted through the common electrode 114. Accordingly, for example, in the case where light emitted by the EL layer 113 is white light with a low color temperature, light emitted by the light-emitting element 110W included in the subpixel which exhibits white light can become close to white light with a desired color temperature.

The display device illustrated in FIG. 2(A) and FIG. 2(C) includes the light-emitting elements to which a microcavity structure is applied in the subpixels which exhibit red, green, and blue light, and includes the light-emitting element to which a microcavity structure is not applied in the subpixel which exhibits white light. With this structure, the light extraction efficiency for both light with high color purity and white light can be increased; therefore, a display device with high display quality and low power consumption can be achieved.

Figure 2D:
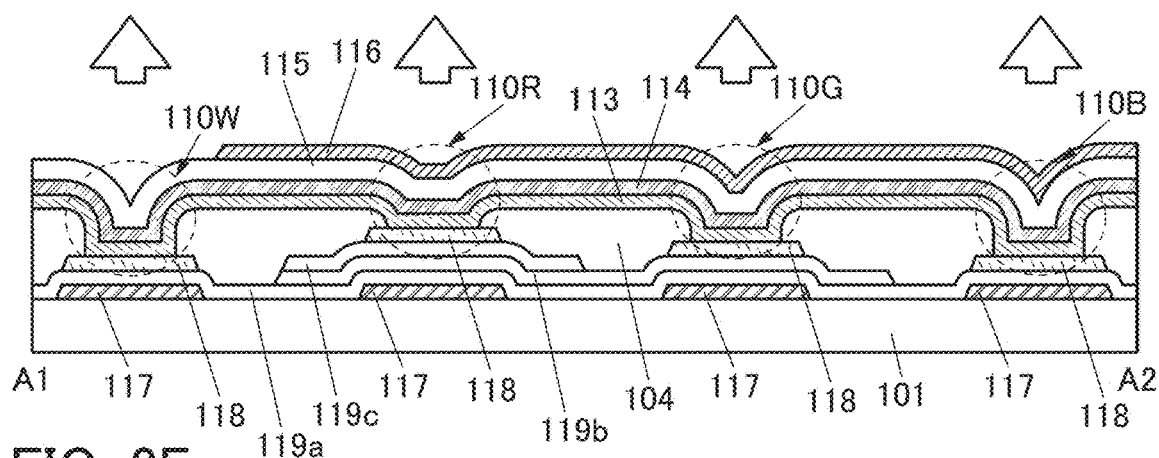

FIG. 2(D) is a cross-sectional view taken along the dashed-dotted line A1-A2 in FIG. 2(A), which is different from FIG. 2(C).

The light-emitting elements included in the subpixels which exhibit light of the colors include a pixel electrode 118, the EL layer 113 over the pixel electrode 118, and the common electrode 114 over the EL layer 113.

The pixel electrode 118 serves as an anode. An end portion of the pixel electrode 118 is covered with the insulating layer 104. The insulating layer 104 has an opening in a portion overlapping with the pixel electrode 118. The EL layer 113 includes at least a light-emitting layer. The common electrode 114 serves as a cathode.

Each of the light-emitting elements is covered with the protective layer 115.

The light-emitting element 110R, the light-emitting element 110G, and the light-emitting element 110B each overlap with the semi-transmissive layer 116 with the protective layer 115 positioned therebetween. The semi-transmissive layer 116 does not overlap with the light-emitting region of the light-emitting element 110W but overlaps with light-emitting regions of the light-emitting element 110R, the light-emitting element 110G, and the light-emitting element 110B.

Furthermore, a reflective layer 117 over the substrate 101 and an optical adjustment layer 119a over the reflective layer 117 can be regarded as components of the light-emitting element 110W included in the subpixel which exhibits white light. Similarly, the reflective layer 117 over the substrate 101, the optical adjustment layer 119a over the reflective layer 117, an optical adjustment layer 119b over the optical adjustment layer 119a, and an optical adjustment layer 119c over the optical adjustment layer 119b can be regarded as components of the light-emitting element 110R included in the subpixel which exhibits red light. Moreover, the reflective layer 117 over the substrate 101, the optical adjustment layer 119a over the reflective layer 117, and the optical adjustment layer 119b over the optical adjustment layer 119a can be regarded as components of the light-emitting element 110G included in the subpixel which exhibits green light. Furthermore, the reflective layer 117 over the substrate 101 and the optical adjustment layer 119a over the reflective layer 117 can be regarded as components of the light-emitting element 110B included in the subpixel which exhibits blue light.

The reflectivity with respect to visible light of the reflective layer 117 is higher than that of the pixel electrode 111. The pixel electrode 111 and the common electrode 114 can also be referred to as transparent electrodes. The reflectivity with respect to visible light of the semi-transmissive layer 116 is preferably higher than that of the common electrode 114 and lower than that of the reflective layer 117.

For example, the visible light reflectance of the reflective layer 117 is higher than or equal to 40% and lower than or equal to 100%, preferably higher than or equal to 70% and lower than or equal to 100%. For example, the visible light reflectance of the semi-transmissive layer 116 is higher than or equal to 20% and lower than or equal to 80%, preferably higher than or equal to 40% and lower than or equal to 70%. For example, the visible light transmittance of the pixel electrode 111 and the common electrode 114 is 40% or more.

A microcavity structure is applied to the light-emitting element 110R, the light-emitting element 110G, and the light-emitting element 110B.

The thicknesses of the optical adjustment layers 119a, 119b, and 119c of the light-emitting elements 110R, 110G, and 110B are adjusted so that the optical length between the reflective layer 117 and the semi-transmissive layer 116 is set to an optical length that increases the intensity of red light emission, green light emission, and blue light emission. Adjusting the optical length between the reflective layer 117 and the semi-transmissive layer 116 enables a higher efficiency of extracting light of an intended wavelength. Thus, red, green, and blue light with high color purities can be obtained from the respective subpixels which exhibit red, green, and blue light.

FIG. 2(C) illustrates an example in which the pixel electrode 111 is a reflective electrode and an optical adjustment layer is provided between the pixel electrode 111 and the EL layer 113. As illustrated in FIG. 2(D), the pixel electrode 118 may be a transparent electrode and the reflective layer 117 may be provided on the opposite side of the pixel electrode 118 from the EL layer 113. In this case, an optical adjustment layer can be provided between the reflective layer 117 and the pixel electrode 118. In the structure of FIG. 2(D), an insulating layer can be used as the optical adjustment layer, which is preferable in terms of a wider range for materials.

In contrast, a microcavity structure is not applied to the light-emitting element 110W. Light emitted by the light-emitting layer is extracted to the outside without being increased in the light intensity of a specific wavelength by the semi-transmissive layer 116. Therefore, white light can be efficiently extracted from the light-emitting element 110W to the outside. Accordingly, the display device can be reduced in power consumption.

The display device illustrated in FIG. 2(A) and FIG. 2(D) includes the light-emitting elements to which a microcavity structure is applied in the subpixels which exhibit red, green, and blue light, and includes the light-emitting element to which a microcavity structure is not applied in the subpixel which exhibits white light. With this structure, the light extraction efficiency for both light with high color purity and white light can be increased; therefore, a display device with high display quality and low power consumption can be achieved.

Figure 2E:
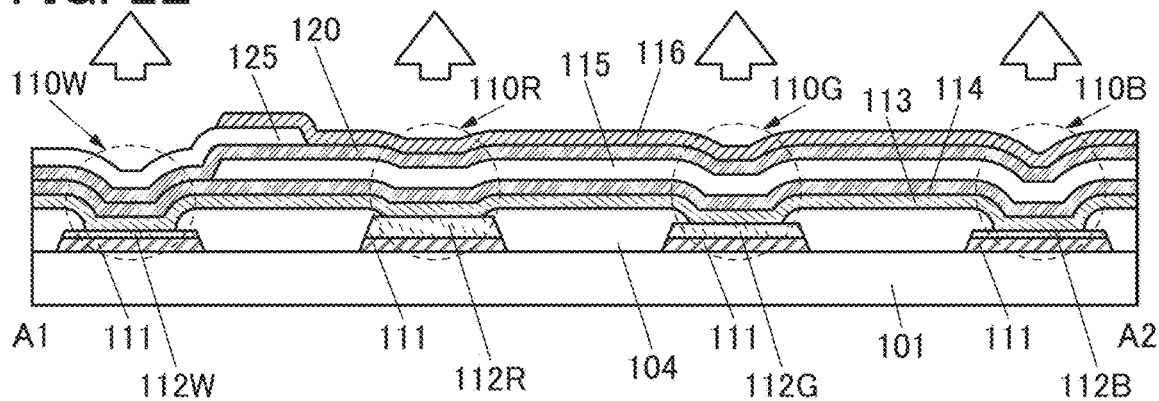

FIG. 2(E) is a cross-sectional view taken along the dashed-dotted line A1-A2 in FIG. 2(A), which is different from FIG. 2(C) and FIG. 2(D).

In FIG. 2(E), the protective layer 115 has an opening, through which a conductive layer 120 which transmits visible light is electrically connected to the common electrode 114. A protective layer 125 is provided over the conductive layer 120 which transmits visible light. The protective layer 125 has an opening overlapping with the light-emitting region of the light-emitting element to which a microcavity structure is applied. The semi-transmissive layer 116 is electrically connected to the conductive layer 120 which transmits visible light through the opening. The protective layer 115 and the protective layer 125 transmit visible light and therefore can be provided to overlap with the light-emitting regions of the light-emitting elements. Thus, the design margin can be larger than the semi-transmissive layer 116. It is preferable to use a mask to form the protective layer 115 having the opening in terms of prevention of deterioration of the light-emitting elements. Furthermore, it is preferable to include a portion where the protective layer 115 and the protective layer 125 overlap with each other in terms of prevention of deterioration of the light-emitting elements. Moreover, an auxiliary wiring that is electrically connected to the semi-transmissive layer 116 and the common electrode 114 may be provided over the protective layer 125.

The display device of this embodiment is likely to suffer a voltage drop due to resistance of the common electrode 114 because of using a conductive material which transmits visible light as the common electrode 114. Electrical connection between the semi-transmissive layer 116 and the common electrode 114 as illustrated in FIG. 2(E) can suppress the voltage drop due to resistance of the common electrode 114. Accordingly, luminance unevenness of the display device can be suppressed and the display quality of the display device can be increased.

[Layout of Semi-Transmissive Layer]

FIG. 3(A) to FIG. 3(E) illustrate top-view layout examples of the semi-transmissive layer 116.

Figure 3A:
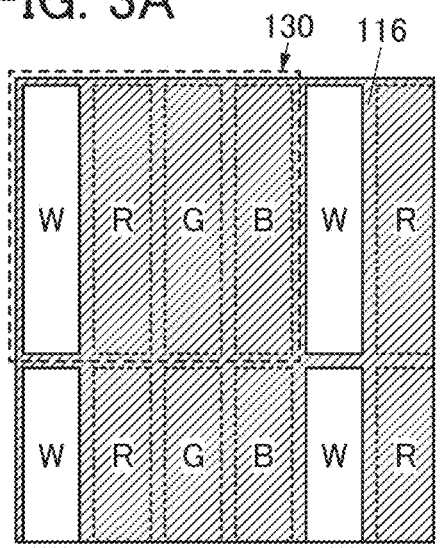
FIG. 3(A) to FIG. 3(E) are top views illustrating examples of a pixel.
Figure 3B:
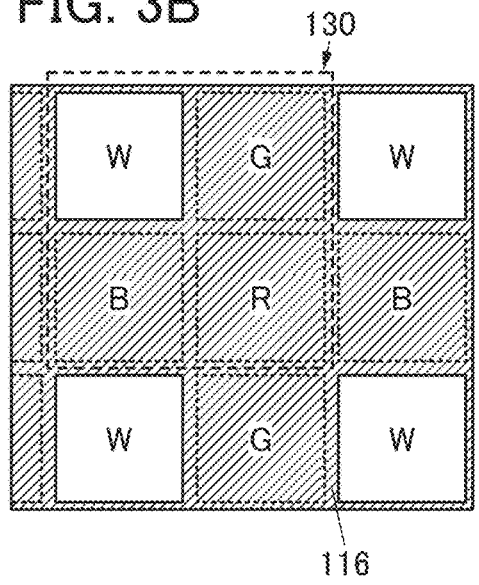
Figure 3C:
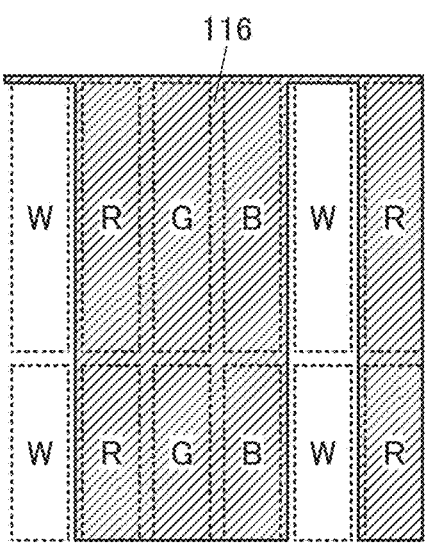

FIG. 3(A) to FIG. 3(C) illustrate examples in which the semi-transmissive layer 116 has an opening in a position overlapping with the light-emitting region of the light-emitting element 110W. With this structure, the semi-transmissive layer 116 can be provided in a wide range of a display portion of the display device, which is preferable. The structure is particularly suitably used when a constant potential is supplied to the semi-transmissive layer 116 so that the semi-transmissive layer 116 can serve as a shield for blocking noise, for example.

FIG. 3(A) and FIG. 3(B) illustrate examples in which one opening of the semi-transmissive layer 116 overlaps with the light-emitting region of one light-emitting element 110W. FIG. 3(C) illustrates an example in which one opening of the semi-transmissive layer 116 overlaps with the light-emitting regions of a plurality of light-emitting elements 110W arranged in a column.

Figure 3D:
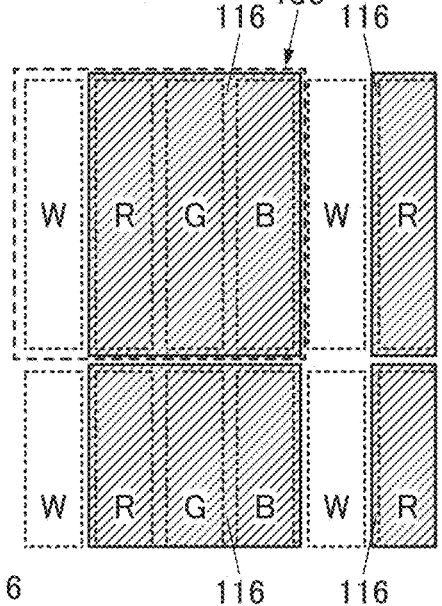
Figure 3E:
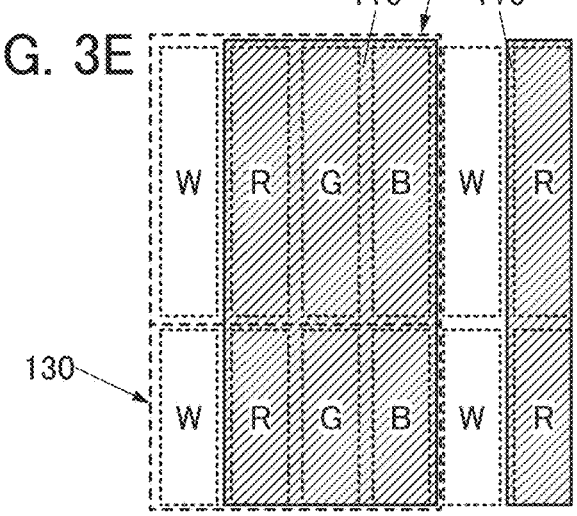

Furthermore, as illustrated in FIG. 3(D) and FIG. 3(E), the semi-transmissive layer 116 may be formed to consist of a plurality of island-shaped portions. FIG. 3(D) illustrates an example in which one island-shaped semi-transmissive layer 116 overlaps with the light-emitting regions of the subpixels of three colors (R, G, B) included in one pixel 130. FIG. 3(E) illustrates an example in which one island-shaped semi-transmissive layer 116 overlaps with the light-emitting regions of the subpixels of three colors (R, G, B) included in a plurality of pixels 130 arranged in a column.

[Other Components of Display Device]

Figure 4A:
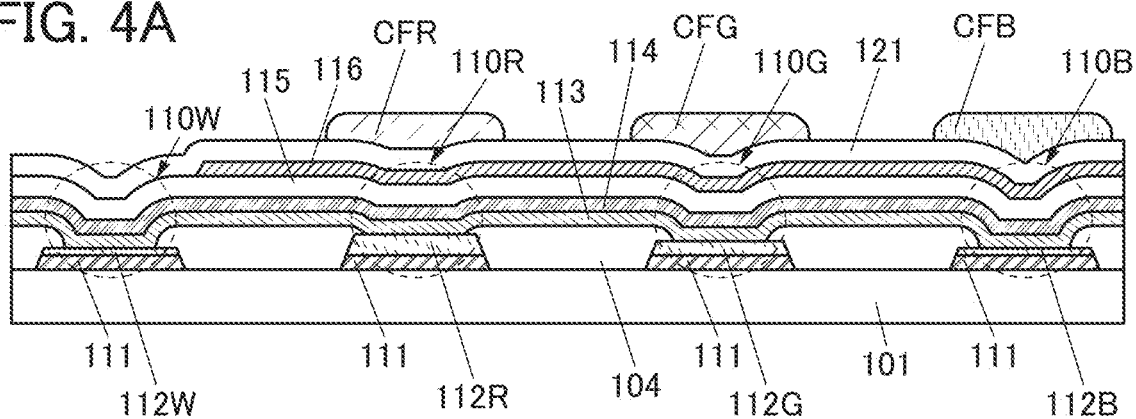
FIG. 4(A) to FIG. 4(C) are cross-sectional views illustrating examples of a display device.
Figure 4B:
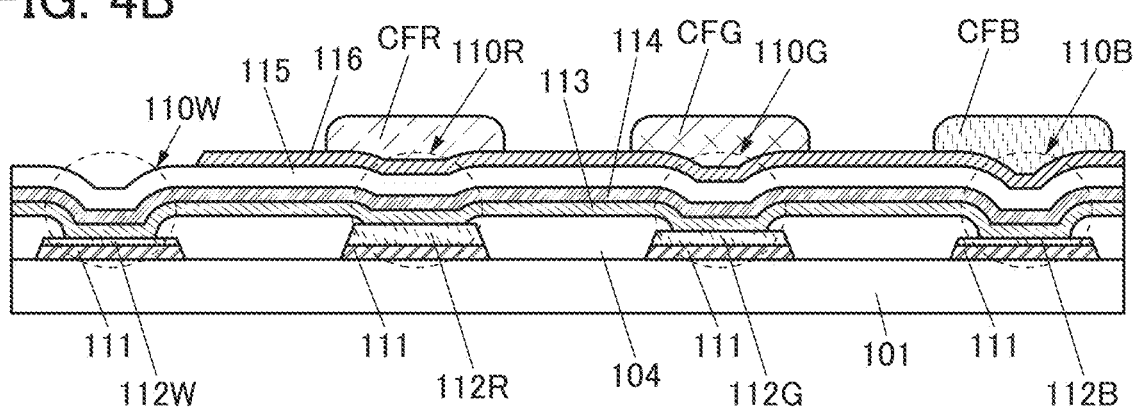
Figure 4C:
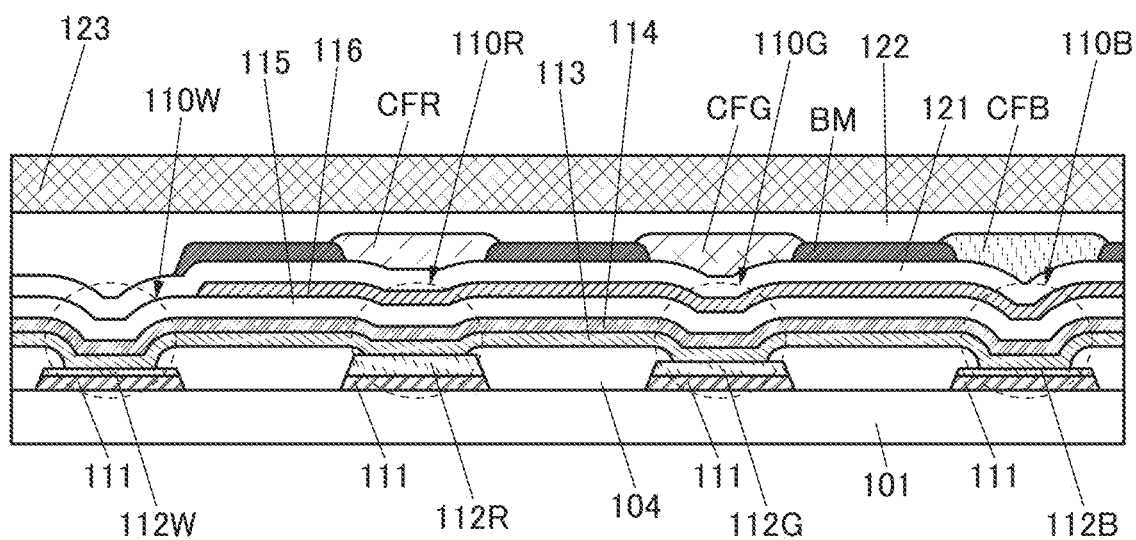

Next, FIG. 4(A) to FIG. 4(C) illustrate examples in which components are added to the display device illustrated in FIG. 2(C). Note that the components described with reference to FIG. 2(C) are not described here.

The display device illustrated in FIG. 4(A) includes a protective layer 121 over the protective layer 115 and the semi-transmissive layer 116, a red coloring layer CFR over the protective layer 121, a green coloring layer CFG over the protective layer 121, and a blue coloring layer CFB over the protective layer 121.

Providing the protective layer 121 is preferable because entry of impurities into the light-emitting elements can be further suppressed. As a material of the protective layer 121, a material that can be used for the protective layer 115 can be used.

The protective layer 121 is in contact with the protective layer 115 in a region overlapping with the light-emitting region of the light-emitting element 110W. The protective layer 121 is in contact with the semi-transmissive layer 116 in each of the following regions: a region overlapping with the light-emitting region of the light-emitting element 110R, a region overlapping with the light-emitting region of the light-emitting element 110G, and a region overlapping with the light-emitting region of the light-emitting element 110B.

In the case where the coloring layers are directly formed over the light-emitting elements, the positional alignment between the light-emitting elements and the coloring layers is facilitated compared with the case where the coloring layers are formed on the substrate 371 side. Thus, the fabrication of the high-resolution display device is facilitated, which is preferable.

As illustrated in FIG. 4(B), the coloring layers of each color may be provided over and in contact with the semi-transmissive layer 116 without provision of the protective layer 121.

Furthermore, a light-blocking layer BM may be included over the protective layer 121 as illustrated in FIG. 4(C). FIG. 4(C) illustrates an example in which a planarization layer 122 and a functional layer 123 are included over the light-emitting elements with the protective layer 115 and the protective layer 121 positioned therebetween. Note that without provision of the planarization layer 122, the functional layer 123 may be directly provided over the protective layer 121.

Since the display device of this embodiment includes the protective layer 115 (and the protective layer 121) having a high barrier property over and in contact with the light-emitting elements, a variety of components can be directly formed over the light-emitting elements. For example, either or both of the coloring layers and the light-blocking layer BM can be provided over the light-emitting elements. As the functional layer 123, one or more of an insulating layer, a conductive layer, a planarization layer, an adhesive layer, a circularly polarizing plate, a touch sensor, a shock absorption layer, and a surface protective layer can be used, for example.

Note that the semi-transmissive layer 116 may have a function of an electrode of the touch sensor.

The coloring layer is a colored layer that transmits light in a specific wavelength range. For example, a color filter that transmits light in a red, green, blue, or yellow wavelength range can be used. As a material that can be used for the coloring layers, a metal material, a resin material, a resin material containing a pigment or dye, and the like can be given.

The light-blocking layer BM is provided between the adjacent coloring layers. The light-blocking layer BM blocks light emitted from an adjacent light-emitting element to inhibit color mixture between adjacent light-emitting elements. Here, the coloring layer is provided such that its end portion overlaps with the light-blocking layer BM, whereby light leakage can be suppressed. As the light-blocking layer BM, a material that blocks light emitted from the light-emitting element can be used; for example, a black matrix can be formed using a metal material, a resin material containing pigment or dye, or the like. Note that it is preferable to provide the light-blocking layer BM in a region other than the display portion, such as a driver circuit, in which case undesired leakage of guided light or the like can be suppressed.

[Specific Example of Display Device]

Next, a specific structure of the display device of this embodiment is described with reference to FIG. 5 to FIG. 8.

Figure 5A:
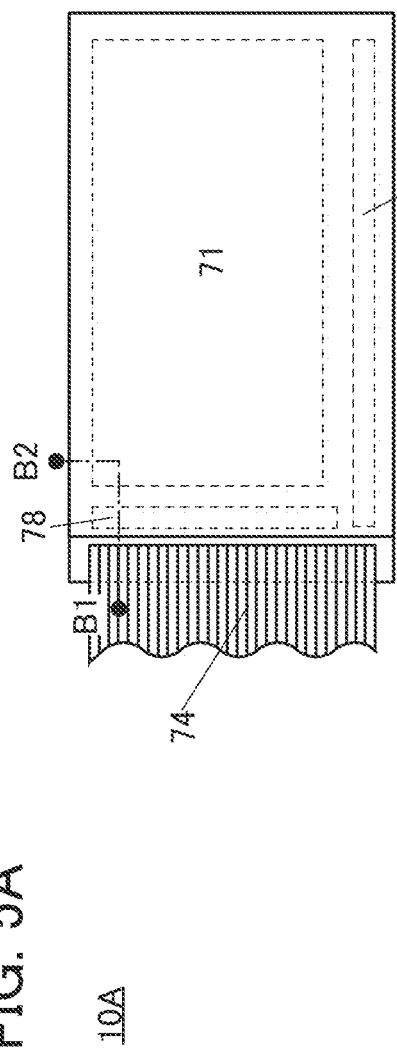
FIG. 5(A) is a top view illustrating an example of a display device.
Figure 5B:
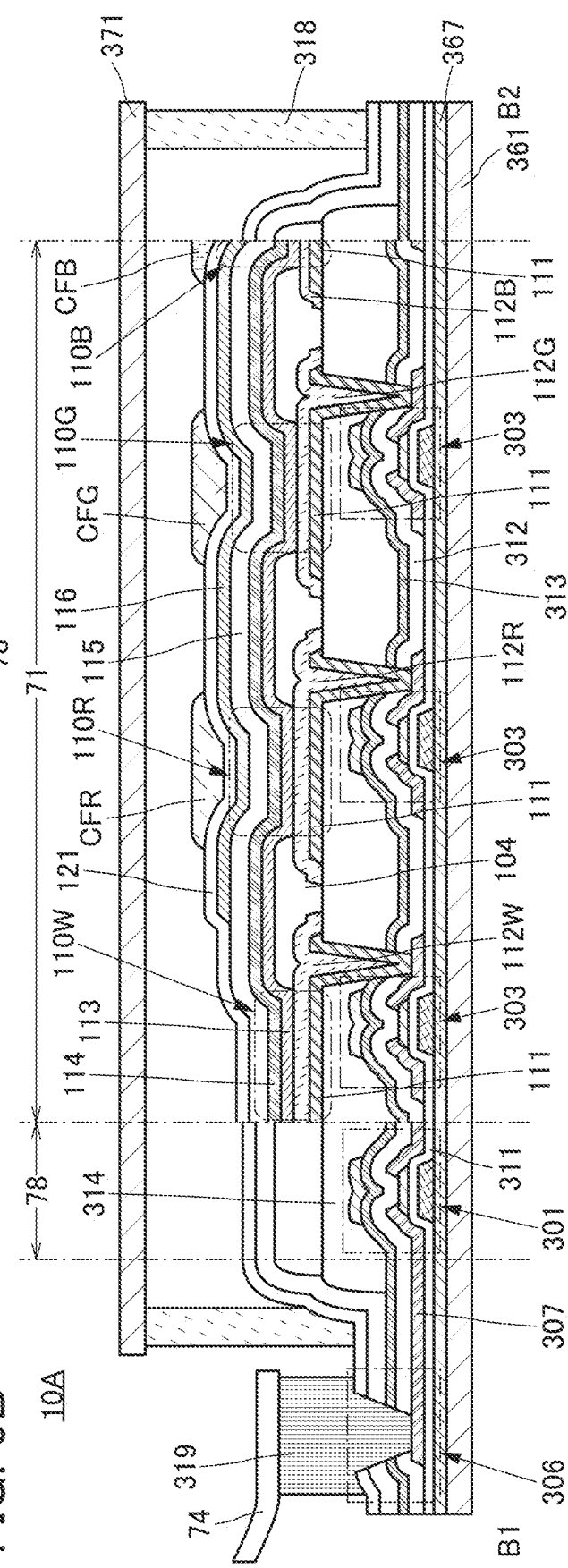
FIG. 5(B) is a cross-sectional view illustrating an example of a display device.

FIG. 5(A) shows a top view of a display device 10A. FIG. 5(B) is a cross-sectional view taken along a dashed-dotted line B1-B2 in FIG. 5(A).

The display device 10A illustrated in FIG. 5(A) includes a display portion 71 and a driver circuit 78. An FPC 74 is connected to the display device 10A.

The display device 10A is a top-emission display device employing a color filter method.

As illustrated in FIG. 5(B), the display device 10A includes a substrate 361, an insulating layer 367, transistors 301 and 303, a wiring 307, an insulating layer 314, the light-emitting element 110W, the light-emitting element 110R, the light-emitting element 110G, the light-emitting element 110B, the insulating layer 104, the protective layer 115, the semi-transmissive layer 116, the protective layer 121, the coloring layer CFR, the coloring layer CFG, the coloring layer CFB, an adhesive layer 318, the substrate 371, and the like.

Each of the light-emitting elements includes the pixel electrode 111, the EL layer 113, and the common electrode 114. The pixel electrode 111 is electrically connected to a source or a drain of the transistor 303. These are connected directly or connected through another conductive layer. The EL layer 113 and the common electrode 114 are each provided across a plurality of light-emitting elements.

Each of the light-emitting elements further includes an optical adjustment layer between the pixel electrode 111 and the EL layer 113. The light-emitting element 110W included in the subpixel which exhibits white light includes the optical adjustment layer 112W, and the light-emitting element 110R included in the subpixel which exhibits red light includes the optical adjustment layer 112R. FIG. 5(B) illustrates an example in which the thickness of the optical adjustment layer 112W is equal to that of the optical adjustment layer 112R. As described with reference to FIG. 1(D), in the light-emitting element 110W, part of the light 113EM from the EL layer 113 is reflected by the pixel electrode 111. In the light-emitting element 110W illustrated in FIG. 5(B), part of light emitted by the EL layer 113 is reflected by the pixel electrode 111, the intensity of red wavelength light is increased, and light is extracted through the common electrode 114. Accordingly, for example, in the case where light emitted by the EL layer 113 is white light with a high color temperature, light emitted by the light-emitting element 110W included in the subpixel which exhibits white light can become close to white light with a desired color temperature. Furthermore, the light-emitting element 110G included in the subpixel which exhibits green light includes the optical adjustment layer 112G, and the light-emitting element 110B included in the subpixel which exhibits blue light includes the optical adjustment layer 112B. FIG. 5(B) illustrates an example in which each optical adjustment layer covers a side surface of the pixel electrode 111.

The light-emitting element 110W, the light-emitting element 110R, the light-emitting element 110G, and the light-emitting element 110B are covered with the protective layer 115.

The light-emitting element 110R, the light-emitting element 110G, and the light-emitting element 110B each overlap with the semi-transmissive layer 116 with the protective layer 115 positioned therebetween. The semi-transmissive layer 116 does not overlap with the light-emitting region of the light-emitting element 110W but overlaps with light-emitting regions of the light-emitting element 110R, the light-emitting element 110G, and the light-emitting element 110B.

The display device 10A illustrated in FIG. 5(A) and FIG. 5(B) includes the light-emitting elements to which a microcavity structure is applied in the subpixels which exhibit red, green, and blue light, and includes the light-emitting element to which a microcavity structure is not applied in the subpixel which exhibits white light. With this structure, the light extraction efficiency for both light with high color purity and white light can be increased; therefore, a display device with high display quality and low power consumption can be achieved.

The insulating layer 104 covers the end portion of the pixel electrode 111 and end portions of the optical adjustment layers. Two adjacent pixel electrodes 111 are electrically insulated from each other by the insulating layer 104.

The protective layer 115 is provided over the light-emitting elements, covers an end portion of the common electrode 114, and is in contact with the insulating layer 104 and an insulating layer 313 on the outside of the end portion of the common electrode 114. Thus, entry of impurities into the transistors and the light-emitting elements can be suppressed. In particular, an inorganic film having a high barrier property (or an inorganic insulating film) is preferably used as the protective layer 115 and the insulating layer 313. Furthermore, an inorganic insulating film having a high barrier property is preferably used also as the insulating layer 104. Stacking inorganic films (or inorganic insulating films) so that they are in contact with each other at an end portion of the display device and in the vicinity thereof makes it difficult for impurities to enter from the outside, suppressing deterioration of the transistors and the light-emitting elements.

The substrate 361 and the substrate 371 are attached to each other with the adhesive layer 318. A space formed by the substrate 361, the substrate 371, and the adhesive layer 318 is preferably filled with a resin or an inert gas such as nitrogen or argon.

For the substrate 361 and the substrate 371, a material such as glass, quartz, a resin, a metal, an alloy, or a semiconductor can be used. The substrate 371 on the side where light from the light-emitting elements is extracted is formed using a material that transmits the light. Flexible substrates are preferably used as the substrate 361 and the substrate 371.

For the adhesive layer, various curable adhesives, e.g., a photocurable adhesive such as an ultraviolet curable adhesive, a reactive curable adhesive, a thermosetting adhesive, and an anaerobic adhesive, can be used. Alternatively, an adhesive sheet or the like may be used.

The driver circuit 78 includes the transistor 301. The display portion 71 includes the transistor 303.

Each transistor includes a gate, a gate insulating layer 311, a semiconductor layer, a back gate, a source, and a drain. The gate (the lower gate) and the semiconductor layer overlap with each other with the gate insulating layer 311 therebetween. The back gate (the upper gate) and the semiconductor layer overlap with each other with an insulating layer 312 and the insulating layer 313 therebetween. It is preferable that the two gates be electrically connected to each other.

The structure of the transistor may be different between the driver circuit 78 and the display portion 71. The driver circuit 78 and the display region 71 may each include a plurality of kinds of transistors.

The transistors, the wirings, and the like are provided to overlap with the light-emitting regions of the light-emitting elements, whereby an aperture ratio of the display portion 71 can be increased.

A material through which impurities such as water or hydrogen do not easily diffuse is preferably used for at least one of the insulating layer 312, the insulating layer 313, and the insulating layer 314. Diffusion of impurities from the outside into the transistors can be effectively inhibited, leading to improved reliability of the display device. The insulating layer 314 functions as a planarization layer.

The insulating layer 367 has a function of a base film. For the insulating layer 367, a material through which impurities such as water or hydrogen do not easily diffuse is preferably used.

The connection portion 306 includes the wiring 307. The wiring 307 can be formed using the same material and the same step as those of the source and the drain of the transistor. The wiring 307 is electrically connected to an external input terminal through which a signal or a potential from the outside is transmitted to the driver circuit 78. Here, an example in which the FPC 74 is provided as an external input terminal is shown. The FPC 74 and the wiring 307 are electrically connected to each other through a connector 319.

As the connector 319, any of various anisotropic conductive films (ACF), anisotropic conductive pastes (ACP), and the like can be used.

Figure 6A:
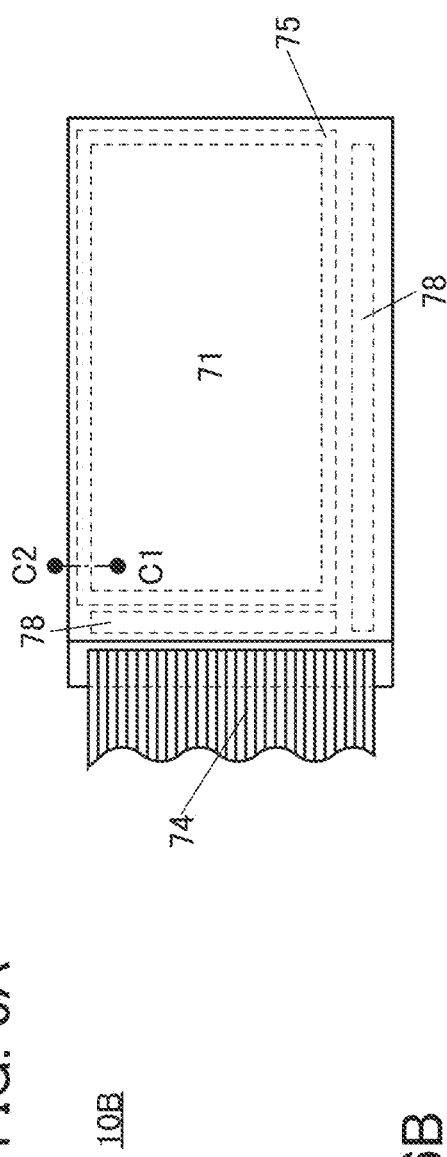
FIG. 6(A) is a top view illustrating an example of a display device.
Figure 6B:
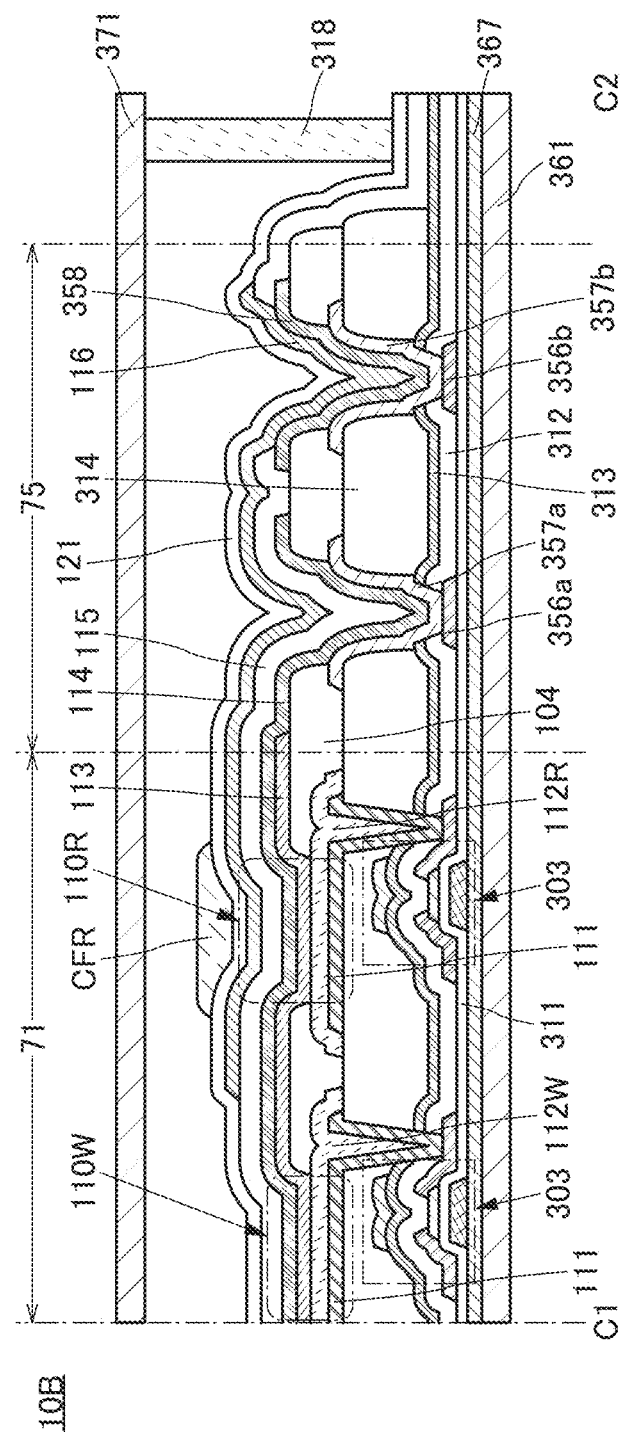
FIG. 6(B) is a cross-sectional view illustrating an example of a display device.

FIG. 6(A) shows a top view of a display device 10B. FIG. 6(B) is a cross-sectional view taken along a dashed-dotted line C1-C2 in FIG. 6(A).

The display device 10B illustrated in FIG. 6(A) includes the display portion 71, a connection portion 75, and the driver circuit 78. The FPC 74 is connected to the display device 10B.

The display portion 71 of the display device 10B has a structure similar to that of the display portion 71 of the display device 10A. A structure of the connection portion 75 is described in detail below.

The connection portion 75 illustrated in FIG. 6(A) and FIG. 6(B) is provided outside the display portion 71. The connection portion 75 is preferably provided so as to surround four sides of the display portion 71. The connection portion 75 includes a portion where the common electrode 114 is electrically connected to a conductive layer 357a and a conductive layer 356a and a portion where the semi-transmissive layer 116 is electrically connected to a conductive layer 358, a conductive layer 357b, and a conductive layer 356b. In the connection portion 75, the insulating layer 104 has an opening on the outside of an end portion of the EL layer 113; in the opening, the common electrode 114 is connected to the conductive layer 357a. In addition, the protective layer 115 has an opening on the outside of the end portion of the common electrode 114; in the opening, the semi-transmissive layer 116 is connected to the conductive layer 358. That is, in the connection portion 75, the portion where the semi-transmissive layer 116 is electrically connected to the conductive layer 358, the conductive layer 357b, and the conductive layer 356b is provided outside the portion where the common electrode 114 is electrically connected to the conductive layer 357a and the conductive layer 356a.

The conductive layers 356a and 356b can be formed using the same material and the same process as those of the source and the drain of the transistor. The conductive layers 357a and 357b can be formed using the same material and the same process as those of the pixel electrode 111. The conductive layer 358 can be formed using the same material and the same process as those of the common electrode 114.

Thus, the conductive layer formed using the same material and the same process as those of the conductive layer of the transistor or the light-emitting element is electrically connected to the common electrode 114; consequently, a voltage drop due to the resistance of the common electrode 114 can be inhibited and display unevenness of the display device can be suppressed.

Furthermore, the conductive layer formed using the same material and the same process as those of the conductive layer of the transistor or the light-emitting element is electrically connected to the semi-transmissive layer 116; consequently, a constant potential can be supplied to the semi-transmissive layer 116 and therefore the semi-transmissive layer 116 can serve as a shield for blocking noise. This allows the transistor to operate stably. In the case where a touch sensor is provided over the transistor with the semi-transmissive layer 116 positioned therebetween, both the transistor and the touch sensor can operate stably.

The same potential or different potentials may be applied to the common electrode 114 and the semi-transmissive layer 116. The common electrode 114 and the semi-transmissive layer 116 may be electrically connected to each other.

It is preferable that the same potential be applied to the common electrode 114 and the semi-transmissive layer 116 because a power supply circuit can be shared.

Figure 7:
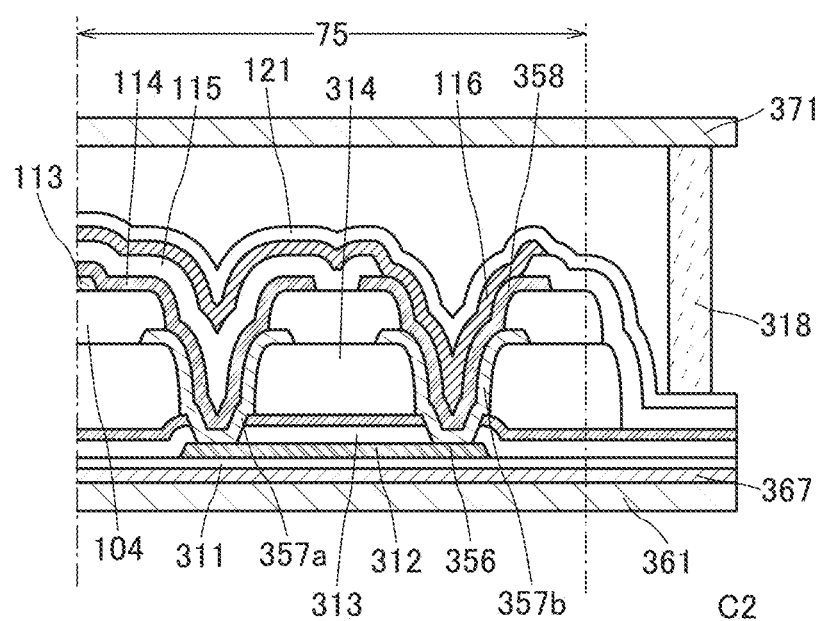
FIG. 7 is a cross-sectional view illustrating an example of a display device.

As illustrated in FIG. 7, the common electrode 114 and the semi-transmissive layer 116 may be electrically connected to the same conductive layer. The connection portion 75 illustrated in FIG. 7 is different from the connection portion 75 illustrated in FIG. 6(B) in not including the conductive layers 356a and 356b and in including a conductive layer 356.

Figure 8:
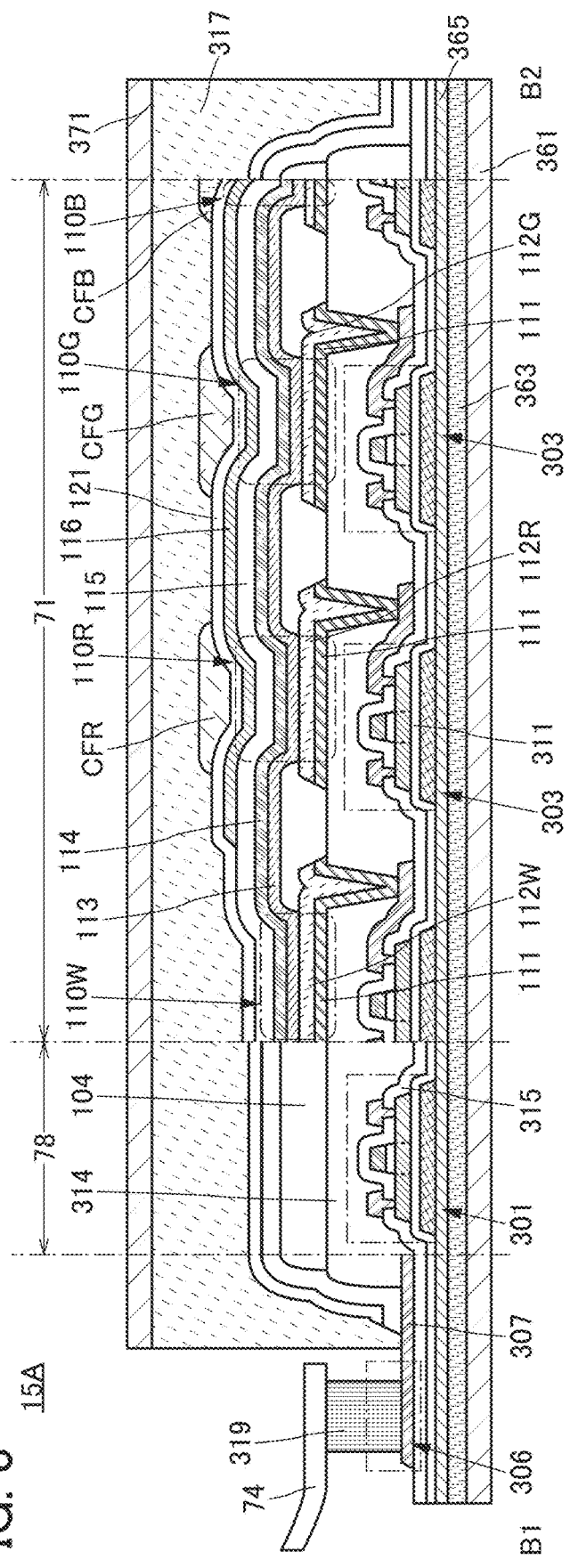
FIG. 8 is a cross-sectional view illustrating an example of a display device.

FIG. 8 shows a cross-sectional view of a display device 15A. The top view of the display device 15A is similar to that of the display device 10A illustrated in FIG. 5(A). FIG. 8 corresponds to a cross-sectional view taken along a dashed-dotted line B1-B2 in FIG. 5(A). Note that portions similar to those of the display device 10A will not be described in some cases.

The display device 15A illustrated in FIG. 8 includes the substrate 361, an adhesive layer 363, an insulating layer 365, the transistors 301 and 303, the wiring 307, the insulating layer 314, the light-emitting element 110W, the light-emitting element 110R, the light-emitting element 110G, the light-emitting element 110B, the insulating layer 104, the protective layer 115, the semi-transmissive layer 116, the protective layer 121, the coloring layer CFR, the coloring layer CFG, the coloring layer CFB, the adhesive layer 317, the substrate 371, and the like.

Each of the light-emitting elements includes the pixel electrode 111, an optical adjustment layer, the EL layer 113, and the common electrode 114. The optical adjustment layer illustrated in FIG. 8 is different from that in FIG. 5(B) in not covering a side surface of the end portion of the pixel electrode 111. Each of the light-emitting elements is covered with the protective layer 115.

The light-emitting element 110R, the light-emitting element 110G, and the light-emitting element 110B each overlap with the semi-transmissive layer 116 with the protective layer 115 positioned therebetween. The semi-transmissive layer 116 does not overlap with the light-emitting region of the light-emitting element 110W but overlaps with light-emitting regions of the light-emitting element 110R, the light-emitting element 110G, and the light-emitting element 110B.

The display device 15A illustrated in FIG. 8 includes the light-emitting elements to which a microcavity structure is applied in the subpixels which exhibit red, green, and blue light, and includes the light-emitting element to which a microcavity structure is not applied in the subpixel which exhibits white light. With this structure, the light extraction efficiency for both light with high color purity and white light can be increased; therefore, a display device with high display quality and low power consumption can be achieved.

The substrate 361 and the substrate 371 are attached to each other with the adhesive layer 317. The substrate 361 and the insulating layer 365 are attached to each other with the adhesive layer 363.

The display panel 15A has a structure in which the transistors, the light-emitting elements, and the like formed over a formation substrate are transferred to the substrate 361. The substrate 361 and the substrate 371 are preferably flexible. This leads to higher flexibility of the display device 15A.

The display device 15A is different from the display device 10A in the structure of the transistors 301 and 303.

The transistors 301 and 303 illustrated in FIG. 8 include a back gate, the gate insulating layer 311, a semiconductor layer, another gate insulating layer, a gate, an insulating layer 315, a source, and a drain. The semiconductor layer includes a channel formation region and a pair of low-resistance regions. The back gate (the lower gate) and the channel formation region overlap with each other with the gate insulating layer 311 positioned therebetween. The gate (the upper gate) and the channel formation region overlap with each other with the gate insulating layer positioned therebetween. The source and the drain are electrically connected to the low-resistance regions through openings provided in the insulating layer 315.

[Touch Panel]

In one embodiment of the present invention, a display device provided with a touch sensor (hereinafter also referred to as a touch panel) can be manufactured. Structure examples of a touch panel are described with reference to FIG. 9 to FIG. 11.

There is no particular limitation on a detection element (also referred to as a sensor element) included in the touch panel of one embodiment of the present invention. A variety of sensors that can sense proximity or touch of a sensing target such as a finger or a stylus can be used as the detection element.

For example, a variety of types such as a capacitive type, a resistive type, a surface acoustic wave type, an infrared type, an optical type, and a pressure-sensitive type can be used as the type of the sensor.

In this embodiment, a touch panel including a capacitive detection element will be described as an example.

Examples of the capacitive type include a surface capacitive type and a projected capacitive type. Examples of the projected capacitive type include a self-capacitive type and a mutual capacitive type. The use of a mutual capacitive type is preferable because multiple points can be sensed simultaneously.

The touch panel of one embodiment of the present invention can have a variety of structures, including a structure in which a display device and a detection element that are separately formed are attached to each other and a structure in which electrodes and the like included in a detection element are provided on one or both of a substrate supporting a light-emitting element and a counter substrate.

Figure 9A:
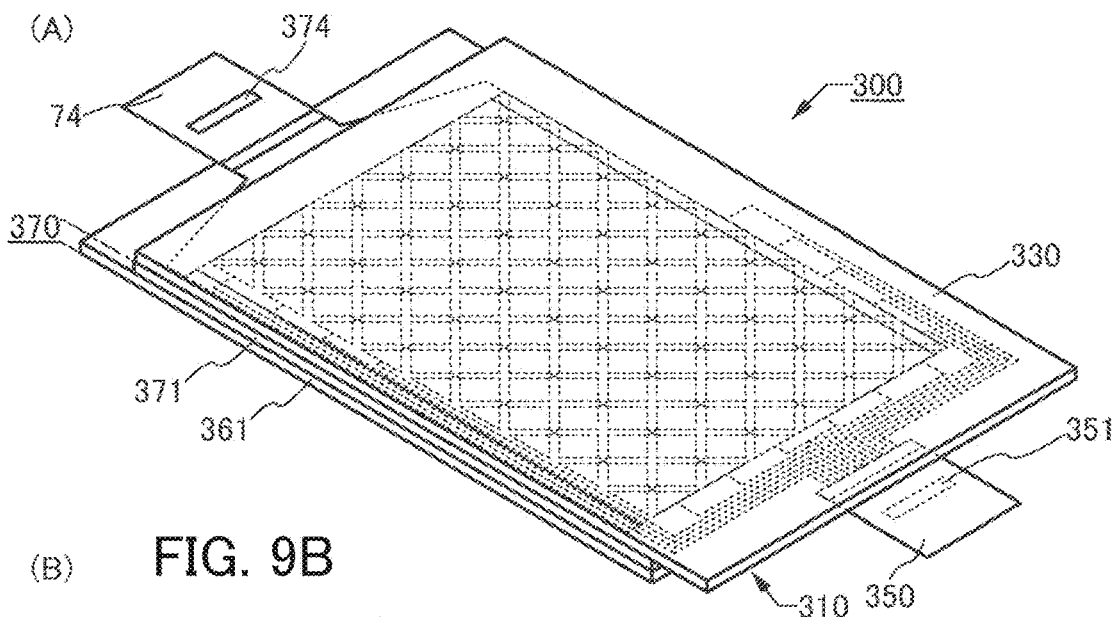
FIG. 9(A) and FIG. 9(B) are perspective views illustrating an example of a touch panel.
Figure 9B:
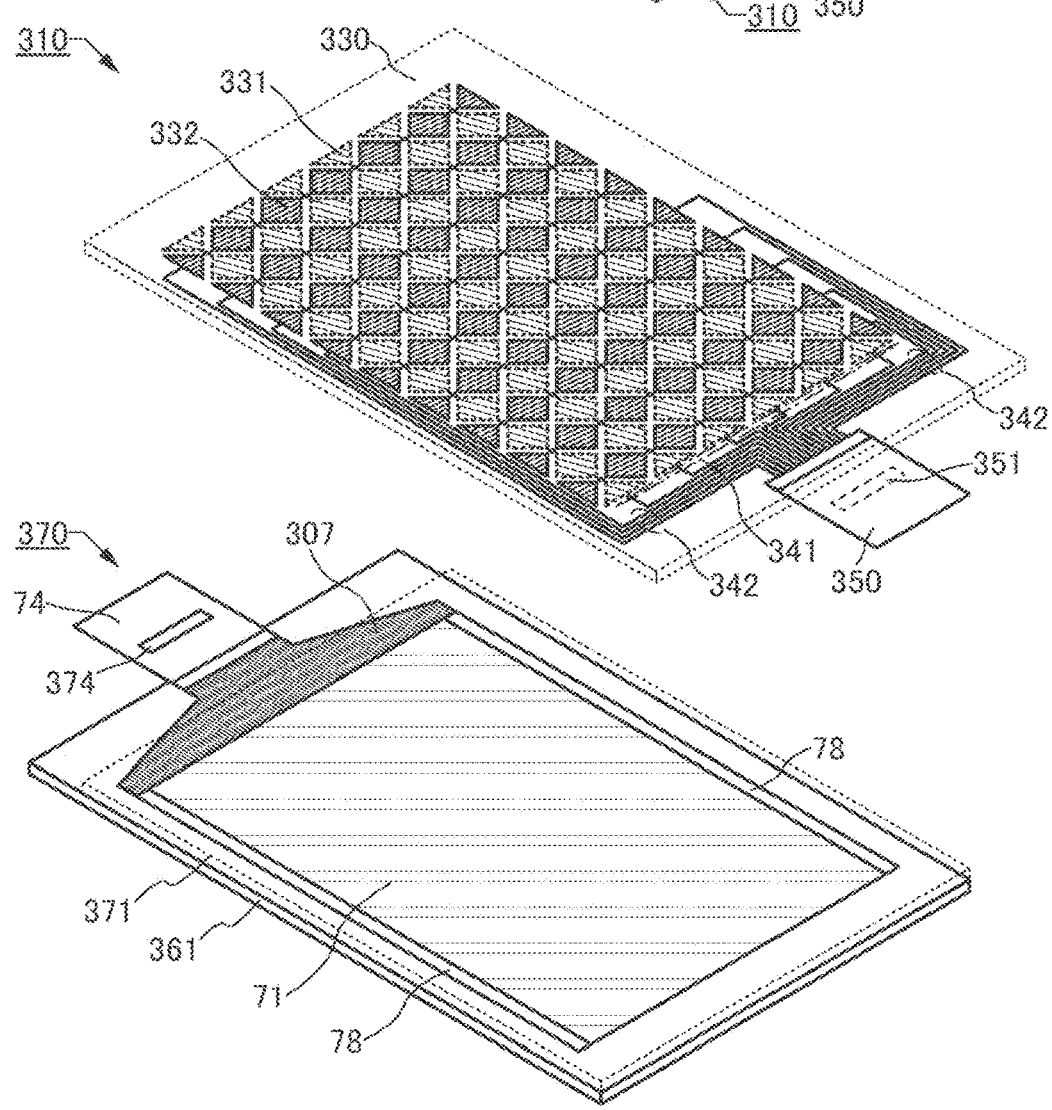

FIG. 9(A) is a schematic perspective view of a touch panel 300. FIG. 9(B) is a schematic perspective view obtained by developing FIG. 9(A). Note that only typical components are illustrated for simplicity. In FIG. 9(B), some components (such as a substrate 330 and the substrate 371) are clearly illustrated only in dashed outline.

The touch panel 300 includes an input device 310 and a display device 370, which are provided to overlap with each other.

The input device 310 includes the substrate 330, an electrode 331, an electrode 332, a plurality of wirings 341, and a plurality of wirings 342. An FPC 350 is electrically connected to each of the plurality of wirings 341 and the plurality of wirings 342. The FPC 350 is provided with an IC 351.

The display device 370 includes the substrate 361 and the substrate 371 provided to face each other. The display device 370 includes the display portion 71 and the driver circuit 78. The wiring 307 and the like are provided over the substrate 361. The FPC 74 is electrically connected to the wiring 307. The FPC 74 is provided with an IC 374.

The wiring 307 has a function of supplying a signal or electric power to the display portion 71 or the driver circuit 78. The signal or electric power are input to the wiring 307 from the outside or the IC 374 through the FPC 74.

Figure 10:
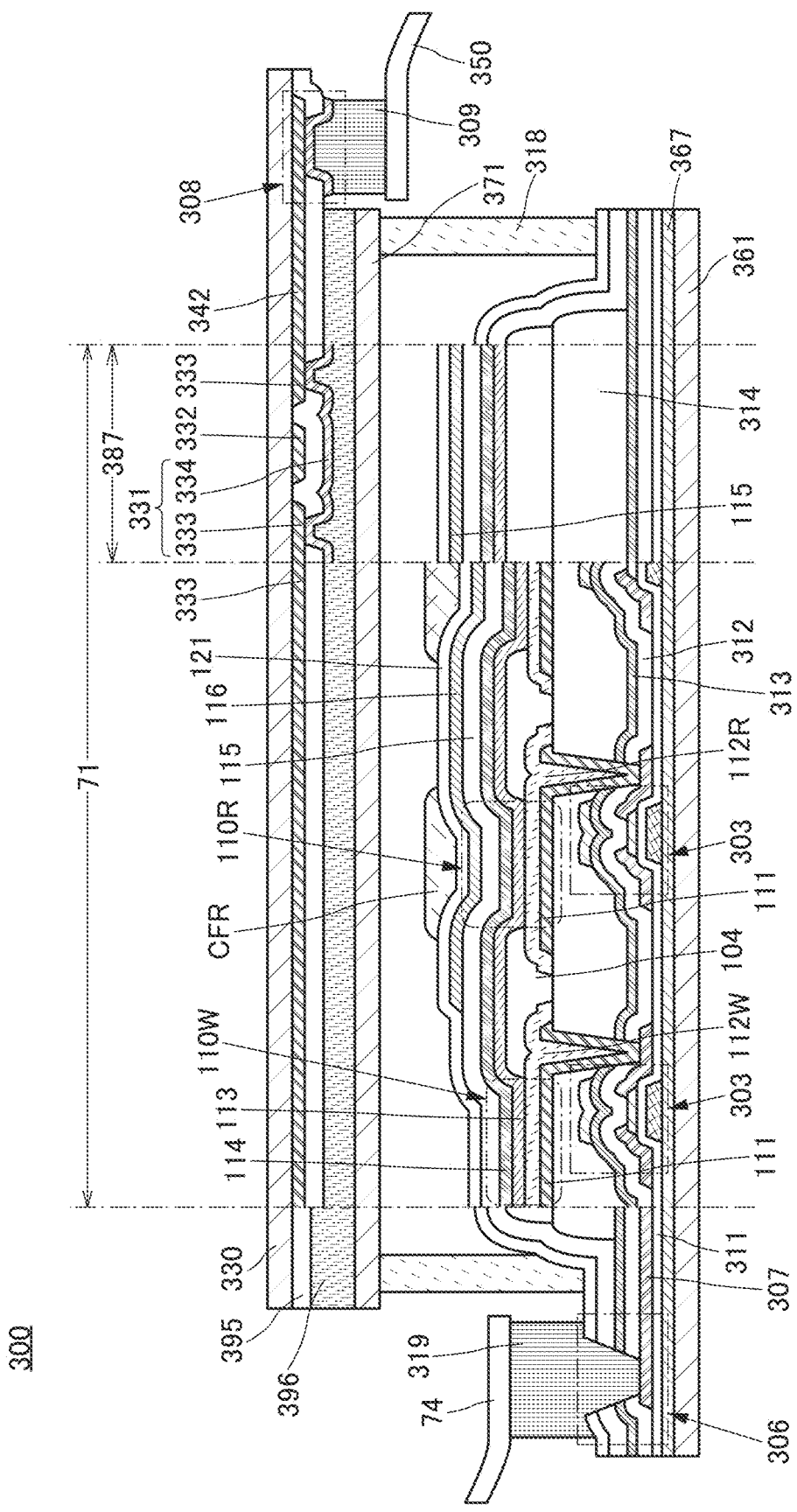
FIG. 10 is a cross-sectional view illustrating an example of a touch panel.

FIG. 10 shows an example of a cross-sectional view of the touch panel 300. FIG. 10 shows cross-sectional structures of the display portion 71, the region including the FPC 74, the region including the FPC 350, and the like. FIG. 10 illustrates a cross-sectional structure of a crossing portion 387 where the electrode 331 and the electrode 332 of the touch sensor included in the display portion 71 cross each other.

The substrate 361 and the substrate 371 are attached to each other with the adhesive layer 318. The substrate 371 and the substrate 330 are attached to each other with an adhesive layer 396. Here, the layers from the substrate 361 to the substrate 371 correspond to the display device 370. Furthermore, the layers from the substrate 330 to an electrode 334 correspond to the input device 310. In other words, the adhesive layer 396 attaches the display device 370 and the input device 310 to each other. Alternatively, the layers from the substrate 330 to the substrate 371 can be regarded as the input device 310; in this view, the adhesive layer 318 attaches the display device 370 and the input device 310 to each other.

The structure of the display device 370 illustrated in FIG. 10 is a structure similar to that of the display device 10A illustrated in FIG. 5(B); thus, the detailed description is omitted.

The details of the input device 310 will be described. On the substrate 371 side of the substrate 330, the electrode 331 and the electrode 332 are provided. An example where the electrode 331 includes an electrode 333 and the electrode 334 is described here. As illustrated in the crossing portion 387 in FIG. 10, the electrode 332 and the electrode 333 are formed on the same plane. An insulating layer 395 is provided to cover the electrode 332 and the electrode 333. The electrode 334 is electrically connected to two electrodes 333, between which the electrode 332 is provided, through openings formed in the insulating layer 395. In a region near an end portion of the substrate 330, a connection portion 308 is provided. The connection portion 308 has a stack of the wiring 342 and a conductive layer formed by processing the same conductive layer as the electrode 334. The connection portion 308 is electrically connected to the FPC 350 through a connector 309.

Here, in the display portion 71, the semi-transmissive layer 116 is provided between the transistor 303 included in the display device 370 and the electrodes 331 and 332 included in the input device 310. A constant potential is preferably supplied to the semi-transmissive layer 116. Thus, the semi-transmissive layer 116 serves as a shield for blocking noise, and the transistors and the touch sensor can operate stably.

As illustrated in FIG. 11(A), FIG. 11(B), FIG. 12(A), and FIG. 12(B), a touch sensor may be directly formed over a light-emitting element to form a touch panel.

Figure 11A:
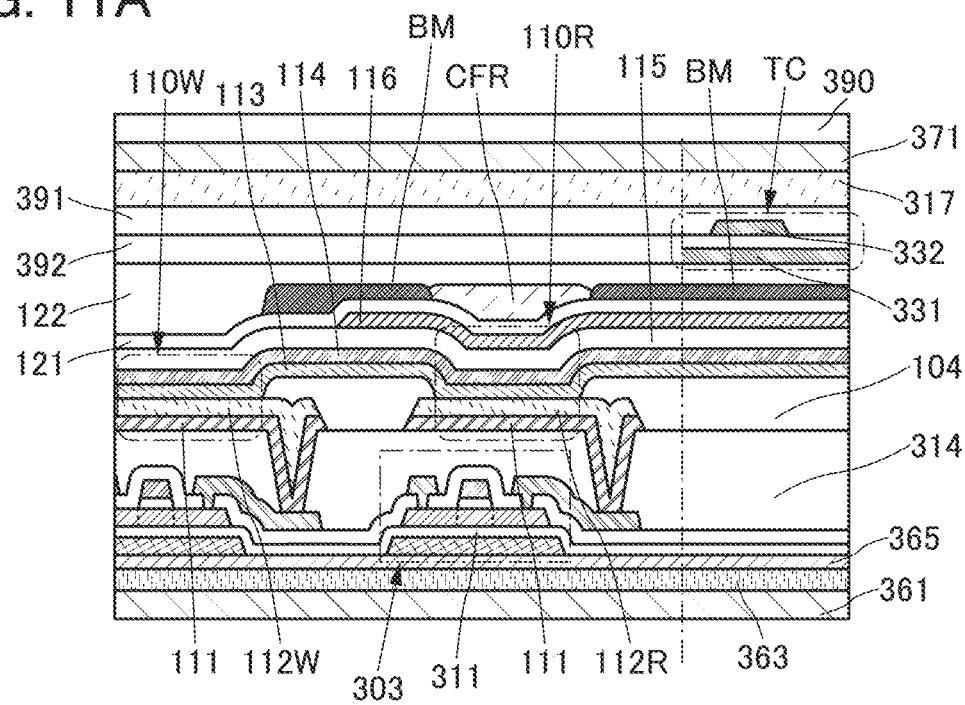
FIG. 11(A) and FIG. 11(B) are cross-sectional views illustrating examples of a touch panel.

In FIG. 11(A), the substrate 361 and the insulating layer 365 are attached to each other with the adhesive layer 363, and the transistor 303 is provided over the insulating layer 365. The insulating layer 314 is provided over the transistor 303, and the pixel electrode 111 is provided over the insulating layer 314. The source or the drain of the transistor 303 is electrically connected to the pixel electrode 111 through an opening of the insulating layer 314. An optical adjustment layer is provided over the pixel electrode 111, and the insulating layer 104 is provided so as to cover end portions of the pixel electrode 111 and the optical adjustment layer. The EL layer 113 is provided over the optical adjustment layer and the insulating layer 104, the common electrode 114 is provided over the EL layer 113, and the protective layer 115 is provided over the common electrode 114. The semi-transmissive layer 116 is provided over the protective layer 115. The protective layer 121 is provided over the protective layer 115 and the semi-transmissive layer 116, and the light-blocking layer BM and the coloring layer CFR are provided over the protective layer 121. The planarization layer 122 is provided over the protective layer 121, the light-blocking layer BM, and the coloring layer CFR, and a detection element TC is provided over the planarization layer 122. The detection element TC includes the electrode 331 over the planarization layer 122, an insulating layer 392 over the electrode 331, and the electrode 332 over the insulating layer 392. An insulating layer 391 is provided over the detection element TC, and the insulating layer 391 and the substrate 371 are attached to each other with the adhesive layer 317. A circular polarizing plate 390 is provided over the substrate 371. Note that without provision of the substrate 371, the insulating layer 391 and the circular polarizing plate 390 may be directly attached to each other with the adhesive layer 317.

Since the display device of this embodiment includes the protective layer 115 (and the protective layer 121) having a high barrier property over and in contact with the light-emitting elements, a variety of components can be directly formed over the light-emitting elements. FIG. 11(A) illustrates an example in which a coloring layer, the light-blocking layer BM, and the detection element TC are provided over a light-emitting element. Formation of a touch sensor over the light-emitting element enables reductions in the thickness and weight of the display device as compared with the structure where a separately formed touch sensor is attached to the display device. Thus, the flexibility of the display device can be enhanced, and reductions in the thickness and weight of an electronic device into which the display device is incorporated can be achieved.

Out of the conductive layers included in the input device 310 illustrated in FIG. 9 and FIG. 10, the conductive layer overlapping with the light-emitting region of the light-emitting element (e.g., the electrodes 331 and 332) is formed using a material that transmits visible light.

Figure 11B:
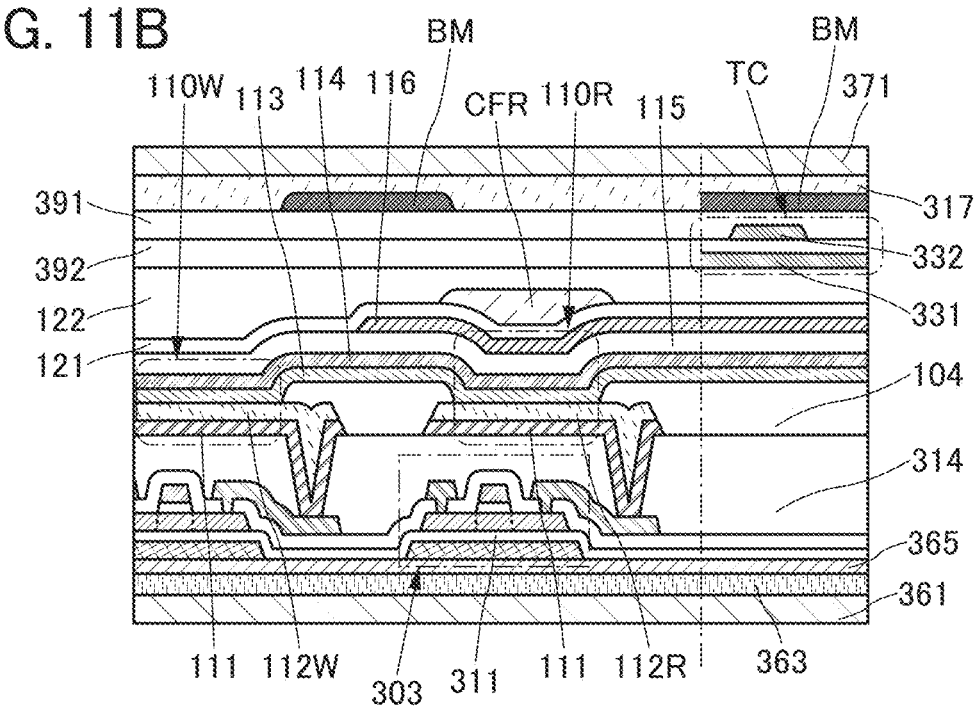

In the case where the electrodes 331 and 332 are provided in a position not overlapping with the light-emitting region of the light-emitting element as in the detection element TC illustrated in FIG. 11(A) and FIG. 11(B), a material that blocks visible light can be used as the electrodes 331 and 332. Thus, a material with low resistivity, such as a metal, can be used as the electrodes 331 and 332. For example, a metal mesh is preferably used for the wiring and the electrode of the touch sensor. Accordingly, the resistance of the wiring and the electrode of the touch sensor can be reduced. This is preferable for a touch sensor of a large-sized display device. Note that although a metal is generally a material having a high reflectance, a metal can be darkened by being subjected to oxidation treatment or the like. Thus, even when the display device is seen from the display surface side, a decrease in visibility due to the reflection of external light can be suppressed.

The wiring and the electrode may be formed to have a stacked layer of a metal layer and a layer having low reflectance (also referred to as a "dark-colored layer"). Examples of the dark-colored layer include a layer containing copper oxide and a layer containing copper chloride or tellurium chloride. Alternatively, the dark-colored layer may be formed using a metal particle such as an Ag particle, an Ag fiber, or a Cu particle, a carbon nanoparticle such as a carbon nanotube (CNT) or graphene, a conductive high molecule such as PEDOT, polyaniline, or polypyrrole, or the like.

Furthermore, the provided circular polarizing plate 390 can prevent the electrodes 331 and 332 from being seen by the user. Alternatively, the light-blocking layer BM may be provided on the display surface side than the electrodes 331 and 332 so that the electrodes 331 and 332 can be prevented from being seen by the user. FIG. 11(B) illustrates an example where the light-blocking layer BM is included not over the protective layer 121 but over the insulating layer 391.

Figure 12A:
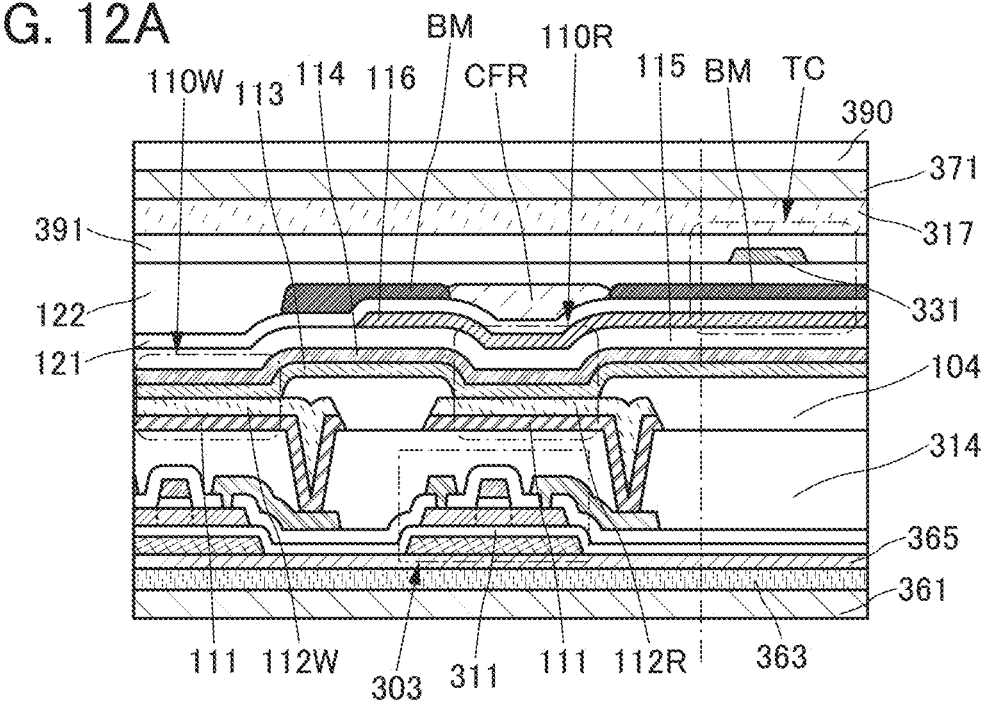
FIG. 12(A) and FIG. 12(B) are cross-sectional views illustrating examples of a touch panel.
Figure 12B:
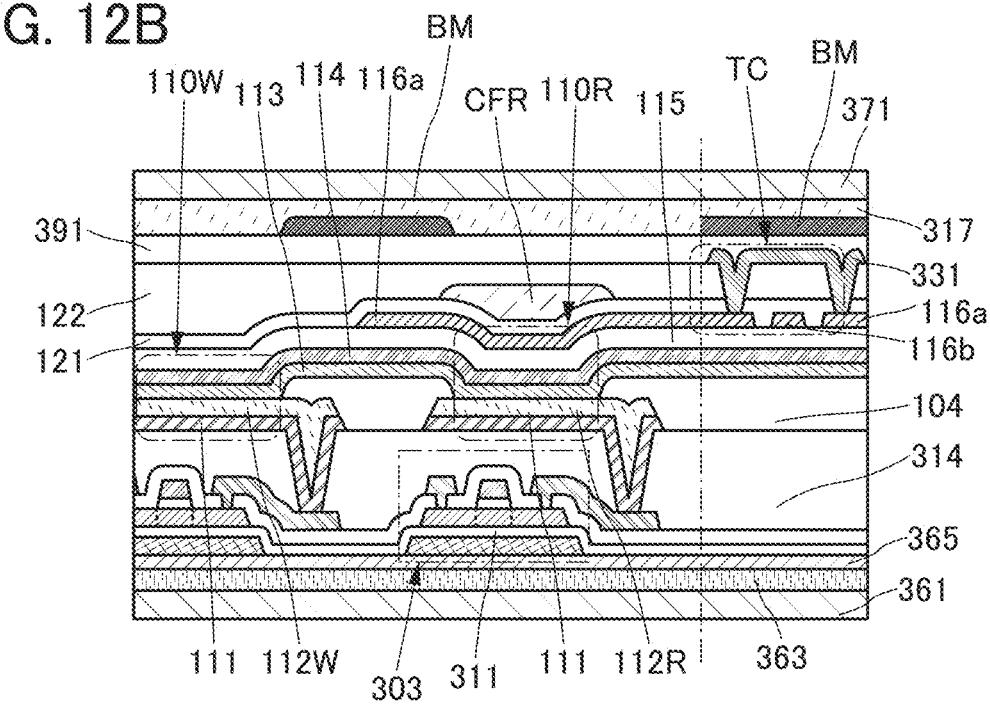

As illustrated in FIG. 12(A) and FIG. 12(B), the semi-transmissive layer 116 may be used as an electrode of the touch sensor. FIG. 12(A) illustrates an example where the semi-transmissive layer 116 and the electrode 331 that is over the planarization layer 122 are used as the pair of electrodes of the detection element TC. Furthermore, FIG. 12(B) illustrates an example where the semi-transmissive layer 116a and the semi-transmissive layer 116b are used as the pair of electrodes of the detection element TC.

The layered structure from the substrate 361 to the planarization layer 122 and the layered structure from the insulating layer 391 to the substrate 371 in the cross-sectional structure illustrated in FIG. 12(A) are similar to those in the cross-sectional structure illustrated in FIG. 11(A), respectively. Note that an insulating material is used for the light-blocking layer BM. The electrode 331 is provided over the planarization layer 122, and the insulating layer 391 is provided over the electrode 331.

The layered structure from the substrate 361 to the protective layer 115 and the layered structure from the insulating layer 391 to the substrate 371 in the cross-sectional structure illustrated in FIG. 12(B) are similar to those in the cross-sectional structure illustrated in FIG. 11(B), respectively. The semi-transmissive layers 116a and 116b are provided over the protective layer 115. The protective layer 121 is provided over the semi-transmissive layers 116a and 116b. The coloring layer CFR is provided over the protective layer 121, and the planarization layer 122 is provided over the coloring layer CFR. Openings that reach the semi-transmissive layers 116a are provided in the protective layer 121 and the planarization layer 122, and the electrode 331 is provided so as to cover the openings. The two semi-transmissive layers 116a are electrically connected to each other through the electrode 331. The insulating layer 391 is provided over the electrode 331.

When the semi-transmissive layer also serves as the electrode of the detection element TC as illustrated in FIG. 12(A) and FIG. 12(B), the manufacturing process of the detection element TC can be simplified, which is preferable. Furthermore, the touch panel can be made thin.

In the case where the semi-transmissive layer is used as the electrode of the touch sensor, a structure in which a pulse potential is supplied to the semi-transmissive layer, a structure in which the semi-transmissive layer is electrically connected to a detection circuit (sense amplifier), or the like can be used.

Although the semi-transmissive layer is used as the electrode of the capacitive touch sensor in FIG. 12(A) and FIG. 12(B), the type of the sensor is not limited to this. For example, the semi-transmissive layer may be used as the electrode of the resistive touch sensor.

[Transistor]

Next, a transistor that can be used in the display device is described.

There is no particular limitation on a structure of the transistor included in the display device. For example, a planar transistor may be employed, a staggered transistor may be employed, or an inverted staggered transistor may be employed. The transistor structure may be either a top-gate structure or a bottom-gate structure. Alternatively, a gate electrode may be provided above and below a channel.

Figure 13A:
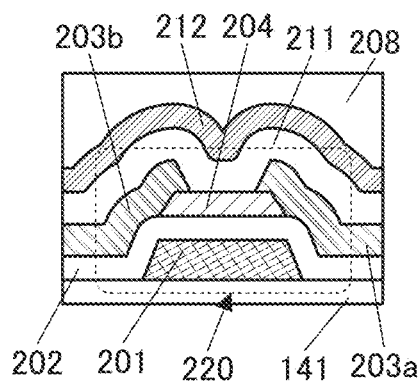
FIG. 13(A) and FIG. 13(B) are cross-sectional views illustrating examples of a transistor.
Figure 13B:
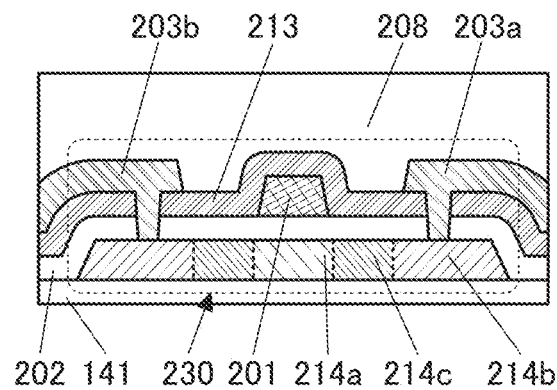

FIG. 13(A) and FIG. 13(B) each illustrate a structure example of a transistor. Each transistor is provided between an insulating layer 141 and an insulating layer 208. The insulating layer 141 preferably has a function of a base film. The insulating layer 208 preferably has a function of a planarization film.

A transistor 220 illustrated in FIG. 13(A) is a transistor having a bottom-gate structure, which includes a metal oxide in a semiconductor layer 204. The metal oxide can function as an oxide semiconductor.

An oxide semiconductor is preferably used as a semiconductor of the transistor. Using a semiconductor material having a wider band gap and a lower carrier density than silicon is preferable because an off-state current of the transistor can be reduced.

The transistor 220 includes a conductive layer 201, an insulating layer 202, a conductive layer 203a, a conductive layer 203b, and the semiconductor layer 204. The conductive layer 201 functions as a gate. The insulating layer 202 functions as a gate insulating layer. The semiconductor layer 204 overlaps with the conductive layer 201 with the insulating layer 202 therebetween. The conductive layer 203a and the conductive layer 203b are each electrically connected to the semiconductor layer 204. The transistor 220 is preferably covered with an insulating layer 211 and an insulating layer 212. Any of a variety of inorganic insulating films can be used as the insulating layer 211 and the insulating layer 212. In particular, an oxide insulating film is suitable for the insulating layer 211, and a nitride insulating film is suitable for the insulating layer 212.

A transistor 230 illustrated in FIG. 13(B) is a transistor having a top-gate structure, which includes polysilicon in a semiconductor layer.

The transistor 230 includes the conductive layer 201, the insulating layer 202, the conductive layer 203a, the conductive layer 203b, the semiconductor layer, and an insulating layer 213. The conductive layer 201 functions as a gate. The insulating layer 202 functions as a gate insulating layer. The semiconductor layer includes a channel formation region 214a and a pair of low-resistance regions 214b. The semiconductor layer may further include an LDD (Lightly Doped Drain) region. In FIG. 13(B), an example in which an LDD region 214c is provided between the channel formation region 214a and the low-resistance region 214b is shown. The channel formation region 214a overlaps with the conductive layer 201 with the insulating layer 202 therebetween. The conductive layer 203a is electrically connected to one of the pair of low-resistance regions 214b through an opening provided in the insulating layer 202 and the insulating layer 213. In a similar manner, the conductive layer 203b is electrically connected to the other of the pair of low-resistance regions 214b. Any of a variety of inorganic insulating films can be used as the insulating layer 213. In particular, a nitride insulating film is suitable for the insulating layer 213.

[Metal Oxide]

A metal oxide functioning as an oxide semiconductor is preferably used for the semiconductor layer. A metal oxide that can be used for the semiconductor layer will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) or CAC (Cloud-Aligned Composite) might be stated. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters) in some cases.

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

Note that examples of a material that can be used for any of a variety of conductive layers forming the display device include metals such as aluminum, titanium, chromium, nickel, copper, yttrium, zirconium, molybdenum, silver, tantalum, or tungsten or an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Furthermore, copper containing manganese is preferably used because it increases controllability of a shape by etching.

Note that examples of a material that can be used for any of a variety of insulating layers forming the display device include a resin such as acrylic, epoxy, and silicone, and an inorganic insulating material such as silicon oxide, silicon oxynitride, silicon nitride oxide, silicon nitride, or aluminum oxide.

As described above, the display device of this embodiment includes both a light-emitting element to which a microcavity structure is applied and a light-emitting element to which a microcavity structure is not applied. With this structure, light extraction efficiency for both light with high color purity and white light can be increased. Therefore, a display device with high display quality and low power consumption can be achieved.

This embodiment can be combined with the other embodiments and the example as appropriate. In this specification, in the case where a plurality of structure examples are shown in one embodiment, the structure examples can be combined as appropriate.

Embodiment 2

In this embodiment, display devices of embodiments of the present invention are described with reference to FIG. 14 to FIG. 18.

Figure 14:
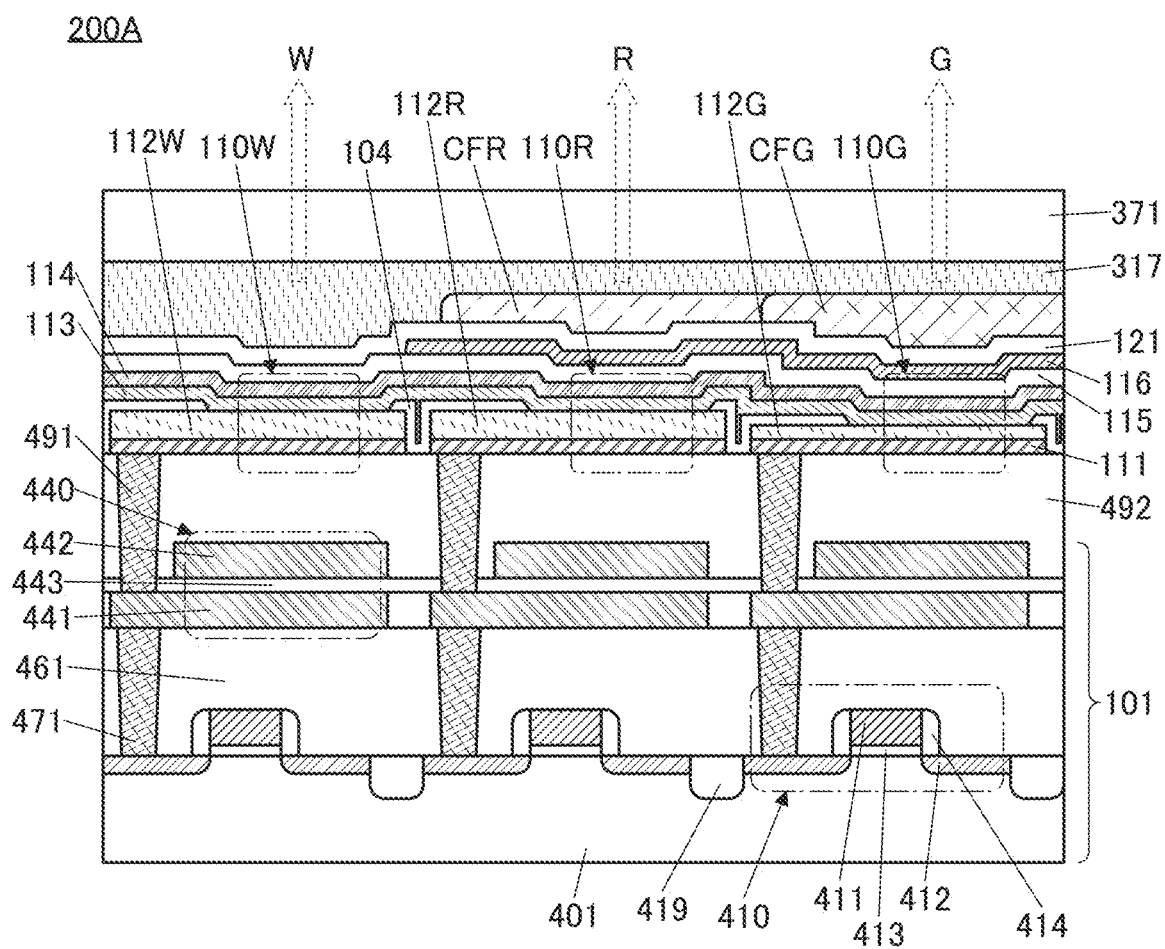
FIG. 14 is a cross-sectional view illustrating an example of a display device.

FIG. 14 shows a cross-sectional view of a display device 200A.

The display device 200A includes the light-emitting element 110W, the light-emitting element 110R, the light-emitting element 110G, a capacitor 440, a transistor 410, and the like.

The structures of the light-emitting element 110W, the light-emitting element 110R, and the light-emitting element 110G are similar to those in FIG. 4(A); thus, detailed description thereof is omitted. Note that in this embodiment, an example in which an inorganic insulating film is used for the insulating layer 104 is described. The coloring layer CFR overlapping with the light-emitting region of the light-emitting element 110R and the coloring layer CFG overlapping with the light-emitting region of the light-emitting element 110G are provided over the protective layer 121.

The display device of this embodiment includes both a light-emitting element to which a microcavity structure is applied and a light-emitting element to which a microcavity structure is not applied. With this structure, light extraction efficiency for both light with high color purity and white light can be increased. Therefore, a display device with high display quality and low power consumption can be achieved.

In this embodiment, the substrate 101 is a substrate provided with a semiconductor circuit which functions as a circuit for driving a light-emitting element (also referred to as a pixel circuit) or a driver circuit for driving the pixel circuit (one or both of a gate driver and a source driver).

The transistor 410 is a transistor including a channel formation region in a substrate 401. As the substrate 401, a semiconductor substrate such as a single crystal silicon substrate can be used, for example. The transistor 410 includes part of the substrate 401, a conductive layer 411, a pair of low-resistance regions 412, an insulating layer 413, an insulating layer 414, and the like. The conductive layer 411 functions as a gate electrode. The insulating layer 413 is positioned between the substrate 401 and the conductive layer 411 and functions as a gate insulating layer. The pair of low-resistance regions 412 are regions doped with an impurity in the substrate 401 and function as the source and the drain. The insulating layer 414 is provided to cover a side surface of the conductive layer 411. The transistors 410 are electrically isolated from each other by an element isolation region 419.

An insulating layer 461 is provided to cover the transistor 410, and the capacitor 440 is provided over the insulating layer 461.

The capacitor 440 includes a conductive layer 441, a conductive layer 442, and an insulating layer 443 positioned therebetween. The conductive layer 441 functions as one electrode of the capacitor 440, the conductive layer 442 functions as the other electrode of the capacitor 440, and the insulating layer 443 functions as a dielectric of the capacitor 440.

The conductive layer 441 is provided over the insulating layer 461 and is electrically connected to one of a source and a drain of the transistor 410 with a plug 471 embedded in the insulating layer 461. The insulating layer 443 is provided to cover the conductive layer 441. The conductive layer 442 is provided in a region overlapping with the conductive layer 441 with the insulating layer 443 positioned therebetween.

An insulating layer 492 is provided to cover the capacitor 440, and the light-emitting element 110W, the light-emitting element 110R, the light-emitting element 110G, and the like are provided over the insulating layer 492.

The display device 200A includes the substrate 371 on the viewing side. The substrate 371 and the substrate 401 are attached to each other with the adhesive layer 317. As the substrate 371, a substrate having a transmitting property with respect to visible light, such as a glass substrate, a quartz substrate, a sapphire substrate, or a plastic substrate can be used.

With this structure, a display device with extremely high resolution and high display quality can be achieved.

Figure 15:
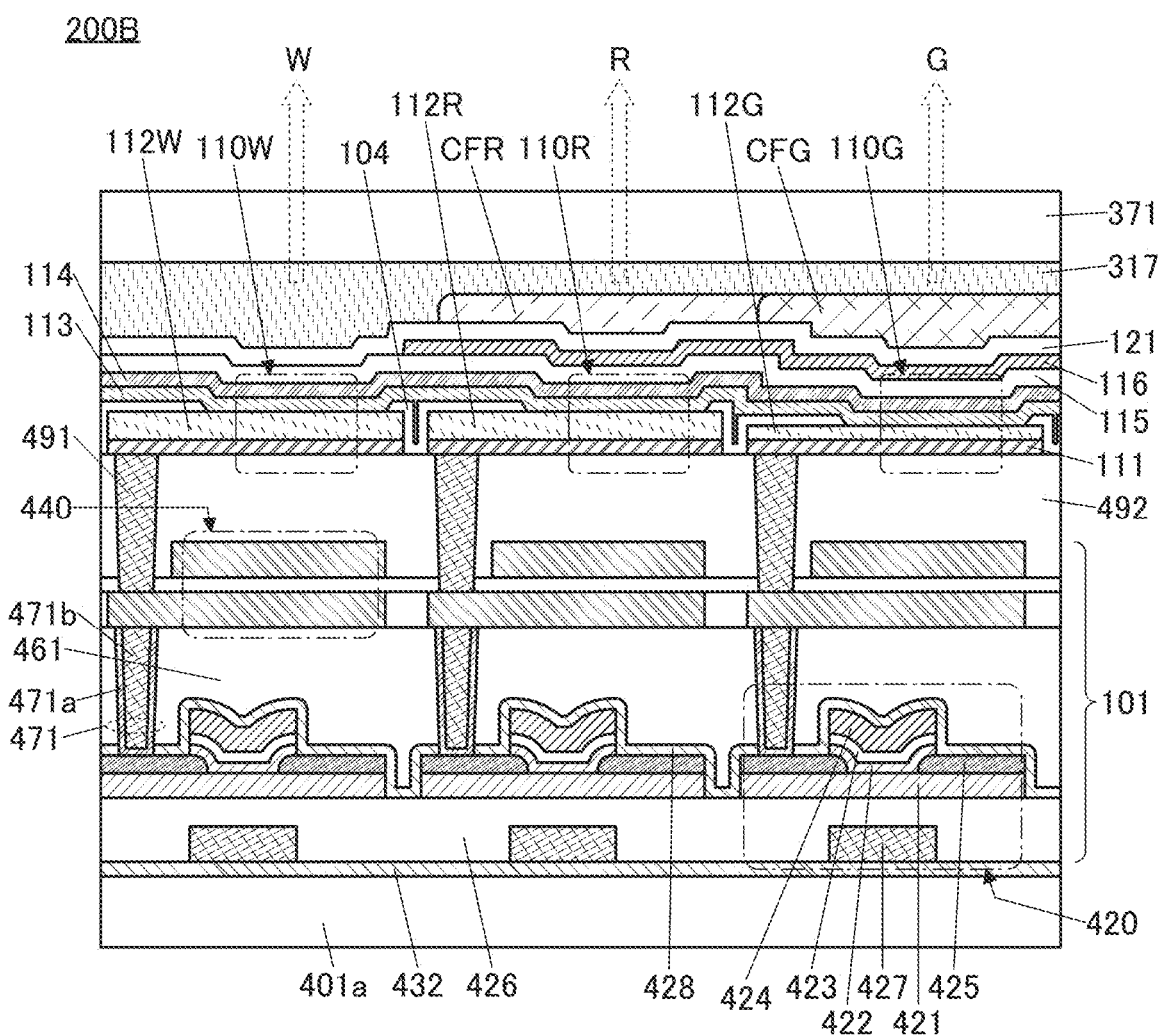
FIG. 15 is a cross-sectional view illustrating an example of a display device.

FIG. 15 shows a cross-sectional view of a display device 200B.

The display device 200B is different from the display device 200A illustrated in FIG. 14 in not including the transistor 410 but including a transistor 420 and in that the plug 471 includes conductive layers 471a and 471b.

The transistor 420 is a transistor including a metal oxide in its channel formation region. The metal oxide can serve as an oxide semiconductor.

The transistor 420 includes a semiconductor layer 421, a metal oxide layer 422, an insulating layer 423, a conductive layer 424, conductive layers 425, an insulating layer 426, a conductive layer 427, and the like.

As a substrate 401a over which the transistor 420 is provided, an insulating substrate or a semiconductor substrate can be used.

An insulating layer 432 is provided over the substrate 401a. The insulating layer 432 functions as a barrier layer which prevents diffusion of impurities such as water or hydrogen from the substrate 401a to the transistor 420 and release of oxygen from the semiconductor layer 421 to the insulating layer 432 side. As the insulating layer 432, a film in which hydrogen or oxygen is less likely to be diffused than in a silicon oxide film, such as an aluminum oxide film, a hafnium oxide film, and a silicon nitride film, can be used, for example.

The conductive layer 427 is provided over the insulating layer 432, and the insulating layer 426 is provided to cover the conductive layer 427. The conductive layer 427 functions as a first gate electrode of the transistor 420, and part of the insulating layer 426 functions as a first gate insulating layer. For at least a portion in contact with the semiconductor layer 421 of the insulating layer 426, an oxide insulating film such as a silicon oxide film is preferably used. A top surface of the insulating layer 426 is preferably planarized.

The semiconductor layer 421 is provided over the insulating layer 426. The semiconductor layer 421 preferably includes a metal oxide having semiconductor characteristics (also referred to as an oxide semiconductor).

The pair of conductive layers 425 are provided over and in contact with the semiconductor layer 421 and function as a source electrode and a drain electrode. The metal oxide layer 422 is provided to cover a top surface of the semiconductor layer 421 between the pair of conductive layers 425. The metal oxide layer 422 preferably includes a metal oxide that can be used for the semiconductor layer 421. The insulating layer 423 functioning as a second gate insulating layer and the conductive layer 424 functioning as a second gate electrode are stacked over the metal oxide layer 422.

Furthermore, an insulating layer 428 is provided to cover the transistor 420, and the insulating layer 461 is provided over the insulating layer 428. The insulating layer 428 functions as a barrier layer which prevents diffusion of impurities such as water or hydrogen from the insulating layer 461 or the like to the transistor 420 and release of oxygen from the semiconductor layer 421 to the insulating layer 428 side. As the insulating layer 428, an insulating film that is similar to the insulating layer 432 can be used.

The plug 471 electrically connected to the conductive layer 425 is provided so as to be embedded in the insulating layer 461. Here, the plug 471 preferably includes the conductive layer 471*a* which covers a side surface of an opening of the insulating layer 461 and part of a top surface of the conductive layer 425 and the conductive layer 471*b* which is in contact with a top surface of the conductive layer 471*a*. At this time, a conductive material in which hydrogen and oxygen are unlikely to be diffused is preferably used for the conductive layer 471*a*.

Figure 16:
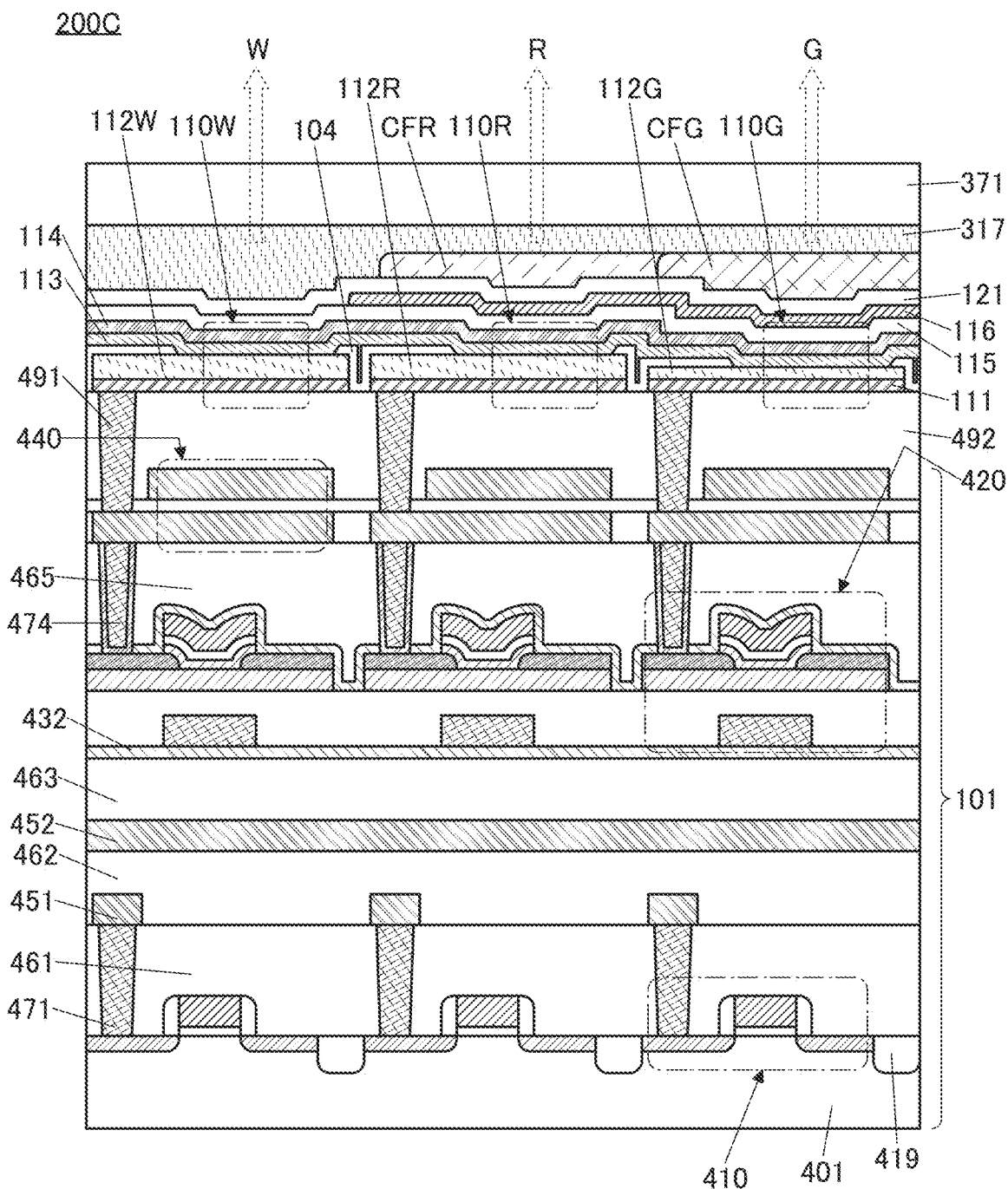
FIG. 16 is a cross-sectional view illustrating an example of a display device.

FIG. 16 shows a cross-sectional view of a display device 200C.

The display device 200C has a stack of the transistor 410 having its channel formation region in the substrate 401 and the transistor 420 having a channel formation region including a metal oxide.

The insulating layer 461 is provided to cover the transistor 410, and a conductive layer 451 is provided over the insulating layer 461. Furthermore, an insulating layer 462 is provided to cover the conductive layer 451, and a conductive layer 452 is provided over the insulating layer 462. The conductive layer 451 and the conductive layer 452 each function as a wiring. An insulating layer 463 and the insulating layer 432 are provided to cover the conductive layer 452, and the transistor 420 is provided over the insulating layer 432. Furthermore, an insulating layer 465 is provided to cover the transistor 420, and the capacitor 440 is provided over the insulating layer 465. The capacitor 440 and the transistor 420 are electrically connected to each other by a plug 474.

The transistor 420 can be used as a transistor which is included in a pixel circuit. The transistor 410 can be used as a transistor included in a pixel circuit or a transistor included in a driver circuit (one or both of a gate driver and a source driver) for driving the pixel circuit. The transistor 410 and the transistor 420 can be used as transistors included in a variety of circuits such as an arithmetic circuit and a memory circuit.

With such a structure, not only the pixel circuit but also the driver circuit or the like can be formed directly under the light-emitting elements; thus, the display device can be downsized as compared with the case where the driver circuit is provided outside a display portion. In addition, the display device can have a narrow frame (narrow non-display region).

Figure 17:
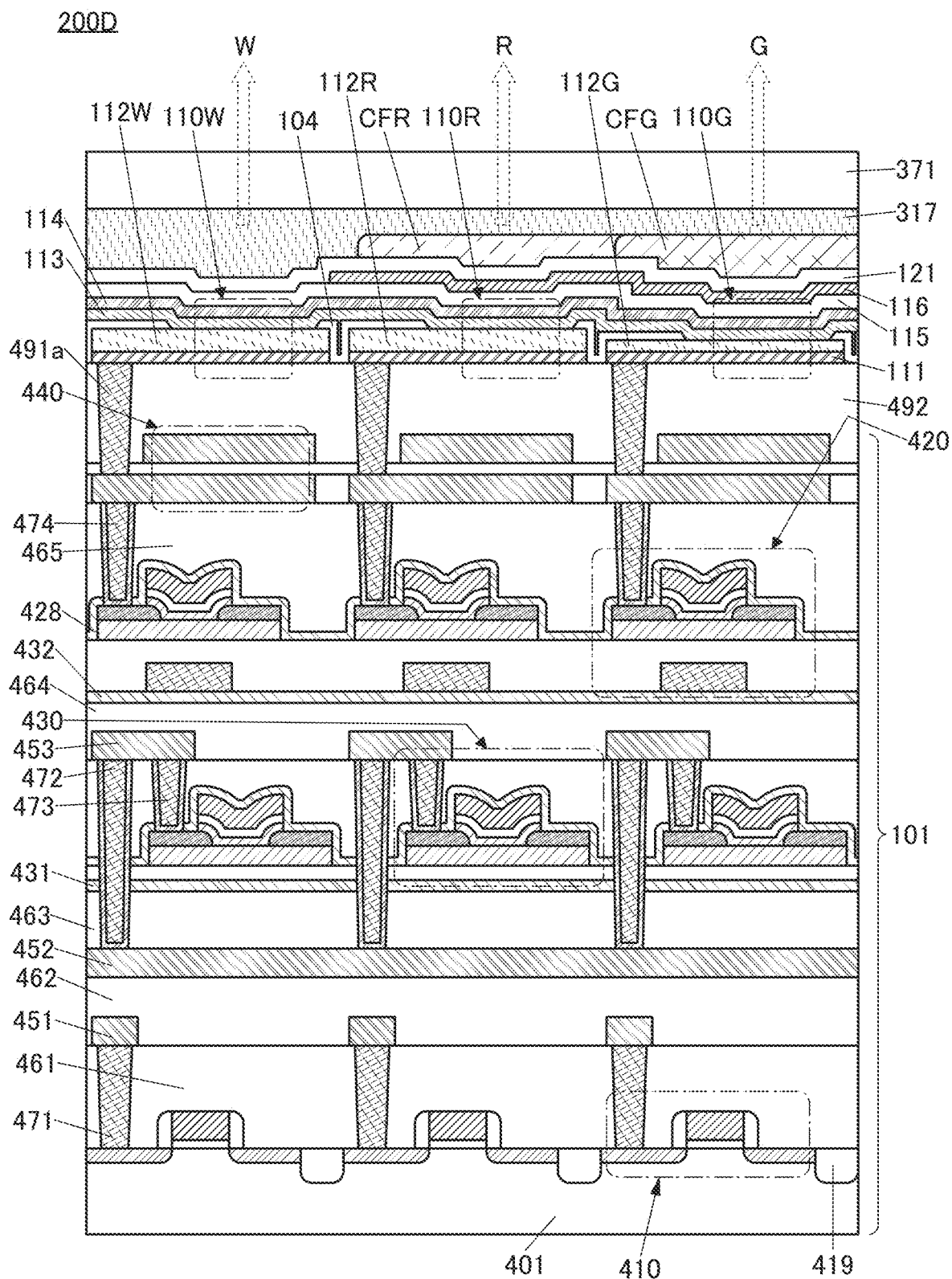
FIG. 17 is a cross-sectional view illustrating an example of a display device.

FIG. 17 shows a cross-sectional view of a display device 200D.

The display device 200D includes a stack of the transistor 410 having its channel formation region in the substrate 401, a transistor 430 having a channel formation region including a metal oxide, and the transistor 420 having a channel formation region including a metal oxide. In other words, the display device 200D is different from the display device 200C in that two transistors each having a channel formation region including a metal oxide are stacked.

The transistor 430 has a structure similar to that of the transistor 420 except that the first gate electrode is not included. Note that the transistor 430 may have a structure including the first gate electrode.

The insulating layer 463 and an insulating layer 431 are provided to cover the conductive layer 452, and the transistor 430 is provided over the insulating layer 431. The transistor 430 and the conductive layer 452 are electrically connected to each other through a plug 473, a conductive layer 453, and a plug 472. Furthermore, an insulating layer 464 and the insulating layer 432 are provided to cover the conductive layer 453, and the transistor 420 is provided over the insulating layer 432.

For example, the transistor 420 functions as a transistor that controls a current flowing through the light-emitting element. The transistor 430 functions as a selection transistor that controls a selection state of the pixel. The transistor 410 functions as a transistor or the like included in a driver circuit for driving the pixel.

When three or more transistors are stacked in this manner, the area occupied by pixels can be reduced; accordingly, a high-resolution display device can be achieved.

Figure 18A:
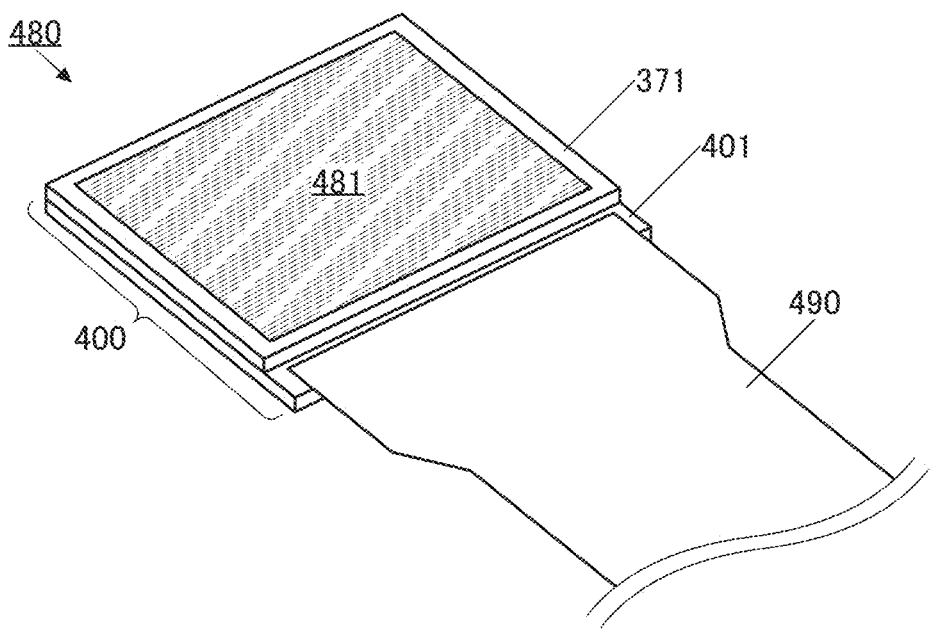
FIG. 18(A) and FIG. 18(B) are perspective views illustrating an example of a display device.
Figure 18B:
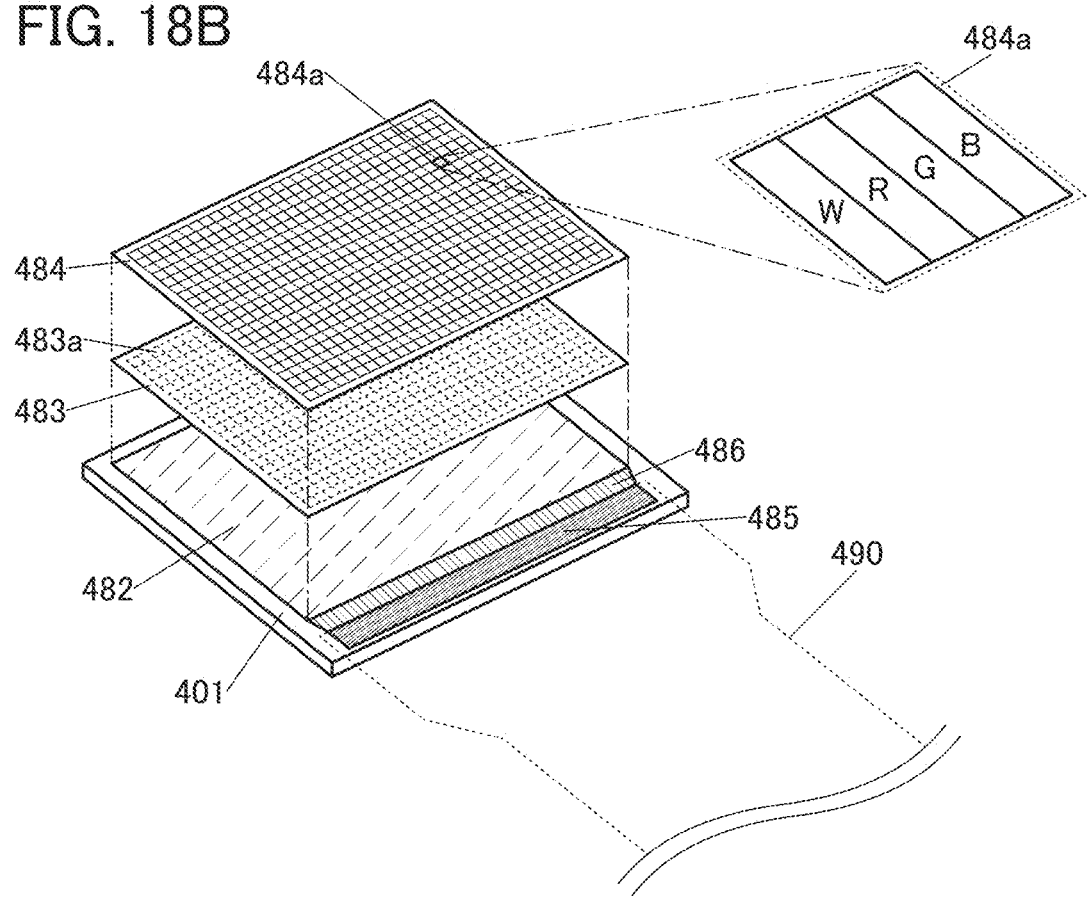

FIG. 18(A) and FIG. 18(B) illustrate perspective views of a display module.

A display module 480 illustrated in FIG. 18(A) includes a display device 400 and an FPC 490. As the display device 400, any of the display devices 200A to 200D illustrated in FIG. 14 to FIG. 17 can be used.

The display module 480 includes the substrate 401 and the substrate 371. The display module 480 includes a display portion 481.

FIG. 18(B) is a perspective view schematically illustrating a structure on the substrate 401 side. The display portion 481 has a structure in which a circuit portion 482, a pixel circuit portion 483, and a pixel portion 484 are stacked in this order over the substrate 401. Outside the display portion 481, a terminal portion 485 for connecting to the FPC 490 is provided over the substrate 401. The terminal portion 485 and the circuit portion 482 are electrically connected to each other with a wiring portion 486 formed of a plurality of wirings.

The pixel portion 484 includes a plurality of pixels 484*a* arranged in a matrix. An enlarged view of one pixel 484*a* is illustrated on the right side in FIG. 18(B). The pixel 484*a* includes subpixels of four colors, red (R), green (G), blue (B), and white (W).

The pixel circuit portion 483 includes a plurality of pixel circuits 483*a* arranged in a matrix. One pixel circuit 483*a* is a circuit that controls light emission of four subpixels included in one pixel 484*a*. One pixel circuit 483*a* may be provided with four circuits each of which controls light emission of one subpixel. For example, the pixel circuit 483*a* can include at least one selection transistor, one current control transistor (driving transistor), and a capacitor for one subpixel. A gate signal is input to a gate of the selection transistor, and a source signal is input to one of a source and a drain of the selection transistor. With such a structure, an active-matrix display device is achieved.

The circuit portion 482 includes a circuit for driving the pixel circuits 483*a* in the pixel circuit portion 483. For example, one or both of a gate driver and a source driver are preferably included. In addition, an arithmetic circuit, a memory circuit, a power supply circuit, or the like may be included.

The FPC 490 serves as a wiring for supplying a video signal or a power supply potential to the circuit portion 482 from the outside. An IC may be mounted on the FPC 490.

The display module 480 can have a structure in which the pixel circuit portion 483, the circuit portion 482, and the like are stacked below the pixel portion 484; thus, the aperture ratio (the effective display area ratio) of the display portion 481 can be significantly high. For example, the aperture ratio of the display portion 481 can be greater than or equal to 40% and less than 100%, preferably greater than or equal to 50% and less than or equal to 95%, and further preferably greater than or equal to 60% and less than or equal to 95%. Furthermore, the pixels 484a can be arranged extremely densely and thus the display portion 481 can have greatly high resolution. For example, the pixels 484a are preferably arranged in the display portion 481 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

The display module 480 with high resolution can be favorably used for a VR (virtual reality) device such as a head mounted display or a glasses-type AR (augmented reality) device. Even when the display module 480 with high resolution is used in a device with which a user sees a display portion through a lens, the pixels in the display portion enlarged by the lens are unlikely to be recognized by the user and display with high sense of immersion can be performed. The display module 480 can also be favorably used for an electronic device having a relatively small display portion. For example, the display module 480 can be favorably used in a display portion of a wearable electronic device, such as a smart watch.

This embodiment can be combined with the other embodiments as appropriate.

Embodiment 3

In this embodiment, a display device of one embodiment of the present invention is described with reference to FIG. 19 and FIG. 20.

Figure 19A:
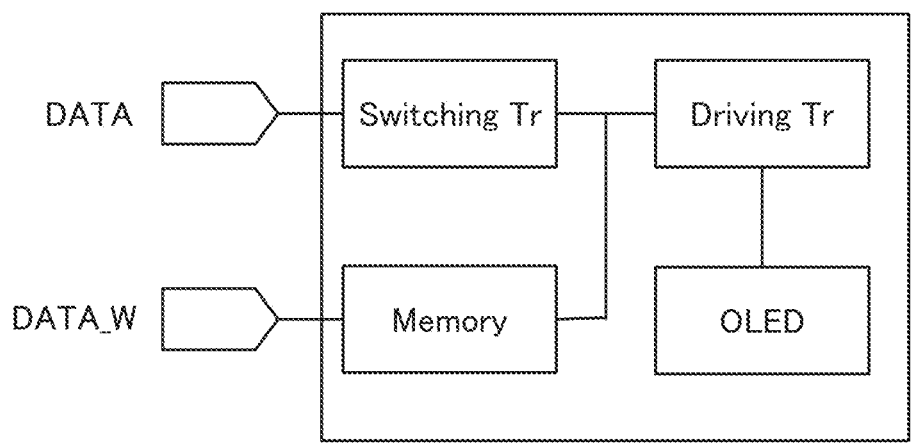
FIG. 19(A) is a block diagram illustrating an example of a pixel.

FIG. 19(A) is a block diagram of a pixel. A pixel of this embodiment includes a memory (Memory) in addition to a switching transistor (Switching Tr), a driving transistor (Driving Tr), and a light-emitting element (OLED).

Data DATA_W is supplied to the memory. When the data DATA_W is supplied to the pixel in addition to display data DATA, a current flowing through the light-emitting element is large, so that the display device can have high luminance.

When the potential of the data DATA_W is represented by $V_w$, the potential of the display data DATA is represented by $V_{data}$, and the capacitance of the memory is represented by $C_w$, the gate voltage $V_g$ of the driving transistor can be expressed by Formula (1).

[Formula 1]

$$V_g = V_w + \frac{c_w}{c_w + c_s} V_{data} \quad (1)$$

When $V_w$ equals to $V_{data}$, a voltage higher than $V_{data}$ is applied as $V_g$, and a larger current can flow. That is, the current flowing through the light-emitting element becomes large, and the luminance of the light-emitting element is increased.

Figure 19B:
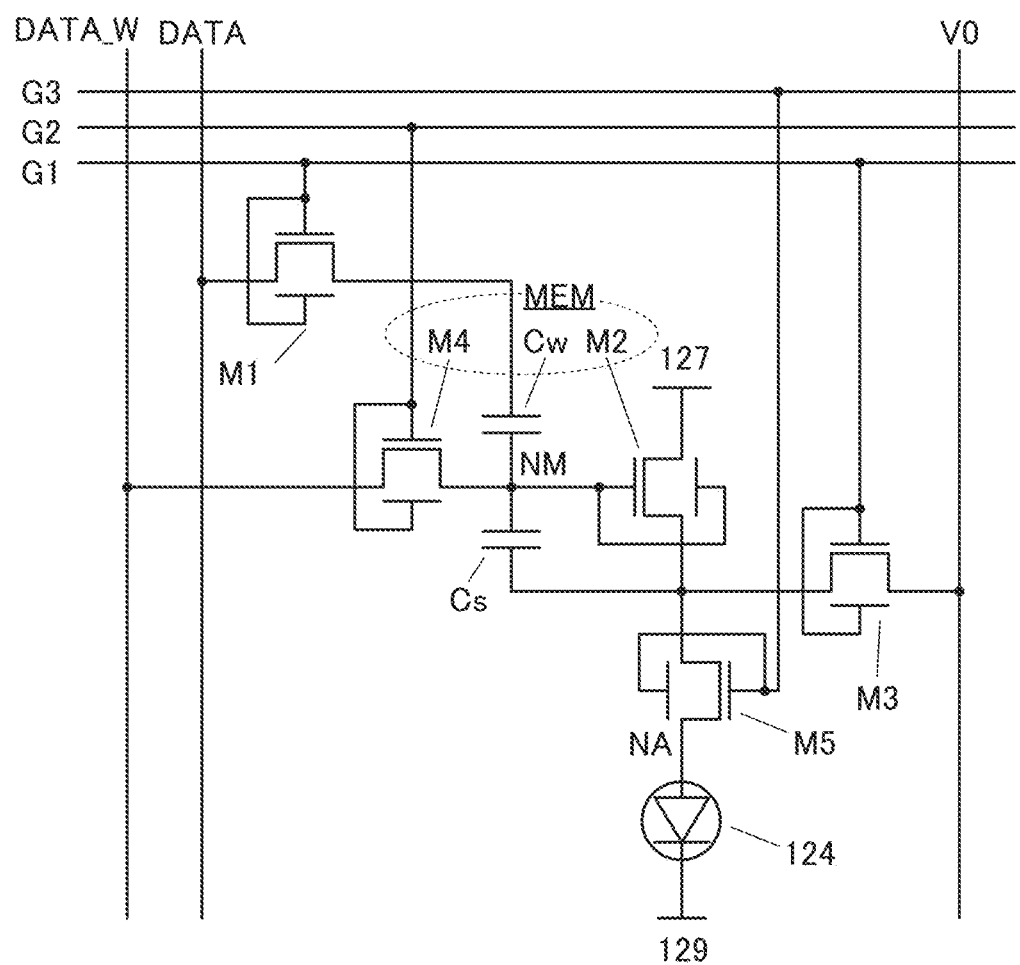
FIG. 19(B) is a view illustrating an example of a pixel.

FIG. 19(B) is a specific circuit diagram of the pixel.

The pixel illustrated in FIG. 19(B) includes a transistor M1, a transistor M2, a transistor M3, a transistor M4, a transistor M5, a capacitor Cs, a capacitor Cw, and a light-emitting element 124.

One of a source and a drain of the transistor M1 is electrically connected to one electrode of the capacitor Cw. The other electrode of the capacitor Cw is electrically connected to one of a source and a drain of the transistor M4. The one of the source and the drain of the transistor M4 is electrically connected to a gate of the transistor M2. The gate of the transistor M2 is electrically connected to one electrode of the capacitor Cs. The other electrode of the capacitor Cs is electrically connected to one of a source and a drain of the transistor M2. The one of the source and the drain of the transistor M2 is electrically connected to one of a source and a drain of the transistor M5. The one of the source and the drain of the transistor M5 is electrically connected to one of a source and a drain of the transistor M3. The other of the source and the drain of the transistor M5 is electrically connected to one electrode of the light-emitting element 124. The transistors illustrated in FIG. 19(B) each include a back gate electrically connected to its gate; however, the connection of the back gate is not limited thereto. The transistor does not necessarily include the back gate.

Here, a node to which the other electrode of the capacitor Cw, the one of the source and the drain of the transistor M4, the gate of the transistor M2, and the one electrode of the capacitor Cs are connected is referred to as a node NM. A node to which the other of the source and the drain of the transistor M5 and the one electrode of the light-emitting element 124 are connected is referred to as a node NA.

A gate of the transistor M1 is electrically connected to a wiring G1. A gate of the transistor M3 is electrically connected to the wiring G1. A gate of the transistor M4 is electrically connected to a wiring G2. A gate of the transistor M5 is electrically connected to a wiring G3. The other of the source and the drain of the transistor M1 is electrically connected to a wiring DATA. The other of the source and the drain of the transistor M3 is electrically connected to a wiring V0. The other of the source and the drain of the transistor M4 is electrically connected to a wiring DATA_W.

The other of the source and the drain of the transistor M2 is electrically connected to a power supply line 127 (high potential). The other electrode of the light-emitting element 124 is electrically connected to a common wiring 129. Note that a given potential can be supplied to the common wiring 129.

The wirings G1, G2, and G3 can function as signal lines for controlling the operation of the transistors. The wiring DATA can function as a signal line for supplying an image signal to the pixel. The wiring DATA_W can function as a signal line for writing data to a memory circuit MEM. The wiring DATA_W can function as a signal line for supplying a correction signal to the pixel. The wiring V0 functions as a monitor line for obtaining the electrical characteristics of the transistor M4. A specific potential is supplied from the wiring V0 to the one electrode of the capacitor Cs through the transistor M3, whereby writing of an image signal can be stable.

The memory circuit MEM is formed of the transistors M2, the transistor M4, and the capacitor Cw. The node NM is a storage node; when the transistor M4 is turned on, a signal supplied to the wiring DATA_W can be written to the node NM. The use of a transistor with an extremely low off-state current as the transistor M4 allows the potential of the node NM to be retained for a long time.

As the transistor M4, a transistor containing a metal oxide in its channel formation region (hereinafter referred to as an OS transistor) can be used, for example. Thus, the off-state current of the transistor M4 can be extremely low, and the potential of the node NM can be retained for a long time. In this case, an OS transistor is preferably used as the other transistors included in the pixel. For specific examples of the metal oxide, Embodiment 1 can be referred to.

An OS transistor exhibits ultralow off-state current characteristics because of a large energy gap. Unlike in a transistor in which Si is included in the channel formation region (hereinafter referred to as a Si transistor), impact ionization, avalanche breakdown, short-channel effects, and the like do not occur in an OS transistor; accordingly, a highly reliable circuit can be configured.

Furthermore, a Si transistor may be used as the transistor M4. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

One pixel may include both an OS transistor and a Si transistor.

In the pixel, the signal written to the node NM is capacitively coupled to the image signal supplied from the wiring DATA, and the resulting data can be output to the node NA. Note that the transistor M1 can have a function of selecting a pixel. The transistor M5 can function as a switch that controls light emission of the light-emitting element 124.

For example, when the signal written to the node NM from the wiring DATA_W is higher than the threshold voltage ($V_{th}$) of the transistor M2, the transistor M2 is turned on, and the light-emitting element 124 emits light before the image signal is written. For this reason, it is preferred that the transistor M5 be provided and that after the potential of the node NM is fixed, the transistor M5 be turned on so that the light-emitting element 124 emits light.

In other words, when an intended correction signal is stored in the node NM in advance, the correction signal can be added to the supplied image signal. Note that the correction signal is sometimes attenuated by a component on the transmission path; hence, the signal is preferably produced in consideration of the attenuation.

Figure 20A:
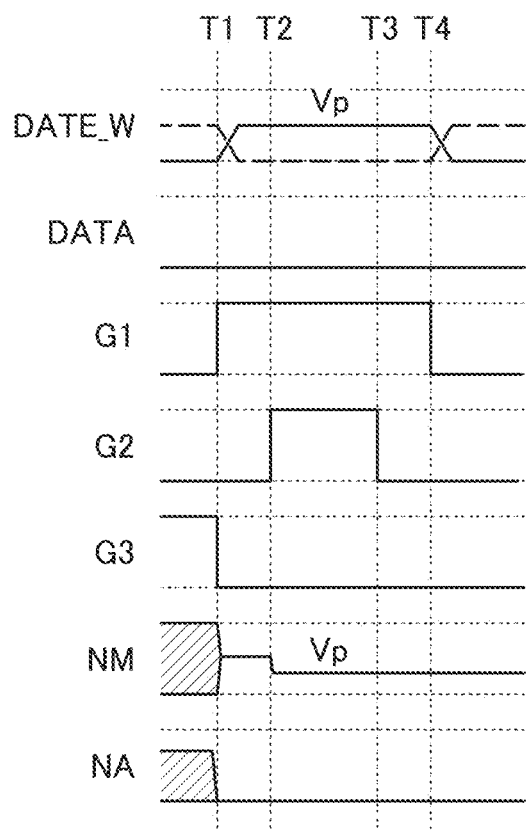
FIG. 20(A) and FIG. 20(B) are timing charts showing pixel operation examples.
Figure 20B:
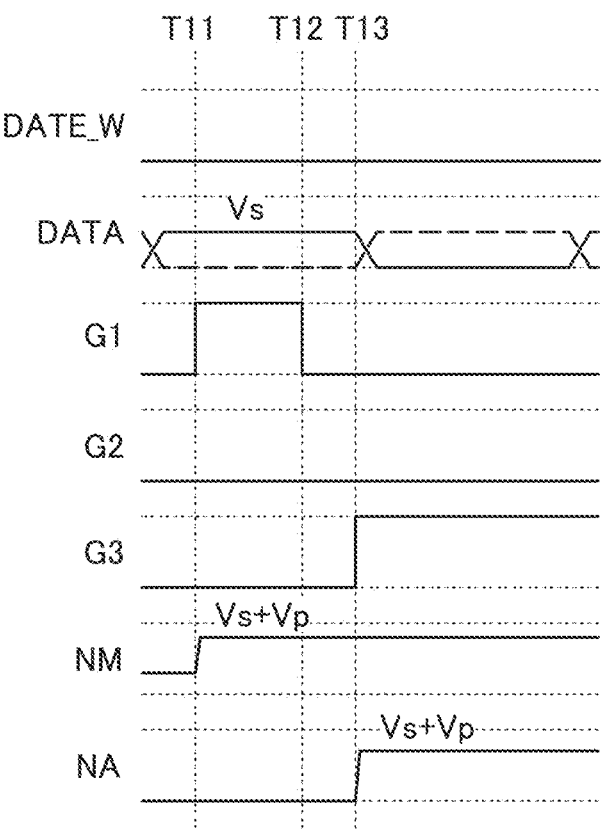

The details of the operation of the pixel in FIG. 19(B) are described using timing charts shown in FIG. 20(A) and FIG. 20(B). Note that although a given positive or negative signal can be used as the correction signal (Vp) supplied to the wiring DATA_W, the case where a positive signal is supplied is described here. In the following description, "H" represents high potential and "L" represents low potential.

First, the operation of writing the correction signal (Vp) to the node NM is described with reference to FIG. 20(A). The operation may be performed for every frame, and writing is performed at least once before the image signal is supplied. Furthermore, refresh operation is performed as appropriate to rewrite the same correction signal to the node NM.

At Time T1, the potential of the wiring G1 is set to "H", the potential of the wiring G2 is set to "L", the potential of the wiring G3 is set to "L", and the potential of the wiring DATA is set to "L"; thus, the transistor M1 is turned on and the potential of the other electrode of the capacitor Cw becomes "L".

This operation is reset operation for performing subsequent capacitive coupling operation. Before Time T1, the light-emitting element 124 emits light in the previous frame; however, the reset operation changes the potential of the node NM, thereby changing the amount of current flowing through the light-emitting element 124. Thus, the transistor M5 is preferably turned off to stop light emission of the light-emitting element 124.

At Time T2, the potential of the wiring G1 is set to "H", the potential of the wiring G2 is set to "H", the potential of the wiring G3 is set to "L", and the potential of the wiring DATA is set to "L"; thus, the transistor M4 is turned on, and the potential of the wiring DATA_W (the correction signal (Vp)) is written to the node NM.

At Time T3, the potential of the wiring G1 is set to "H", the potential of the wiring G2 is set to "L", the potential of the wiring G3 is set to "L", and the potential of the wiring DATA is set to "L"; thus, the transistor M4 is turned off and the correction signal (Vp) is retained in the node NM.

At Time T4, the potential of the wiring G1 is set to "L", the potential of the wiring G2 is set to "L", the potential of the wiring G3 is set to "L", and the potential of the wiring DATA is set to "L"; thus, the transistor M1 is turned off and the operation of writing the correction signal (Vp) is finished.

Next, the operation of correcting the image signal (Vs) and operation of making the light-emitting element 124 emit light are described with reference to FIG. 20(B).

At Time T11, the potential of the wiring G1 is set to "H", the potential of the wiring G2 is set to "L", the potential of the wiring G3 is set to "L", and the potential of the wiring DATA_W is set to "L"; thus, the transistor M1 is turned on and the potential of the wiring DATA is added to the potential of the node NM by capacitive coupling through the capacitor Cw. That is, the potential of the node NM becomes a potential (Vs+Vp) obtained by adding the correction signal (Vp) to the image signal (Vs).

At Time T12, the potential of the wiring G1 is set to "L", the potential of the wiring G2 is set to "L", the potential of the wiring G3 is set to "L", and the potential of the wiring DATA_W is set to "L"; thus, the transistor M1 is turned off, and the potential of the node NM is fixed to Vs+Vp.

At Time T13, the potential of the wiring G1 is set to "L", the potential of the wiring G2 is set to "L", the potential of the wiring G3 is set to "H", and the potential of the wiring DATA_W is set to "L"; thus, the transistor M5 is turned on, the potential of the node NA becomes Vs+Vp, and the light-emitting element 124 emits light. Strictly speaking, the potential of the node NA is lower than Vs+Vp by the threshold voltage ($V_{th}$) of the transistor M2; here, $V_{th}$ is adequately low and negligible.

The operation of correcting the image signal (Vs) and the operation of making the light-emitting element 124 emit light are described above. Note that the aforementioned operation of writing the correction signal (Vp) and the operation of inputting the image signal (Vs) may be successively performed; however, it is preferable to perform the operation of inputting the image signal (Vs) after the correction signal (Vp) is written to all pixels. In one embodiment of the present invention, since the same image signal can be supplied to a plurality of pixels at the same time, the operation speed can be increased by writing the correction signal (Vp) to all the pixels first.

As described above, when the light-emitting element emits light with the use of the image signal and the correction signal, the amount of current flowing through the light-emitting element can be increased, and high luminance can be achieved. A voltage higher than or equal to the output voltage of a source driver can be applied to the gate voltage of the driving transistor, so that the power consumption of the source driver can be reduced.

This embodiment can be combined with the other embodiments and the example as appropriate.

Embodiment 4

In this embodiment, electronic devices of embodiments of the present invention are described with reference to FIG. 21 to FIG. 23.

The electronic device in this embodiment includes the display device of one embodiment of the present invention in its display portion. The display device of one embodiment of the present invention has high display quality and low power consumption. In addition, the display device of one embodiment of the present invention can be easily increased in resolution and size. Thus, the display device of one embodiment of the present invention can be used for a display portion of a variety of electronic devices.

The display portion of the electronic device in this embodiment can display a video with definition of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, or the like on the display portion. When the electronic device includes the antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 21A:
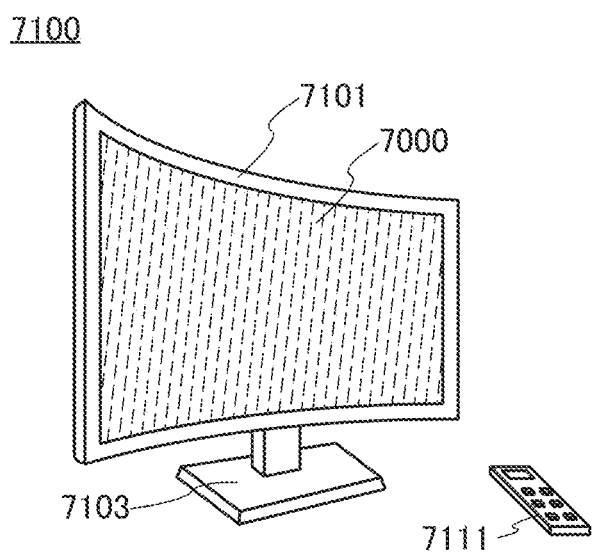
FIG. 21(A) to FIG. 21(D) are views illustrating examples of an electronic device.

FIG. 21(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 21(A) can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 21B:
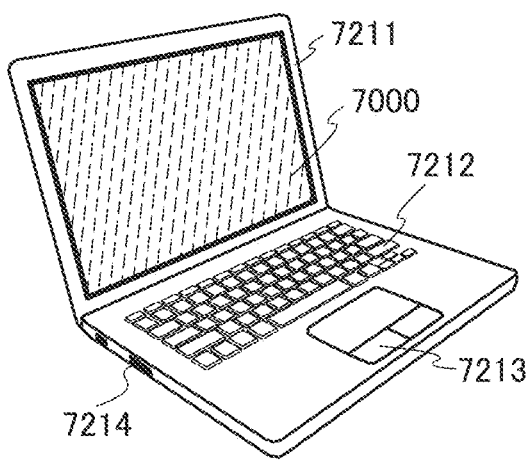

FIG. 21(B) illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 21C:
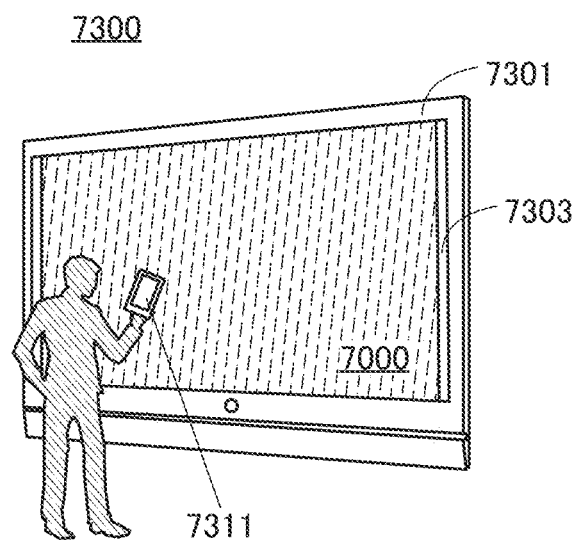
Figure 21D:
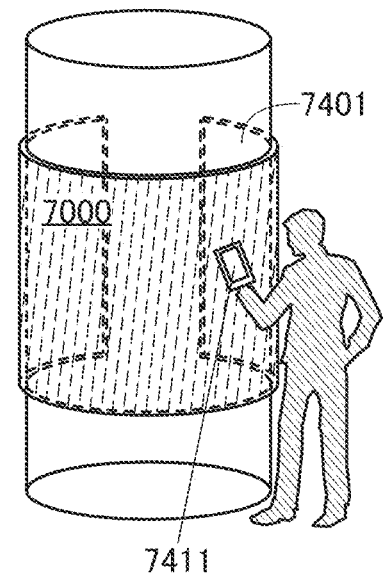

FIG. 21(C) and FIG. 21(D) illustrate examples of digital signage.

Digital signage 7300 illustrated in FIG. 21(C) includes a housing 7301, the display portion 7000, a speaker 7303, and the like. Furthermore, the digital signage can include an LED lamp, operation keys (including a power switch or an operation switch), a connection terminal, any of a variety of sensors, a microphone, and the like.

FIG. 21(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 21(C) and FIG. 21(D).

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

Furthermore, as illustrated in FIG. 21(C) and FIG. 21(D), it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 22A:
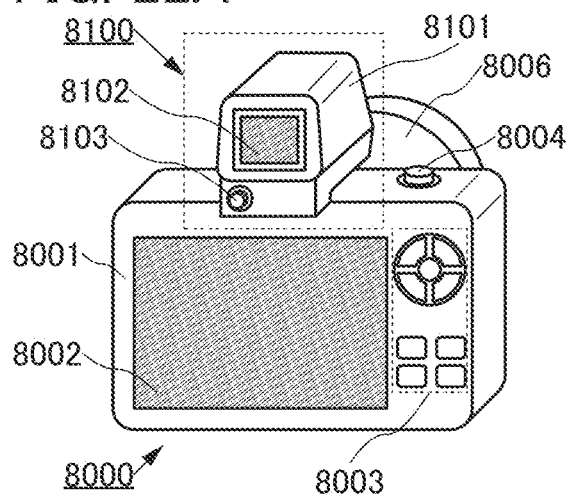
FIG. 22(A) to FIG. 22(E) are views illustrating examples of an electronic device.

FIG. 22(A) is an external view of a camera 8000 to which a finder 8100 is attached.

The camera 8000 includes a housing 8001, a display portion 8002, operation buttons 8003, a shutter button 8004, and the like. Moreover, a detachable lens 8006 is attached to the camera 8000. Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video and the like received from the camera 8000 on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 22B:
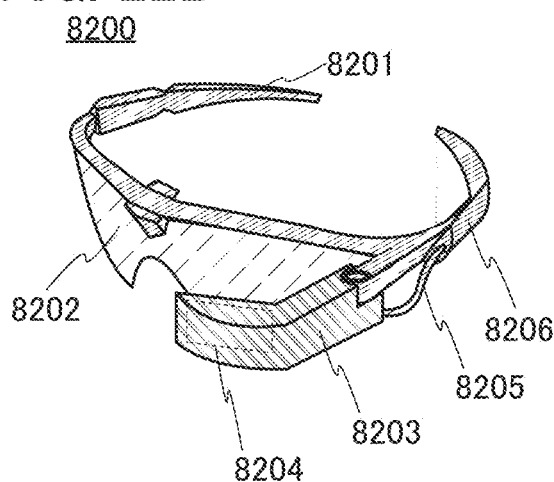

FIG. 22(B) is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and data on the movement of the user's eyeball and eyelid can be used as an input means.

In addition, the mounting portion 8201 may be provided with a plurality of electrodes capable of sensing current flowing in response to the movement of the user's eyeball in a position in contact with the user to have a function of recognizing the user's sight line. A function of monitoring the user's pulse with the use of current flowing through the electrodes may be provided. The mounting portion 8201 may include any of a variety of sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used for the display portion 8204.

Figure 22C:
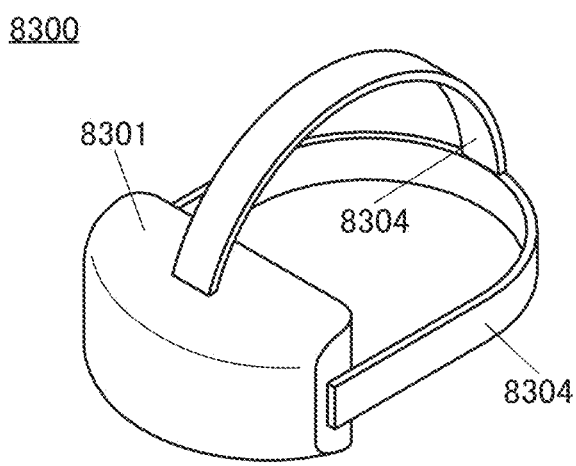
Figure 22D:
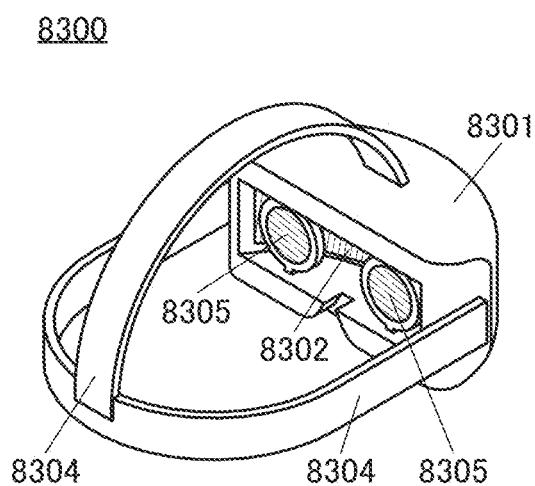
Figure 22E:
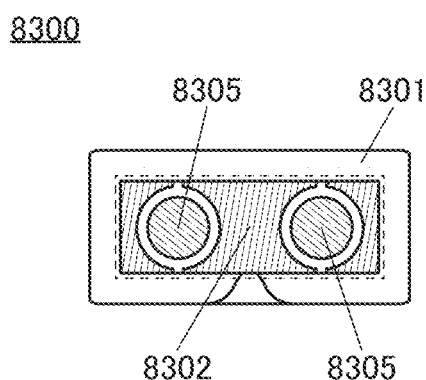

FIG. 22(C), FIG. 22(D), and FIG. 22(E) are external views of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed because the user can feel a high realistic sensation. When another image displayed in a different region of the display portion 8302 is seen through the lenses 8305, three-dimensional display using parallax or the like can also be performed. Note that the structure is not limited to that in which one display portion 8302 is provided, and two display portions 8302 may be provided so that one display portion is provided per eye of the user.

The display device of one embodiment of the present invention can be used for the display portion 8302. The display device of one embodiment of the present invention has extremely high resolution; thus, pixels are not easily seen by the user even when the user sees a magnified display by the use of the lenses 8305 as in FIG. 22(E). In other words, a video with a strong sense of reality can be seen by the user with the use of the display portion 8302.

Electronic devices illustrated in FIG. 23(A) to FIG. 23(F) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 23(A) to FIG. 23(F) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIG. 23(A) to FIG. 23(F) will be described in detail below.

Figure 23A:
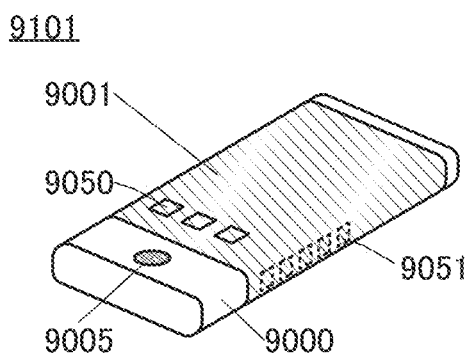
FIG. 23(A) to FIG. 23(F) are views illustrating examples of an electronic device.

FIG. 23(A) is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 23(A) shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 23B:
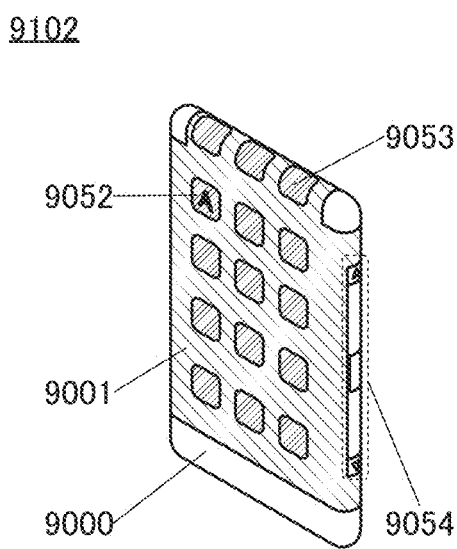

FIG. 23(B) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 23C:
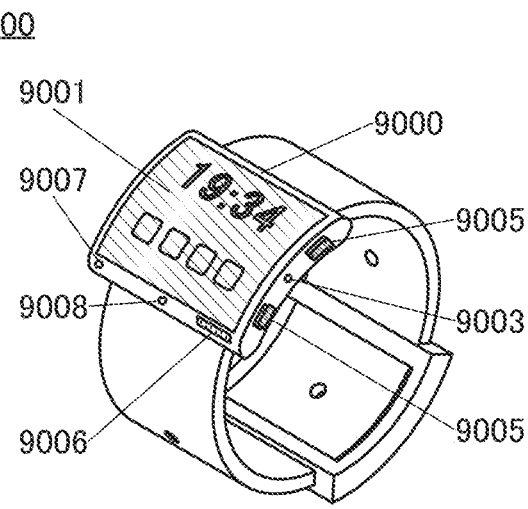

FIG. 23(C) is a perspective view illustrating a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 23D:
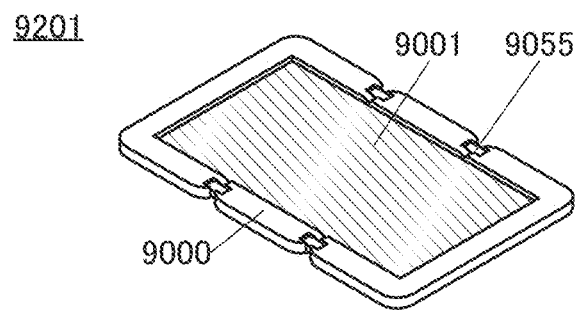
Figure 23E:
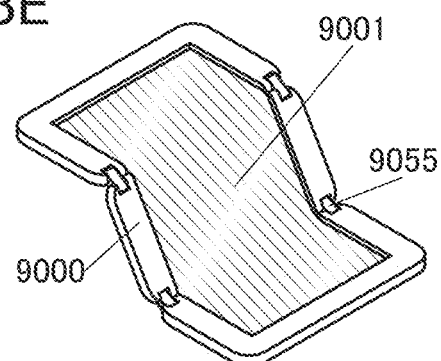
Figure 23F:
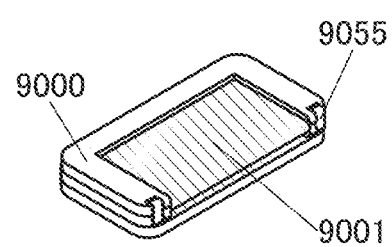

FIG. 23(D), FIG. 23(E), and FIG. 23(F) are perspective views showing a foldable portable information terminal 9201. FIG. 23(D) is a perspective view of an opened state of the portable information terminal 9201, FIG. 23(F) is a perspective view of a folded state thereof, and FIG. 23(E) is a perspective view of a state in the middle of change from one of FIG. 23(D) and FIG. 23(F) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments and the example as appropriate.

REFERENCE NUMERALS

M1: transistor, M2: transistor, M3: transistor, M4: transistor, M5: transistor, 10A: display device, 10B: display device, 15A: display device, 71: display portion, 74: FPC, 75: connection portion, 78: driver circuit, 101: substrate, 104: insulating layer, 110a: light-emitting element, 110b: light-emitting element, 110B: light-emitting element, 110G: light-emitting element, 110R: light-emitting element, 110W: light-emitting element, 111: pixel electrode, 112a: optical adjustment layer, 112b: optical adjustment layer, 112B: optical adjustment layer, 112G: optical adjustment layer, 112R: optical adjustment layer, 112W: optical adjustment layer, 113: EL layer, 113EM: light, 114: common electrode, 115: protective layer, 115n: region, 116: semi-transmissive layer, 116a: semi-transmissive layer, 116b: semi-transmissive layer, 117: reflective layer, 118: pixel electrode, 119a: optical adjustment layer, 119b: optical adjustment layer, 119c: optical adjustment layer, 120: conductive layer, 121: protective layer, 122: planarization layer, 123: functional layer, 124: light-emitting element, 125: protective layer, 127: power supply line, 129: common wiring, 130: pixel, 141: insulating layer, 200A: display device, 200B: display device, 200C: display device, 200D: display device, 201: conductive layer, 202: insulating layer, 203a: conductive layer, 203b: conductive layer, 204: semiconductor layer, 208: insulating layer, 211: insulating layer, 212: insulating layer, 213: insulating layer, 214a: channel formation region, 214b: low-resistance region, 214c: LDD region, 220: transistor, 230: transistor, 300: touch panel, 301: transistor, 303: transistor, 306: connection portion, 307: wiring, 308: connection portion, 309: connector, 310: input device, 311: gate insulating layer, 312: insulating layer, 313: insulating layer, 314: insulating layer, 315: insulating layer, 317: adhesive layer, 318: adhesive layer, 319: connector, 330: substrate, 331: electrode, 332: electrode, 333: electrode, 334: electrode, 341: wiring, 342: wiring, 350: FPC, 351: IC, 356: conductive layer, 356a: conductive layer, 356b: conductive layer, 357a: conductive layer, 357b: conductive layer, 358: conductive layer, 361: substrate, 363: adhesive layer, 365: insulating layer, 367: insulating layer, 370: display device, 371: substrate, 374: IC, 387: crossing portion, 390: circular polarizing plate, 391: insulating layer, 392: insulating layer, 395: insulating layer, 396: adhesive layer, 400: display device, 401: substrate, 401a: substrate, 410: transistor, 411: conductive layer, 412: low-resistance region, 413: insulating layer, 414: insulating layer, 419: element isolation region, 420: transistor, 421: semiconductor layer, 422: metal oxide layer, 423: insulating layer, 424: conductive layer, 425: conductive layer, 426: insulating layer, 427: conductive layer, 428: insulating layer, 430: transistor, 431: insulating layer, 432: insulating layer, 440: capacitor, 441: conductive layer, 442: conductive layer, 443: insulating layer, 451: conductive layer, 452: conductive layer, 453: conductive layer, 461: insulating layer, 462: insulating layer, 463: insulating layer, 464: insulating layer, 465: insulating layer, 471: plug, 471a: conductive layer, 471b: conductive layer, 472: plug, 473: plug, 474: plug, 480: display module, 481: display portion, 482: circuit portion, 483: pixel circuit portion, 483a: pixel circuit, 484: pixel portion, 484a: pixel, 485: terminal portion, 486: wiring portion, 490: FPC, 492: insulating layer, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising a first pixel electrode, a second pixel electrode, a light-emitting layer, a common electrode, a first protective layer, and a semi-transmissive layer,
    wherein the light-emitting layer comprises a first region positioned over the first pixel electrode and a second region positioned over the second pixel electrode,
    wherein the common electrode is positioned over the light-emitting layer,
    wherein the first protective layer is positioned over the common electrode,
    wherein the semi-transmissive layer is positioned over the first protective layer,
    wherein reflectivity with respect to visible light of the semi-transmissive layer is higher than reflectivity with respect to visible light of the common electrode,
    wherein the semi-transmissive layer does not overlap with the first region, and
    wherein the semi-transmissive layer overlaps with the second region.

2. The display device according to claim 1, further comprising a second protective layer,
    wherein the second protective layer is in contact with the first protective layer in a region overlapping with the first region and is in contact with the semi-transmissive layer in a region overlapping with the second region.

3. The display device according to claim 1, further comprising a conductive layer that transmits visible light and a second protective layer,
wherein the conductive layer that transmits visible light is positioned over the common electrode,
wherein the second protective layer is positioned over the conductive layer that transmits visible light, and
wherein the conductive layer that transmits visible light comprises a region in contact with the common electrode, a region in contact with the semi-transmissive layer, a region positioned between the first protective layer and the second protective layer, and a region positioned between the first protective layer and the semi-transmissive layer.

4. The display device according to claim 1, further comprising a first optical adjustment layer and a second optical adjustment layer,
wherein the first optical adjustment layer is positioned between the first pixel electrode and the light-emitting layer,
wherein the second optical adjustment layer is positioned between the second pixel electrode and the light-emitting layer, and
wherein the first pixel electrode and the second pixel electrode each have reflectivity with respect to visible light.

5. The display device according to claim 1, further comprising a first reflective layer, a second reflective layer, a first optical adjustment layer, and a second optical adjustment layer,
wherein the first optical adjustment layer is positioned over the first reflective layer,
wherein the second optical adjustment layer is positioned over the second reflective layer,
wherein the first pixel electrode is positioned over the first optical adjustment layer,
wherein the second pixel electrode is positioned over the second optical adjustment layer, and
wherein the first pixel electrode and the second pixel electrode each have a transmitting property with respect to visible light.

6. The display device according to claim 1, further comprising a coloring layer,
wherein the coloring layer is positioned over the first protective layer and overlaps with the second region.

7. The display device according to claim 1, further comprising a third pixel electrode,
wherein the light-emitting layer further comprises a third region positioned over the third pixel electrode,
wherein the semi-transmissive layer comprises a fourth region overlapping with the second region and a fifth region overlapping with the third region, and
wherein a thickness of the fourth region is different from a thickness of the fifth region.

8. The display device according to claim 1, further comprising a transistor, an insulating layer, a first conductive layer, and a second conductive layer,
wherein the first conductive layer and the second conductive layer each comprise the same material as an electrode included in the transistor,
wherein the transistor is electrically connected to the first pixel electrode through a first opening of the insulating layer,
wherein the common electrode is electrically connected to the first conductive layer through a second opening of the insulating layer,
wherein the semi-transmissive layer is electrically connected to the second conductive layer through a third opening of the insulating layer, and
wherein the third opening is positioned on the outside of the second opening.

9. A display module comprising the display device according to claim 1, and a connector or an integrated circuit.

10. An electronic device comprising:
the display module according to claim 9; and
at least one of an antenna, a battery, a housing, a camera, a speaker, a microphone, and an operation button.

11. A display device comprising a first pixel electrode, a second pixel electrode, a light-emitting layer, a common electrode, a first protective layer, and a semi-transmissive layer,
wherein the light-emitting layer comprises a first region positioned over the first pixel electrode and a second region positioned over the second pixel electrode,
wherein the common electrode is positioned over the light-emitting layer,
wherein the first protective layer is positioned over the common electrode,
wherein the semi-transmissive layer is positioned over the first protective layer,
wherein reflectivity with respect to visible light of the semi-transmissive layer is higher than reflectivity with respect to visible light of the common electrode,
wherein the semi-transmissive layer comprises an opening in a position overlapping with the first region, and
wherein the semi-transmissive layer overlaps with the second region.

12. The display device according to claim 11, further comprising a second protective layer,
wherein the second protective layer is in contact with the first protective layer in a region overlapping with the first region and is in contact with the semi-transmissive layer in a region overlapping with the second region.

13. The display device according to claim 11, further comprising a conductive layer that transmits visible light and a second protective layer,
wherein the conductive layer that transmits visible light is positioned over the common electrode,
wherein the second protective layer is positioned over the conductive layer that transmits visible light, and
wherein the conductive layer that transmits visible light comprises a region in contact with the common electrode, a region in contact with the semi-transmissive layer, a region positioned between the first protective layer and the second protective layer, and a region positioned between the first protective layer and the semi-transmissive layer.

14. The display device according to claim 11, further comprising a first optical adjustment layer and a second optical adjustment layer,
wherein the first optical adjustment layer is positioned between the first pixel electrode and the light-emitting layer,
wherein the second optical adjustment layer is positioned between the second pixel electrode and the light-emitting layer, and
wherein the first pixel electrode and the second pixel electrode each have reflectivity with respect to visible light.

15. The display device according to claim 11, further comprising a first reflective layer, a second reflective layer, a first optical adjustment layer, and a second optical adjustment layer,
- wherein the first optical adjustment layer is positioned over the first reflective layer,
- wherein the second optical adjustment layer is positioned over the second reflective layer,
- wherein the first pixel electrode is positioned over the first optical adjustment layer,
- wherein the second pixel electrode is positioned over the second optical adjustment layer, and
- wherein the first pixel electrode and the second pixel electrode each have a transmitting property with respect to visible light.

16. The display device according to claim 11, further comprising a coloring layer,
- wherein the coloring layer is positioned over the first protective layer and overlaps with the second region.

17. The display device according to claim 11, further comprising a third pixel electrode,
- wherein the light-emitting layer further comprises a third region positioned over the third pixel electrode,
- wherein the semi-transmissive layer comprises a fourth region overlapping with the second region and a fifth region overlapping with the third region, and
- wherein a thickness of the fourth region is different from a thickness of the fifth region.

18. The display device according to claim 11, further comprising a transistor, an insulating layer, a first conductive layer, and a second conductive layer,
- wherein the first conductive layer and the second conductive layer each comprise the same material as an electrode included in the transistor,
- wherein the transistor is electrically connected to the first pixel electrode through a first opening of the insulating layer,
- wherein the common electrode is electrically connected to the first conductive layer through a second opening of the insulating layer,
- wherein the semi-transmissive layer is electrically connected to the second conductive layer through a third opening of the insulating layer, and
- wherein the third opening is positioned on the outside of the second opening.

19. A display module comprising the display device according to claim 11, and a connector or an integrated circuit.

20. An electronic device comprising:
the display module according to claim 19; and
at least one of an antenna, a battery, a housing, a camera, a speaker, a microphone, and an operation button.

* * * * *